(12) United States Patent
Narita et al.

(10) Patent No.: US 7,350,684 B2
(45) Date of Patent: *Apr. 1, 2008

(54) APPARATUS AND METHOD FOR FORMING BUMP

(75) Inventors: Shoriki Narita, Hirakata (JP); Koichi Yoshida, Higashiosaka (JP); Masahiko Ikeya, Sakai (JP); Takaharu Mae, Hirakata (JP); Shinji Kanayama, Kashihara (JP); Makoto Imanishi, Neyagawa (JP); Kazushi Higashi, Neyagawa (JP); Kenji Fukumoto, Hirakata (JP); Hiroshi Wada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/114,084

(22) Filed: Apr. 26, 2005

(65) Prior Publication Data

US 2005/0191838 A1    Sep. 1, 2005

Related U.S. Application Data

(62) Division of application No. 10/332,026, filed as application No. PCT/JP01/05609 on Jun. 29, 2001, now Pat. No. 6,910,613.

(30) Foreign Application Priority Data

Jul. 4, 2000    (JP)    ............................ 2000-202700

(51) Int. Cl.
    B23K 37/00    (2006.01)
(52) U.S. Cl. ........................ 228/9; 228/234.1; 438/613

(58) Field of Classification Search ................ 228/232, 228/234.1, 47.1, 180.228, 227, 230, 102, 228/245, 246, 9, 41; 438/613
See application file for complete search history.

(56) References Cited

U.S. PATENT DOCUMENTS

| 4,909,429 | A | * | 3/1990 | Ankrom et al. | ................ 228/57 |
| 5,259,545 | A | * | 11/1993 | Huang | ........................ 228/46 |
| 5,607,609 | A | * | 3/1997 | Sakuyama et al. | .......... 219/388 |
| 5,842,627 | A | * | 12/1998 | Takanashi et al. | ........ 228/180.1 |
| 6,053,398 | A | * | 4/2000 | Iizuka et al. | ................. 228/254 |
| 6,059,170 | A | * | 5/2000 | Jimarez et al. | .............. 228/119 |
| 6,181,015 | B1 | * | 1/2001 | Gotoh et al. | ................. 257/778 |
| 6,206,265 | B1 | * | 3/2001 | Yamaoka | ..................... 228/102 |
| 6,600,137 | B1 | * | 7/2003 | Nonomura et al. | ......... 219/388 |
| 6,787,391 | B1 | * | 9/2004 | Imanishi et al. | ............ 438/108 |
| 7,014,092 | B2 | * | 3/2006 | Narita et al. | .................... 228/9 |
| 2002/0092595 | A1 | * | 7/2002 | Fogal et al. | .................. 156/64 |
| 2002/0106603 | A1 | * | 8/2002 | L. Foong et al. | ........... 432/253 |
| 2003/0137080 | A1 | * | 7/2003 | Bouras et al. | ......... 264/272.11 |

* cited by examiner

*Primary Examiner*—Jonathan Johnson
*Assistant Examiner*—Michael Aboagye
(74) *Attorney, Agent, or Firm*—Wenderoth, Lind & Ponack, L.L.P.

(57) ABSTRACT

A preheat device (160) is provided to execute, before forming bumps (16) to electrode parts (15), a pre-formation temperature control for bonding promotion to promote bonding between the electrode parts and the bumps during bump formation. Metal particles of the electrode parts can be changed to an appropriate state before the bump formation. Phenomenally, a bonding state between the electrode parts and the bumps can be improved as compared with the conventional art. In a further arrangement of the present invention, semiconductor components with bumps can be heated under a bonding strength improvement condition by a bonding stage (316) through controlling the heating by a controller (317).

13 Claims, 39 Drawing Sheets

APPARATUS AND METHOD FOR FORMING BUMP

This application is a divisional of U.S. application Ser. No. 10/332,026, filed Jan. 2, 2003, now U.S. Pat. No. 6,910,613, which is a national stage application of International application No. PCT/JP01/05609, filed Jun. 29, 2001.

TECHNICAL FIELD

The present invention generally relates to a bump forming apparatus with a bump strength improving device for improving a bonding strength between electrodes and bumps for a bump-formed component having the bumps formed on the electrodes of, e.g., a semiconductor wafer or a semiconductor chip, and a bump formation method carried out by the bump forming apparatus. More specifically, the present invention relates to the bump forming apparatus capable of stabilizing a bonding state between electrode parts and bumps compared with conventional art when forming the bumps to the electrode parts of semiconductor substrates, a bump formation method carried out by the bump forming apparatus, a recording medium in which a program whereby the bump formation method can be executed is recorded, and a bump-formed semiconductor substrate with bumps formed.

BACKGROUND ART

In recent times, electronic components to be mounted to devices, for instance, cellular phones and the like have also been made compact in accordance with considerable downsizing of the devices. There is a bump forming apparatus which forms bumps to electrode parts of circuit formation parts provided on a semiconductor wafer without cutting each of the individual circuit formation parts from the semiconductor wafer. The bump forming apparatus of this type includes a carry-in device for taking out a semiconductor wafer before having bumps formed from a first storage container in which the semiconductor wafers before having bumps formed are stored, a second storage container for storing wafers after having bumps formed, a bonding stage on which the wafer before having bumps formed is placed to heat the wafer normally to approximately 150° C. so as to bond the electrode parts and the bumps, a carry-out device for storing the wafer after having bumps formed into the second storage container, and a shift device for moving the wafer from the carry-in device to the bonding stage and from the bonding stage to the carry-out device.

Meanwhile, bonding between each electrode part and the bump becomes incomplete in some cases, e.g., in piezoelectric substrates to which SAW (Surface Acoustic Wave) filters to be used in the aforementioned cellular phones or the like are formed, or in semiconductor substrates having micro bumps formed. Namely, as shown in FIG. 45, the SAW filter 10 has pairing input side circuit 12 and output side circuit 13 each formed in the shape of comb teeth on a piezoelectric substrate 11, and a function in which a vibration generated at the input side circuit 12 propagates to the output side circuit 13 which in turn outputs an output based on the propagated vibration. On this basis, the SAW filter passes only signals of a specific frequency. Due to the structure and the function of the SAW filter 10, film thicknesses at circuit formation parts of the input side circuit 12 and the output side circuit 13 shaped like comb teeth and at electrode parts of these circuits 12 and 13 are defined to be approximately 2000 Å; which is thinner than a film thickness of electrode parts formed on a normal semiconductor substrate of, e.g., Si of approximately 5000-7000 Å. Since a layer of metal material particles forming the electrode parts, for example, of aluminum particles is thin, the bonding between the bumps and the electrode parts is consequently considered to be incomplete in some cases.

In FIG. 46, a diameter 16b of a base part 16a of the bump 16 formed on the electrode part 15 of the micro bump form semiconductor substrate 14 referred to above is approximately 40-48 µm. The bump 16 itself is thus smaller than a bump of the normal semiconductor substrate in which the base diameter is approximately 80 µm. Therefore, a bonding area between the bump 16 and the electrode part 15 is small, so that there are many cases of incomplete bonding.

As one way for supporting the recent miniaturization in electronic devices, there is, for instance, a method whereby electrodes of a semiconductor chip cut from the semiconductor wafer are arranged opposite and connected to electrode parts on a circuit board without using wires. For adopting this method, bumps 52 of gold or the like are formed on electrodes 51 of the semiconductor wafer or the semiconductor chip while the semiconductor wafer and the semiconductor chip are heated, as shown in FIG. 63.

Moreover, the semiconductor chip itself has been made very small to meet the above miniaturization, whereby a heat resisting temperature of the semiconductor chip tends to decrease. A heating temperature at the bump formation is required to be lowered accordingly.

The present invention is devised to solve the above-described problems, and has for its object to provide a bump forming apparatus and a bump formation method in which a bonding strength between bumps formed to electrode parts and electrodes can be improved as compared with the conventional art. More specifically, the present invention has the following objects.

A first object of the present invention is to provide a bump forming apparatus, a bump formation method executed by the bump forming apparatus, a computer readable recording medium having a program recorded therein whereby the bump formation method can be executed, and a bump-formed semiconductor substrate with bumps formed. A bonding state between electrode parts and bumps can be stabilized and a bonding strength can be improved in comparison with the conventional art.

A second object of the present invention is to provide a device and a method for improving a bump strength, and a bump forming apparatus, whereby a quality of semiconductor components can be improved as compared with the conventional art without decreasing a bonding strength between bumps formed on electrodes of the semiconductor components and the electrodes even when the heating temperature at a bump formation is lowered.

SUMMARY OF THE INVENTION

In order to accomplish the above first object, the present invention is constituted as described hereinbelow.

According to a first aspect of the present invention, a bump forming apparatus is provided which has a bump forming head for forming bumps (16) to electrode parts (15) on a semiconductor substrate (201) which is at a temperature (T2) for bump bonding (i.e., a temperature whereat bumps are formed to electrode parts).

The apparatus comprises a preheat device (160) for executing, before the bumps are formed to the electrode parts, a pre-formation temperature control for bonding promotion to promote bonding between the electrode parts and the bumps during a bump formation to the semiconductor substrate.

The pre-formation temperature control for bonding promotion by the preheat device may be arranged to heat the semiconductor substrate to a pre-formation temperature (T1) for bonding promotion which is not lower than the temperature for bump bonding and is not higher than a damage preventive temperature (TB) of the semiconductor substrate.

The pre-formation temperature control for bonding promotion by the preheat device may be further to maintain the semiconductor substrate at the pre-formation temperature for bonding promotion for a pre-formation time (t1) for bonding promotion, and may set the semiconductor substrate at the bump bonding temperature after the lapse of the pre-formation time for bonding promotion.

The pre-formation temperature control for bonding promotion by the preheat device may be further to set the pre-formation temperature for bonding promotion and the pre-formation time for bonding promotion on a basis of materials of the electrode parts and of the bumps.

The pre-formation temperature control for bonding promotion by the preheat device may further set the pre-formation temperature for bonding promotion and the pre-formation time for bonding promotion based on a thickness of the electrode part and a diameter of a base part of the bump.

The pre-formation temperature for bonding promotion can be one that is obtained by adding 30-60° C. to the temperature for bump bonding.

The pre-formation time for bonding promotion may be set to be 10-30 minutes.

The bump forming apparatus may still be provided with a post-forming bumps heating device for executing upon the semiconductor substrate, after the bumps are formed to the electrode parts, a post-formation temperature control for bonding promotion to promote bonding between the electrode parts after having bumps formed thereto and the bumps.

The post-formation temperature control for bonding promotion by the post-forming bumps heating device may be to heat the semiconductor substrate to a post-formation temperature (T3) for bonding promotion which is not lower than the temperature for bump bonding and is not higher than the damage preventive temperature of the semiconductor substrate.

The post-formation temperature control for bonding promotion by the post-forming bumps heating device may further maintain the semiconductor substrate at the post-formation temperature for bonding promotion for a post-formation time (t3) for bonding promotion, and may decrease the temperature of the semiconductor substrate after the lapse of the post-formation time for bonding promotion.

The bump forming apparatus may further include a controller for controlling the preheat device and the post-forming bumps heating device while relating the pre-formation temperature control for bonding promotion by the preheat device and the post-formation temperature control for bonding promotion by the post-forming bumps heating device to each other.

A bump formation method is provided according to a second aspect of the present invention for forming bumps to electrode parts on a semiconductor substrate which is at a temperature (T2) for bump bonding (i.e., a temperature whereat bumps are formed to electrode parts).

The method comprises carrying out, upon the semiconductor substrate before the bumps are formed to the electrode parts, a pre-formation temperature control for bonding promotion to promote bonding between the electrode parts and the bumps during a bump formation.

In the bump formation method, the pre-formation temperature control for bonding promotion may be adapted to heat the semiconductor substrate to a pre-formation temperature (T1) for bonding promotion which is not lower than the temperature for bump bonding and is not higher than a damage preventive temperature (TB) of the semiconductor substrate, to maintain the semiconductor substrate at the pre-formation temperature for bonding promotion for a pre-formation time (t1) for bonding promotion, and to set the semiconductor substrate to the bump bonding temperature after the lapse of the pre-formation time for bonding promotion.

In the bump formation method, the method may further execute, upon the semiconductor substrate after the bumps are formed to the electrode parts, a post-formation temperature control for bonding promotion to promote bonding between the electrode parts after having bumps formed and the bumps.

In the bump formation method, the post-formation temperature control for bonding promotion may be to heat the semiconductor substrate to a post-formation temperature (T3) for bonding promotion which is not lower than the temperature for bump bonding and is not higher than a damage preventive temperature of the semiconductor substrate, to maintain the semiconductor substrate at the post-formation temperature for bonding promotion for a post-formation time (t3) for bonding promotion, and to decrease the temperature of the semiconductor substrate after the lapse of the post-formation time for bonding promotion.

In the bump formation method, the pre-formation temperature control for bonding promotion and the post-formation temperature control for bonding promotion may be controlled while being related to each other.

A recording medium according to a third aspect of the present invention is a computer readable recording medium, in which a program for executing a bump formation method upon a semiconductor substrate for forming bumps to electrode parts on the semiconductor substrate which is at a temperature (T2) for bump bonding (i.e., a temperature whereat bumps are formed to electrode parts) is recorded.

The recording medium records a process of executing, before forming the bumps to the electrode parts, a pre-formation temperature control for bonding promotion to promote bonding between the electrode parts and the bumps during a bump formation process upon the semiconductor substrate.

A fourth aspect of the present invention provides a semiconductor substrate having bumps formed by the bump forming apparatus defined in the above first aspect.

In the semiconductor substrate, a bonding strength between the bump formed on the electrode part and the electrode part is such that the bump breaks at a base part of the bump.

The semiconductor substrate has a breaking force of approximately 680-800 mN per bump while the base part of the bump formed on the electrode part has a diameter of approximately 90 µm.

In the above bump forming apparatus according to the first aspect and the bump formation method according to the second aspect, the preheat device is installed, so that the pre-formation temperature control for bonding promotion is executed upon the semiconductor substrate before bumps are formed to electrode parts. Therefore, metal particles of the electrode parts can be changed to an appropriate state before the bump formation. Phenomenally, a bonding state between the electrode parts and the bumps can be improved in comparison with the conventional art. The bonding strength between the electrode parts and the bumps is improved to such a level that the bump breaks at its base part without breaking at a bonding interface part to the electrode part.

The pre-formation temperature control for bonding promotion is specifically achieved by heating the electrode parts to the pre-formation temperature for bonding promotion and maintaining the electrode parts at the pre-formation temperature for bonding promotion for the pre-formation time for bonding promotion. Since metal crystals at the electrode parts can be made proper by the above arrangement, a perfect bonding state of bumps can be obtained. Also it is possible to obtain an optimum bonding state to conform to various kinds of bumps by setting the pre-formation temperature for bonding promotion and the pre-formation time for bonding promotion on the basis of materials and sizes of electrode parts and bumps.

As one example of the pre-formation temperature for bonding promotion, a temperature obtained by adding 30-60° C. to the temperature for bump bonding is provided, whereby a cycle time of the bump formation operation can be improved. The pre-formation time for bonding promotion in this case is preferably 10-30 minutes.

The post-forming bumps heating device may be installed in addition to the preheat device to execute the post-formation temperature control for bonding promotion to the semiconductor substrate after bumps are formed to electrode parts. By the execution of the post-formation temperature control for bonding promotion, the bonding strength between the bumps formed on electrode parts and the electrode parts can be further improved as compared with the case where only the preheating is carried out.

The controller may be installed as well, whereby the pre-formation temperature control for bonding promotion and the post-formation temperature control for bonding promotion can be controlled while being related to each other. It becomes possible to finely execute the pre-formation temperature control for bonding promotion and the post-formation temperature control for bonding promotion to facilitate bonding bumps to electrode parts and to more improve the bonding strength between bumps and electrode parts on the basis of the type and the size of the semiconductor substrate, the material, thickness and size of electrode parts, and the material and size of bumps, etc.

The recording medium according to the third aspect has the program recorded therein for executing at least the above pre-formation temperature control for bonding promotion, so that the pre-formation temperature control for bonding promotion can be easily carried out to a plurality of bump forming apparatuses.

In the semiconductor substrate of the fourth aspect, bumps are formed to electrode parts by the bump forming apparatus equipped with at least the preheat device for executing the pre-formation temperature control for bonding promotion. Therefore, a semiconductor substrate can be provided, in which the bonding strength between bumps and electrode parts is improved as compared with the conventional art. Even when the semiconductor substrate is mounted by the flip chip mounting process, the bumps are prevented from separating from the electrode parts at bonding interfaces between the bumps and the electrode parts. A reliability on the flip chip mounting can also be improved.

In order to achieve the second objective, the present invention is constituted as follows.

A fifth aspect of the present invention provides a bump strength improving device which comprises a heating device for heating a bump-formed component having bumps formed on electrodes of a semiconductor component by a bonding strength improvement condition intended for improving a bonding strength between the electrodes and the bumps in comparison with a bonding strength under a bump formation. The device further comprises a controller for executing control of the heating by the bonding strength improvement condition to the heating device.

The bonding strength improvement condition is one having variables of a heating time and a heating temperature for obtaining a desired value of the bonding strength. The controller which is provided with the bonding strength improvement condition includes information on a relation between the heating temperature and the heating time for attaining the desired bonding strength for at least one of a material of the semiconductor component, a size of the semiconductor component, a material of the electrodes, a size of the electrodes, a material of the bumps and a size of the bumps, and can control the heating of the heating device based on the bonding strength improvement condition.

The bump strength improvement condition of the controller may be information on the relation between the heating temperature and the heating time for attaining the desired bonding strength for at least one group of the material and size of the semiconductor component, the material and size of the electrodes and the material and size of the bumps, or for a combination of the groups.

The semiconductor component may be a chip component cut from a semiconductor wafer.

The heating device may include a plurality of heating process parts to each of which is placed at least the one chip component.

The controller is capable of executing a temperature management independently to each of the heating process parts in accordance with an amount of time passed after the bump formation on each of the chip components arranged to the respective heating process parts.

The heating device can be installed on one of a bonding stage for forming bumps onto the semiconductor component, a bump leveling stage for making heights of bumps of the bump-formed component uniform, and a bump-formed component storage part for storing the bump-formed components.

When the semiconductor component is a semiconductor wafer, the controller can obtain the bonding strength improvement condition on the basis of a bump formation time required for forming almost all bumps onto the semiconductor wafer, and can control the heating of the heating device by the obtained bonding strength improvement condition.

When a heating appropriate time (T) through which the bonding strength can be improved by the heating exceeds the bump formation time, the bonding strength improvement condition enables heating the semiconductor wafer by a first heating time (TB) whereby a target value (P0) of the bonding strength is obtained.

When a heating appropriate time (T) through which the bonding strength can be improved by the heating is not longer than the bump formation time, the bonding strength improvement condition enables heating the semiconductor wafer by a second heating time (TA) obtained by subtracting the heating appropriate time from the bump formation time.

The heating device may be provided with a plurality of heating process parts where the semiconductor wafer is placed and which are arranged to correspond to a bump formation order at the semiconductor wafer. The controller is capable of executing the temperature management independently to each of the heating process parts in accordance with a time passed after the bump formation at the semiconductor wafer corresponding to the respective heating process parts.

A bump forming apparatus according to a sixth aspect of the present invention comprises the bump strength improving device according to the fifth aspect; and a bump forming part for loading a semiconductor component thereon and forming bumps onto electrodes of the semiconductor component while heating.

The controller installed in the bump strength improving device can control a temperature of the bump forming part to a non damage temperature whereat the semiconductor component is prevented from being damaged during a bump formation at the bump forming part and can control heating by the heating device by the bonding strength improvement condition at a temperature exceeding the non damage temperature after the bump formation.

A bump strength improvement method is provided according to a seventh aspect of the present invention. This method comprises carrying in a bump-formed component having bumps formed on electrodes of a semiconductor component; and executing heating control upon the bump-formed component on the basis of a bonding strength improvement condition intended for improving a bonding strength between the electrodes and the bumps in comparison with a bonding strength under the bump formation.

The bump strength improvement condition is one having variables of a heating time and a heating temperature for obtaining a desired value of the bonding strength, and is comprised of information on a relation between the heating temperature and the heating time for attaining the desired bonding strength for at least one of a material of the semiconductor component, a size of the semiconductor component, a material of the electrodes, a size of the electrodes, a material of the bumps and a size of the bumps. The heating control can be executed on the basis of the relation information.

The bump strength improvement condition is the condition comprised of information on the relation between the heating temperature and the heating time for attaining the desired bonding strength for at least one group of the material and size of the semiconductor component, the material and size of the electrodes, and the material and size of the bumps, or for a combination of the groups. The heating control can be executed on the basis of the relation information.

The bump strength improvement method may include forming the bumps on the electrodes of the semiconductor component before the bump-formed component is carried in; controlling a temperature of a bump forming part where the bumps are formed to a non damage temperature whereat the semiconductor component is prevented from being damaged during the bump formation; and executing a heating control by the bonding strength improvement condition at a temperature exceeding the non damage temperature after the bump formation.

The heating control by the bonding strength improvement condition is enabled by obtaining the bonding strength improvement condition on the basis of a bump formation time (TE-TS) required for forming almost all bumps, and can be executed by the obtained bonding strength improvement condition.

When a heating appropriate time (T) through which the bonding strength can be improved by the heating exceeds the bump formation time, the bonding strength improvement condition enables heating for a first heating time (TB) whereby a target value (P0) of the bonding strength is obtained.

When the heating appropriate time (T) through which the bonding strength can be improved by the heating is not longer than the bump formation time, the bonding strength improvement condition enables heating by a second heating time (YA) obtained by subtracting the heating appropriate time from the bump formation time.

According to the bump strength improving device of the fifth aspect, the bump strength improvement method of the sixth aspect and the bump forming apparatus of the seventh aspect of the present invention, there are provided the heating device and the controller to heat, after the bump formation, the semiconductor component by the bonding strength improvement condition intended for improving the bonding strength. Therefore, even if the bonding strength of each bump of the semiconductor component is irregular in the semiconductor component under the bump formation, the bonding strength can be made nearly uniform by heating by the bonding strength improvement condition. A quality of the semiconductor component can be improved as compared with the conventional art. The aspects of the present invention are also useful for securing a bonding strength of components weak to heat.

The above-described bonding strength improvement condition is the condition having the heating time and the heating temperature as variables and can be changed in conformity with, e.g., the material and the size of the semiconductor component, etc. The bonding strength can be made nearly uniform and the quality of semiconductor components can be improved in comparison with the conventional art by setting the temperature for bump formation at the bump formation to be relatively low for semiconductor components and by heating the semiconductor components still at the relatively low temperature under the bonding strength improvement condition for a long time, even though the semiconductor components are components that can be physically damaged because of the material of the components when the temperature for bump formation is a relatively high temperature.

When the heating device is capable of loading a plurality of semiconductor components thereon, it becomes possible to carry out the heating by the bonding strength improvement condition concurrently with the other operation, improving the cycle time.

When the semiconductor component to be processed is a semiconductor wafer, in comparison with the case where the semiconductor component to be processed is a semiconductor chip, a time from the start to the end of the bump formation is long. Therefore, the above bonding improvement condition may be set on the basis of a relation between the time from the start to the end of the bump formation and the heating appropriate time whereby the bonding strength can be improved by the heating after the bump formation. When the bonding improvement condition is set as above, the bonding strength of all bumps on the semiconductor wafer can be made nearly uniform and the quality of the bump-formed semiconductor wafer can be improved in comparison with the conventional art.

BRIEF DESCRIPTION OF DRAWINGS

These and other objects and features of the present invention will become clear from the following description taken in conjunction with the preferred embodiments thereof with reference to the accompanying drawings, in which.

DETAILED DESCRIPTION OF THE INVENTION

First Embodiment

Figure 1:
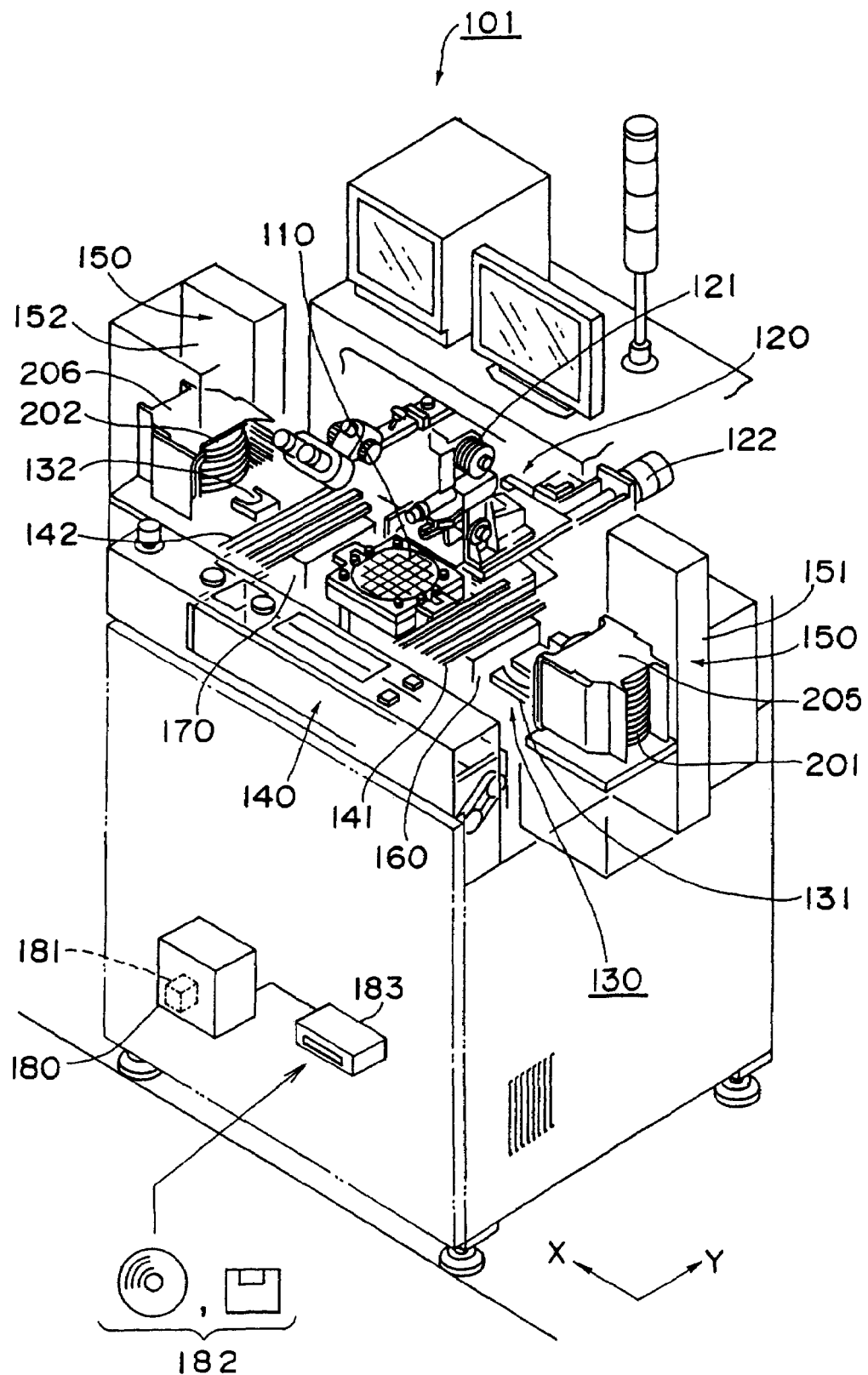
FIG. 1 is a perspective view showing the whole constitution of a bump forming apparatus according to a first embodiment of the present invention.

A first embodiment of the present invention will be described in detail below with reference to the drawings.

A bump forming apparatus, a bump formation method carried out by the bump forming apparatus, a computer readable recording medium with a program for executing the bump formation method recorded therein, and a semiconductor substrate with bumps formed by the bump forming apparatus which are embodiments of the present invention will be depicted hereinbelow with reference to the drawings. Like parts are designated by like reference numerals throughout the drawings.

Figure 46:
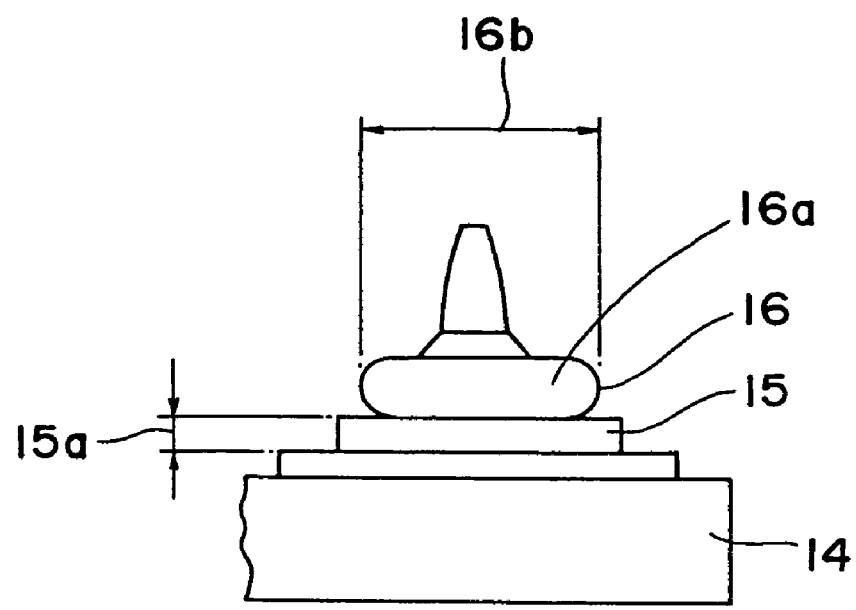
FIG. 46 is a diagram of a state with the bump formed to the electrode part.

A bump forming apparatus 101 of the present embodiment shown in FIGS. 1 and 2 fits to process wafer-shaped piezoelectric substrates to which the aforementioned SAW filters are to be formed (referred to as "piezoelectric substrate wafers" below) and will be discussed in the following description in an example of forming bumps 16 to electrode parts 15 of circuit parts formed on the piezoelectric substrate wafer as shown in FIG. 46. The electrode part 15 formed on the piezoelectric substrate wafer essentially consisting of aluminum has a thickness 15a of approximately 2000 Å. The bump 16 to be formed on this electrode part 15 is formed of gold with a diameter of the base part 16a being approximately 90-120 μm.

An object to be processed is not restricted to the above piezoelectric substrate wafer in the embodiment. In other words, substrates whose bonding state between electrode parts and bumps formed on the electrode parts is unstable and having a relatively weak bonding strength in comparison with a normal value are objects to be processed. More specifically, semiconductor wafers and semiconductor chips with the electrode parts 15 thinner than normal ones, that is, having the thickness 15a of, e.g., approximately 2000 Å as above, or semiconductor wafers, semiconductor chips, etc. to which the aforementioned micro bumps are to be formed are objects to be processed. The thin electrode part 15 is an electrode part having the thickness of approximately 2500 Å or smaller, for instance, approximately 1800-2200 Å. Also the micro bump is a bump having the diameter of approximately 50 μm or smaller, e.g., approximately 40-48 μm at the base part 16a.

A material of a base part constituting the semiconductor wafer and the semiconductor chip is quartz, Si or the like as well as compound semiconductors such as $LiTaO_3$, $LiNbO_3$ or the like used in forming the SAW filter, and is not particularly limited.

While the bump forming apparatus 101 is what is called a double magazine type with a first storage container 205 in which piezoelectric substrate wafers 201 before having bumps formed are stored in layers and a second storage container 206 in which piezoelectric substrate wafers 202 after having bumps formed are to be stored in layers, the apparatus is not limited to the type. Alternatively, the apparatus may be a single magazine type wherein the above piezoelectric substrate wafers 201 before having bumps formed and the above piezoelectric substrate wafers 202 after having bumps formed are stored in one storage container.

The bump forming apparatus 101 roughly comprises one bonding stage 110, one bump forming head 120, a transfer device 130, a shift device 140 arranged at each of the carry-in side and the carry-out side, a lift 150 installed in each of the storage containers 205 and 206 for moving up/down the storage containers 205 and 206, a preheat device 160, a post-forming bumps heating device 170 and a controller 180. As will be detailed later, the bump forming apparatus 101 of the embodiment controls a temperature of the substrate by the preheat device 160 before forming bumps to electrode parts. Therefore, the most fundamental constituent part in the apparatus is the bump forming head 120 for forming bumps and the preheat device 160.

Each of the above constituent parts will be depicted below.

The bonding stage 110 on which the piezoelectric substrate wafer before having bumps formed (referred to simply as "a pre-forming bumps wafer") 201 is to be placed adjusts the pre-forming bumps wafer 201 to a temperature for bump bonding. This is a temperature of the pre-forming bumps wafer 201 when the bumps 16 are formed on the electrode parts 15 at the circuits formed on the pre-forming bumps wafer 201, and is a temperature necessary for forming the bumps. The above-described temperature for bump bonding necessary for forming bumps is a temperature required for bonding the electrode parts 15 and the bumps 16 by a designed strength, and is defined in accordance with the designed strength and a material of the wafer or the substrate where the bumps 16 are formed, which is approximately 150° C. in the present embodiment.

Figure 3:
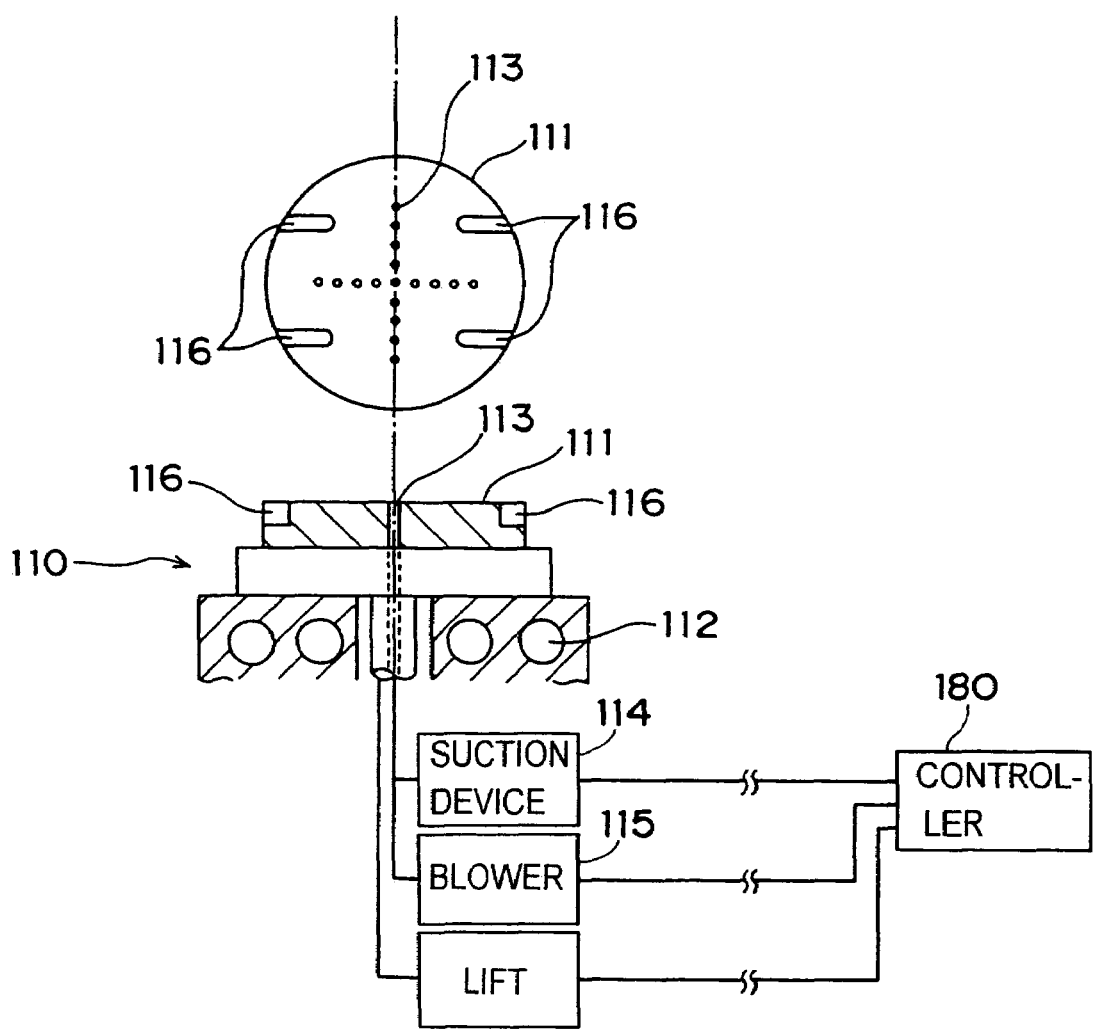
FIG. 3 is a diagram showing a structure of a bump bonding apparatus of FIG. 1.
Figure 4:
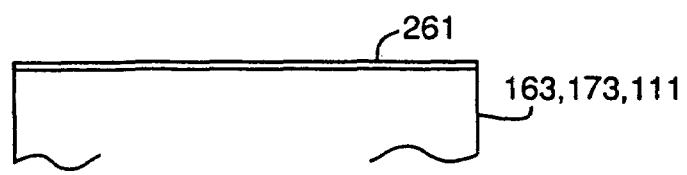
FIG. 4 is a diagram of a state in which a silver plating is provided to a contact face to a charge generating semiconductor substrate in a preheat device, a post-forming bumps heating device and a bonding stage shown in FIGS. 1 and 2.

In the bonding stage 110, as shown in FIG. 3, holes 113 are opened for sucking the pre-forming bumps wafer 201 and for jetting a gas to a wafer platform 111 where the pre-forming bumps wafer 201 is placed. A suction device 114 and a blower 115, which is an example functioning as a gas feeder, are controlled to operate by the controller 180 and are connected to the holes 113. The above gas is air in this embodiment. The wafer platform 111 of the bonding stage 110 can be moved up/down by a lift between a heating position where the platform is in contact with heaters 112 and a shift position where the semiconductor substrate such as the pre-forming bumps wafer 201 or the like is to be shifted. A contact face of the wafer platform 111 to the pre-forming bumps wafer 201 is metal plated as shown in FIG. 4, specifically, silver plated at 261 in the embodiment. The silver plating enhances a thermal conductivity between the wafer platform 111 and the pre-forming bumps wafer 201 and an efficiency of eliminating charge of the pre-forming bumps wafer 201.

The bump forming head 120 is a known device for forming bumps 16 onto the electrode parts 15 of the pre-forming bumps wafer 201 placed on the bonding stage 110 and maintained at the temperature for bump bonding. The head 120 includes a bump forming part for forming a ball by melting a gold wire as a material for the bump 16 and pressing the molten ball to the electrode part 15, an ultrasonic wave generating part for applying ultrasonic waves to the bump 16 at the pressing time, and the like in addition to a wire feeding part 121 for feeding the gold wire as shown in FIG. 1. The bump forming head 120 constituted as above has, e.g., a ball screw structure placed on an XY-table 122 movable in mutually orthogonal X and Y-directions on a plane, and is moved by the XY-table 122 in the X and Y-directions so that the bump 16 can be formed to each of the electrode parts 15 of the fixed pre-forming bumps wafer 201.

Figure 5:
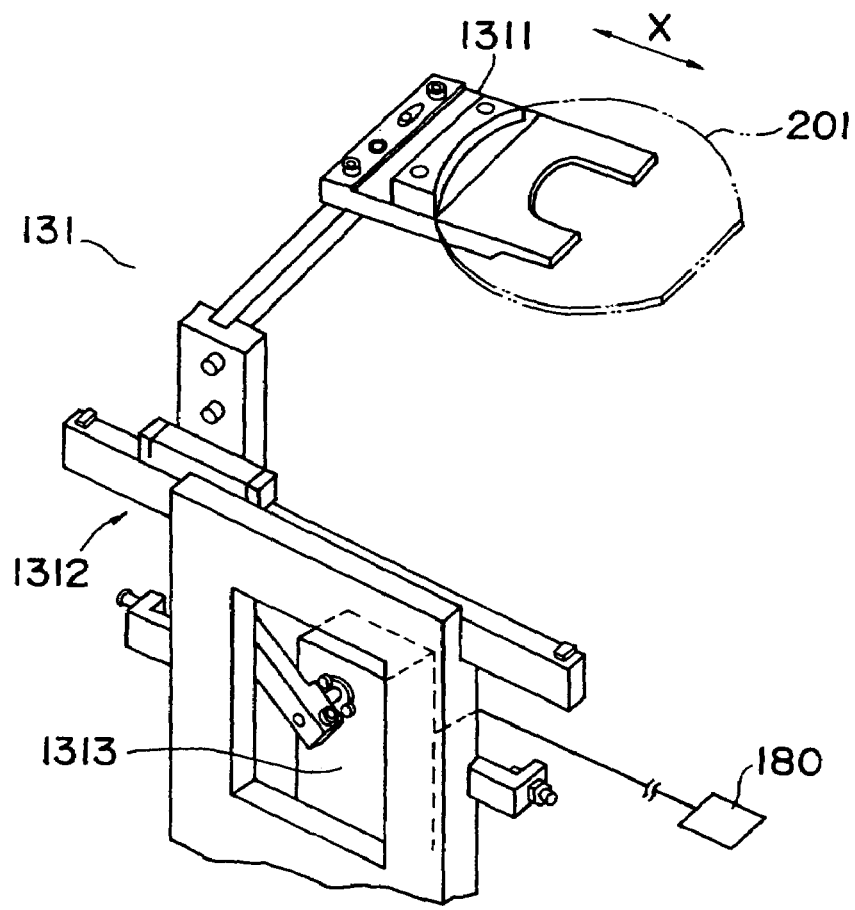
FIG. 5 is a perspective view showing the constitution of a carry-in device in FIGS. 1 and 2 in detail.

There are provided two types of transfer devices 130 in the bump forming apparatus 101. A carry-in device 131 as the transfer device of one type is a device for taking out the pre-forming bumps wafer 201 from the first storage container 205, and a carry-out device 132 as the transfer device of the other type is a device for transferring and storing a piezoelectric substrate wafer after having bumps formed (referred to simply as a "wafer with formed bumps" below) 202 into the second storage container 206. As shown in FIG. 5, the carry-in device 131 includes a holding bed 1311 for holding the pre-forming bumps wafer 201 by suction and a moving device 1312 for carry-in device which moves the holding bed 1311 along the X-direction. A driving part 1313 included in the moving device 1312 is connected to and controlled in operation by the controller 180. When the driving part 1313 operates, the holding bed 1311 moves along the X-direction and the carry-in device 131 takes out the pre-forming bumps wafer 201 from the first storage container 205.

Figure 6:
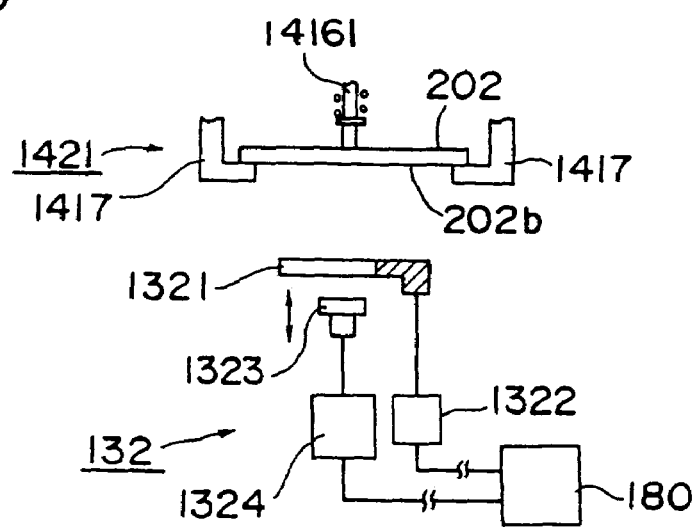
FIG. 6 is a diagram explanatory of the operation in a step 8 of FIG. 17, showing a state in which a bump-formed wafer held by a carry-out side shift device is disposed above a carry-out device.

The carry-out device 132 has a structure similar to that of the carry-in device 131 and operates similarly to the carry-in device, and therefore will be depicted roughly. As shown in FIG. 6, the carry-out device 132 has a holding bed 1321 for holding the wafer with formed bumps 202 by suction in the embodiment, a moving device 1322 for the carry-out device which moves the holding bed 1321 along the X-direction and stores the wafer with formed bumps 202 at the second storage container 206, a holding part 1323 which sucks a rear face 202b of the wafer with formed bumps 202 thereby holding the wafer with formed bumps 202, and a driving part 1324 disposed below the holding bed 1321 for moving the holding part 1323 in a thickness direction of the wafer with formed bumps 202 held to the holding bed 1321. The above moving device 1322 for the carry-out device and the driving part 1324 are controlled to operate by the controller 180.

Figure 7:
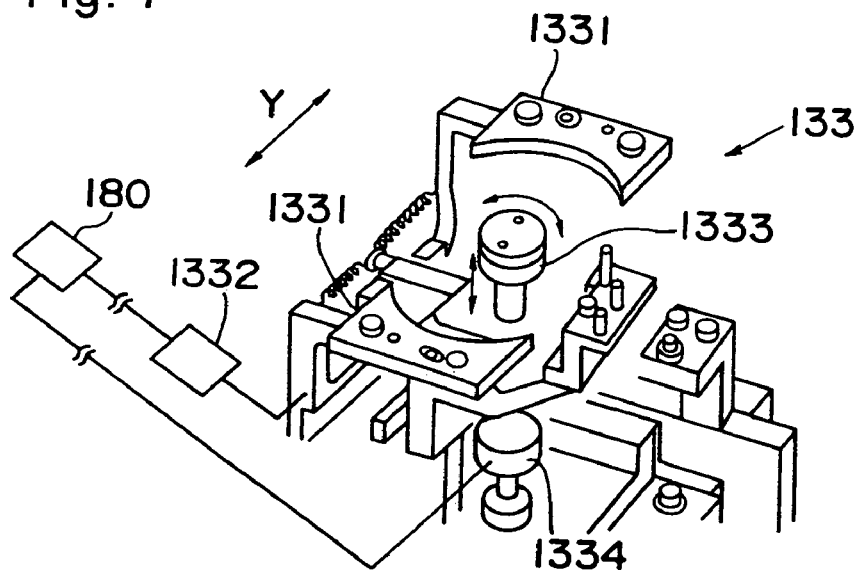
FIG. 7 is a perspective view showing the constitution of an orientation flat registering device in FIGS. 1 and 2 in detail.

An orientation flat registering device 133 is arranged at a position where the carry-in device 131 is disposed, which orientates an orientation flat of the pre-forming bumps wafer 201 taken out by the carry-in device 131 from the first storage container 205 to a predetermined direction. The orientation flat registering device 133 has, as shown in FIG. 7, a catching plate 1331 which is moved by a driving part 1332 in the Y-direction to hold the pre-forming bumps wafer 201, a holding part 1333 which can move in the thickness direction of the pre-forming bumps wafer 201, can hold the pre-forming bumps wafer 201, and can rotate in a circumferential direction of the pre-forming bumps wafer 201 so as to orientate the orientation flat of the held pre-forming bumps wafer 201, and a driving part 1334 for the holding part 1333. The above driving parts 1332 and 1334 are controlled to operate by the controller 180.

The shift device 140 in the bump forming apparatus 101 comprises a carry-in side shift device 141 and a carry-out side shift device 142. The carry-in side shift device 141 catches the pre-forming bumps wafer 201 held to the holding bed 1311 of the carry-in device 131 and transfers the pre-forming bumps wafer to the preheat device 160 and to the bonding stage 110 from the preheat device 160. On the other hand, the carry-out side shift device 142 catches the wafer with formed bumps 202 held on the bonding stage 110 and transfers the wafer with formed bumps to the post-forming bumps heating device 170 and to the holding bed 1321 of the carry-out device 132 from the post-forming bumps heating device 170.

Figure 2:
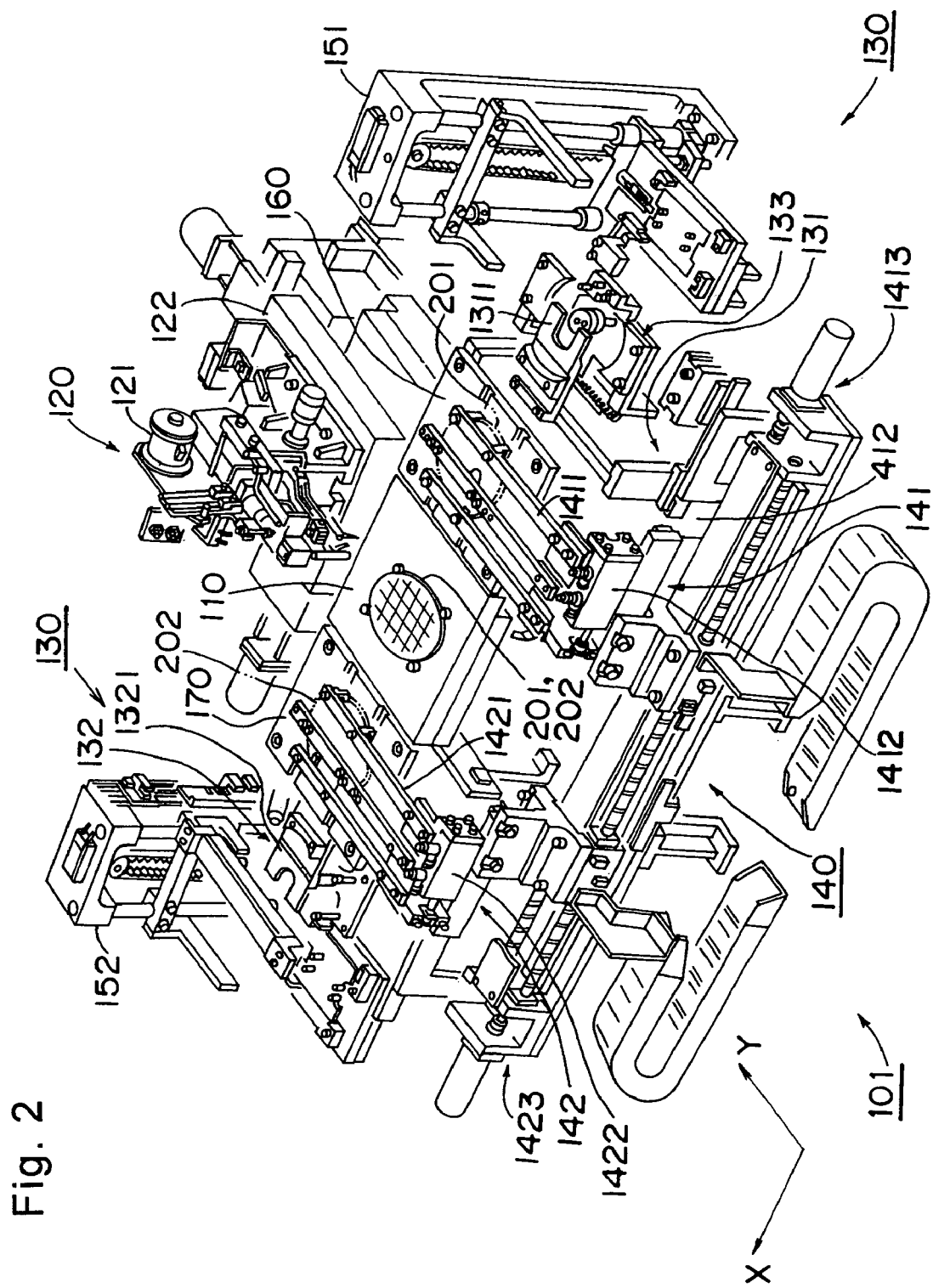
FIG. 2 is a perspective view indicating a detailed structure of essential parts of the bump forming apparatus of FIG. 1.

As shown in FIG. 2, the above-constituted carry-in side shift device 141 includes a wafer holding part 1411 for catching and holding the pre-forming bumps wafer 201 and eliminating charges of a front face and a rear face of the pre-forming bumps wafer 201, a driving part 1412 for driving the wafer holding part 1411 for the holding operation and which is equipped with an air cylinder in the embodiment, and a moving device 1413 constituted of a ball screw mechanism in the embodiment for moving the whole of the wafer holding part 1411 and the driving part 1412 in the X-direction. The driving part 1412 and the moving device 1413 are connected to the controller 180 and controlled in operation.

Similar to the carry-in side shift device 141, the carry-out side shift device 142 includes a wafer holding part 1421, a driving part 1422 and a moving device 1423. The driving part 1422 and the moving device 1423 are controlled to operate by the controller 180.

Figure 8:
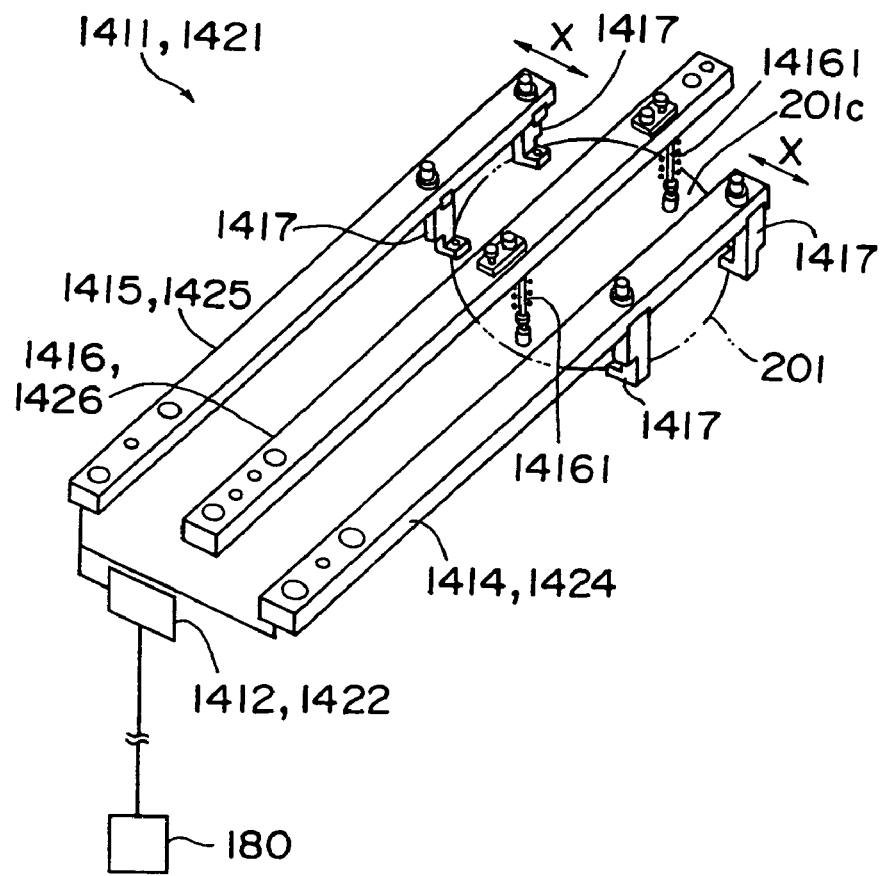
FIG. 8 is a perspective view of the constitution of a shift device of FIGS. 1 and 2 in detail.

The above wafer holding parts 1411 and 1421 will be discussed now. As shown in FIG. 8, the wafer holding part 1411 has a first holding member 1414, a second holding member 1415 and a member 1416 for charge removal which is arranged between the first holding member and the second holding member. The first holding member, the second holding member and the member for charge removal are arranged to be mutually parallel. The first holding member and the second holding member can be moved by the driving part 1412 in the X-direction. These first holding member 1414, second holding member 1415 and member 1416 for charge removal are all formed of iron or another conductive material. The wafer holding part 1421 similar to the wafer holding part 1411 has a first holding member 1424, a second holding member 1425, and a member 1426 for charge removal which are arranged parallel to each other. The member for charge removal is arranged, between the first holding member and the second holding member. All of the first holding member 1424, the second holding member 1425 and the member 1426 for charge removal are formed of iron or another conductive material. Since the wafer holding parts 1411 and 1421 are in the same structure, the wafer holding part 1411 will be discussed representatively hereinafter.

Each of the first holding member 1414 and the second holding member 1415 is equipped with two L-shaped holding hooks 1417 formed of iron or a conductive resin material for holding the pre-forming bumps wafer 201 as illustrated. The first holding member 1414, the second holding member 1415 and the holding hooks 1417 are formed of iron or another conductive material so as to enable grounding of a charge on the rear face 201*b* of the held pre-forming bumps wafer 201.

Figure 9:
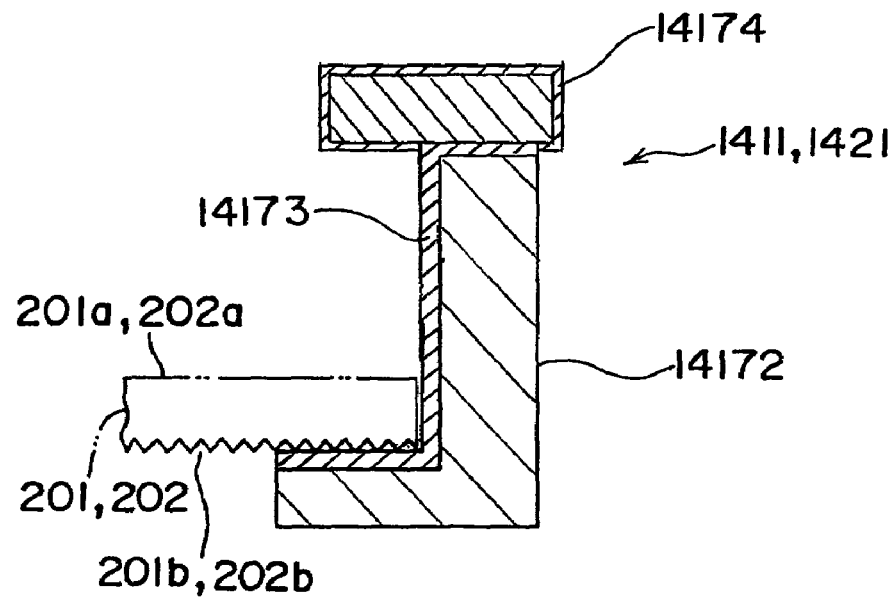
FIG. 9 is a diagram of a modified example of a carry-in side shift device and the carry-out side shift device of FIGS. 1 and 2.

Preferably, entire outer faces of the first holding member 1414, the second holding member 1415, and the holding hooks 1417 are coated with an insulating material as shown in FIG. 9.

Figure 10:
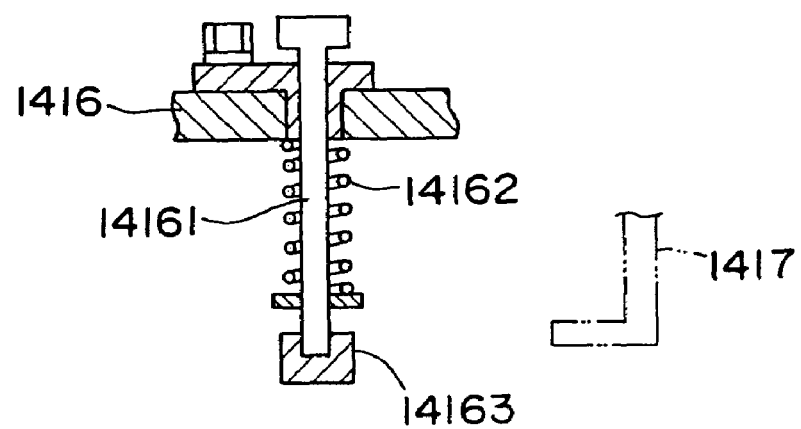
FIG. 10 is a diagram showing in detail the constitution of a contact member for charge removal of a wafer holding part shown in FIG. 8.

Contact members 14161 for charge removal are arranged projecting in the thickness direction of the wafer 201 at two points of the charge removal member 1416 along a diametrical direction of the wafer 201 in the embodiment so as to be able to come into contact with a circumferential edge part 201*c* of the front face 201*a* of the pre-forming bumps wafer 201 held by the wafer holding part 1411. The contact member 14161 for charge removal is fitted to penetrate slidably to the member 1416 as shown in FIG. 10, and is urged by a spring 14162 in an axial direction of the contact member 14161 for charge removal. A conductive resin 14163 is provided as a buffer to a wafer contact end part of the contact member 14161 for charge removal.

The contact members 14161 ground the charge of the front face 201*a* because of the conductive resins 14163 coming into contact with the front face 201*a* of the pre-forming bumps wafer 201. In a state before the pre-forming bumps wafer 201 is held by the holding hooks 1417, the contact members 14161 are in the same level as a level of the holding hooks 1417 in the thickness direction of the pre-forming bumps wafer 201 or project beyond the holding hooks 1417. Due to this structure, the contact members 14161 are able to come into contact with the front face 201*a* of the pre-forming bumps wafer 201 before the holding hooks 1417 come into contact with the pre-forming bumps wafer 201 when the wafer holding part 1411 is to hold the pre-forming bumps wafer 201. Therefore, the charge of the front face 201*a* can be removed first. Alternatively, an arrangement of directly connecting ground wires to the contact members 14161 may be adopted.

The preheat device 160 is a device which carries out one of the characteristic operations in the bump forming apparatus 101 of the embodiment. That is, the preheat device 160 is a device for executing a pre-formation temperature control for bonding promotion to the pre-forming bumps wafer 201 before bumps 16 are formed onto electrode parts 15 of the pre-forming bumps wafer 201, wherein the temperature control promotes bonding between the electrode parts 15 and the bumps 16 during the bump formation. The preheat device roughly comprises a preheating part for heating the pre-forming bumps wafer 201 and a control part for carrying out the pre-formation temperature control for bonding promotion to the preheating part. The control part corresponds to the controller 180 in the present embodiment.

The above preheating part is constituted as follows.

Figure 11:
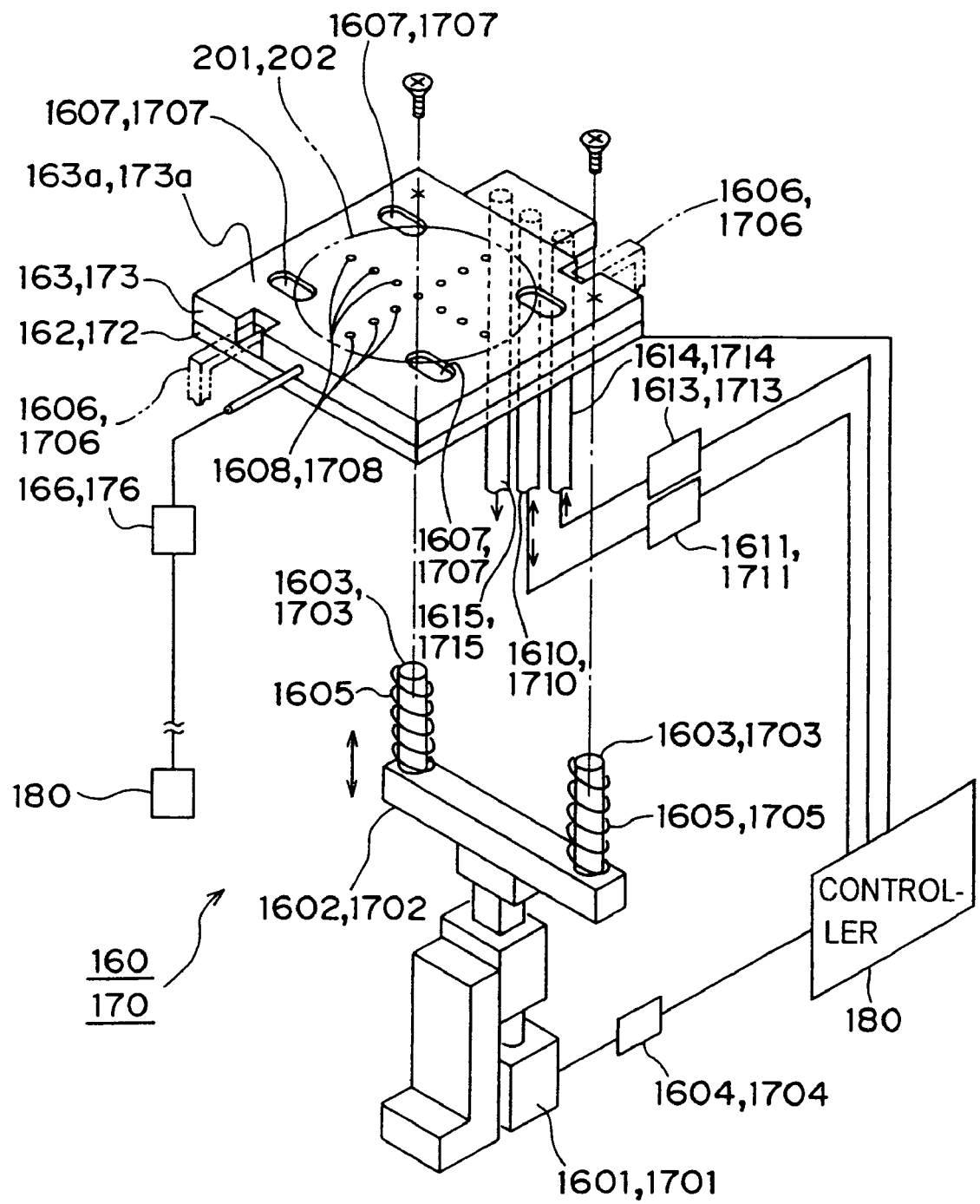
FIG. 11 is a perspective view of the preheat device and the post-forming bumps heating device.
Figure 12:
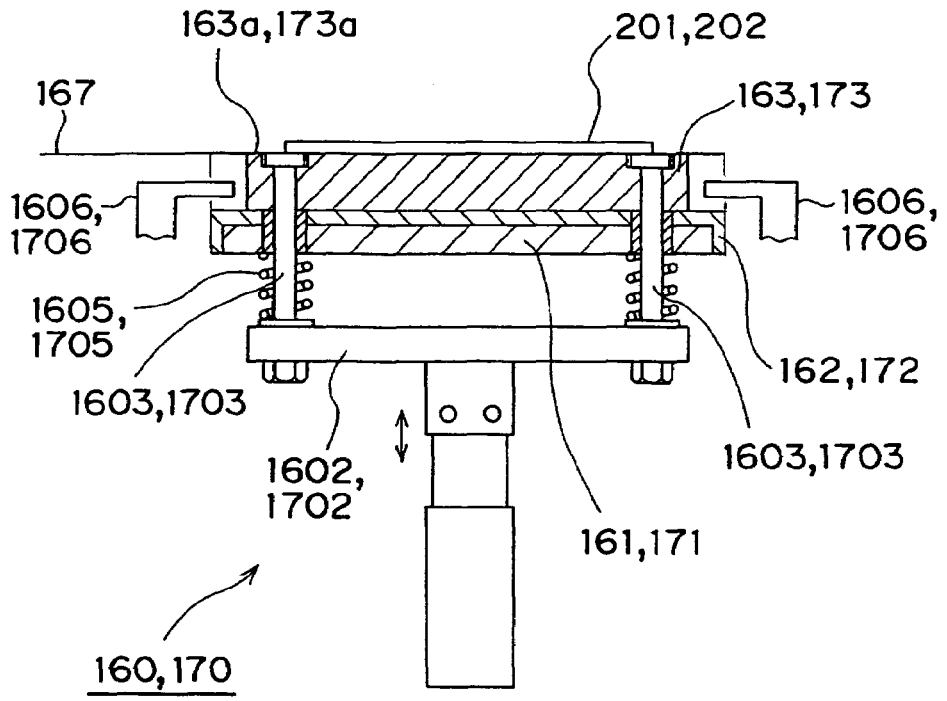
FIG. 12 is a diagram for explaining the operation of the preheat device and the post-forming bumps heating device of FIG. 11.
Figure 13:
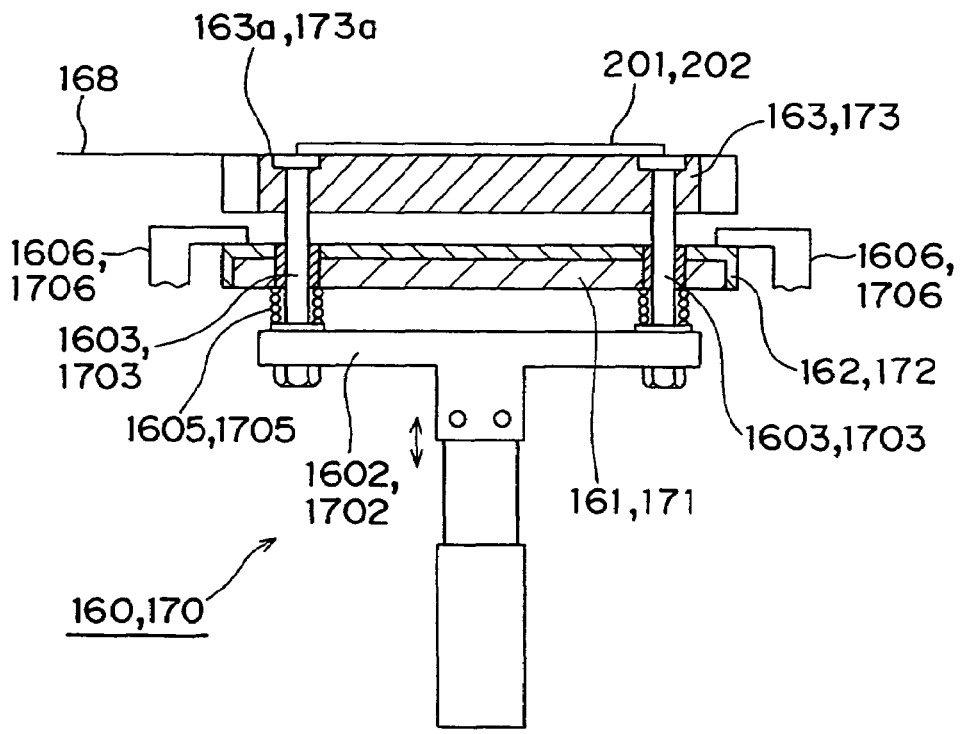
FIG. 13 is a diagram for explaining the operation of the preheat device and the post-forming bumps heating device of FIG. 11.

As shown in FIGS. 11-13, an aluminum plate 163 which has a thickness of 6 mm in the embodiment is placed as a thermal diffusion member on a panel heater frame 162 having a panel heater 161 as a heat source. A wafer load face 163*a* of the aluminum plate 163 is metal plated as shown in FIG. 4, specifically, silver plated at 261 in the embodiment. A thermal conductivity between the aluminum plate 163 and the pre-forming bumps wafer 201 is improved, and a charge removal effect for the pre-forming bumps wafer 201 is enhanced by the silver plating. A temperature increase operation by the panel heater 161 is controlled by the controller 180 with reference to temperature information from a temperature sensor 166, e.g., a thermocouple or the like which measures a temperature of the aluminum plate 163. A material of the thermal diffusion member 163 is not limited to the above aluminum and can be a material with good thermal conductivity which does not bring about a chemical reaction with the pre-forming bumps wafer 201, for example, duralumin or the like.

According to the present embodiment, neither of the carry-in side shift device 141 and the carry-out side shift device 142 is provided with a mechanism for moving the wafer holding part 1411 and the wafer holding part 1421 in the thickness direction of the pre-forming bumps wafer 201 and the wafer with formed bumps 202 held by the parts. Therefore, the preheat device 160 is equipped with a lift mechanism for moving the panel heater frame 162 with the panel heater 161 and the aluminum plate 163 in the thickness direction between a down position 167 shown in FIG. 12 and an up position 168 shown in FIG. 13 to place the pre-forming bumps wafer 201 onto the aluminum plate 163. The lift mechanism has an air cylinder 1601 as a driving source for the up-down movements in the thickness direction, a T-shaped supporting member 1602 to be moved up/down by the air cylinder 1601 and two supporting bars 1603 erected on the supporting member 1602 for supporting the panel heater frame 162 and the aluminum plate 163. The air cylinder 1601 is operated by a cylinder driver 1604 controlled in operation by the controller 180. The panel heater frame 162 and the aluminum plate 163 are separated by the up-down movements by the air cylinder 1601 in the embodiment as will be described later, thereby promoting cooling of the aluminum plate 163. Therefore, the cylinder driver 1604 and the air cylinder 1601 functions as a separator.

In the present embodiment as shown in the drawings, the supporting bars 1603 penetrate the panel heater frame 162, with leading ends of the bars inserted into the aluminum plate 163. In a state with the supporting bars 1603 penetrating the panel heater frame, the panel heater frame 162 is slidable in an axial direction of the supporting bars 1603 and the aluminum plate 163 is fixed by the leading ends of the supporting bars 1603 to the supporting bars 1603. The panel heater frame 1602 is further pressed to the aluminum plate 163 by springs 1605 as an example of urging means. While the panel heater frame 162 and the aluminum plate 163 integrally move up and down from the down position 167 as shown in FIG. 12 when the air cylinder 1601 operates, the upward movement of the panel heater frame 162 is stopped by stoppers 1606 as shown in FIG. 13 after the panel heater frame 162 butts against the stoppers 1606 arranged at a contact position during the upward movement. As a result, only the aluminum plate 163 moves up, whereby the panel heater frame 162 and the aluminum plate 163 are separated from each other. The aluminum plate 163 moves up to the up position 168. A gap between the panel heater frame 162 and the aluminum plate 163 when the separation is completed is approximately 2-4 mm in the embodiment. At the downward movement time after the separation, only the aluminum plate 163 moves down from the up position 168 to the contact position where the stoppers 1606 are arranged, and the panel heater frame 162 and the aluminum plate 163 move down together to the down position 167 from the contact position.

After preheating (which will be discussed in a detailed manner later), while it is necessary to decrease the temperature of the aluminum plate 163 to approximately 40° C. before a fresh pre-forming bumps wafer 201 is loaded, a cooling speed for the aluminum plate 163 can be improved more in comparison with the conventional art because the panel heater frame 162 and the aluminum plate 163 are constructed to be separable as above. Consequently, a cycle time can be shortened. Since the cooling speed is improved, the separation structure is particularly effective from a view point of the cycle time for a trial stage before mass production or when bumps are to be formed only to a few wafers of the same kind.

Furthermore, since it is enough for the panel heater frame 162 and the aluminum plate 163 to be united at a time point when the temperature of the aluminum plate 163 has decreased and it is not necessary to wait for the panel heater frame 162 to decrease to the aforementioned approximately 40° C., a temperature difference at the panel heater frame 162 is reduced in comparison with the conventional art. A load to the panel heater 161 can be reduced, so that a life of the panel heater 161 can be elongated as compared with the conventional art.

Although the panel heater frame 162 and the aluminum plate 163 are constructed to be separable in the embodiment as described hereinabove, a simple structure may be devised in which the panel heater frame 162 and the aluminum plate 163 integrally move up and down at all times without being separated from each other.

Since the panel heater frame 162 and the aluminum plate 163 are supported by two supporting bars 1603 as above, the heat from the panel heater frame 162 is hard to conduct to the supporting member 1602, the air cylinder 1601, etc. Most of the heat from the panel heater frame 162 can be transmitted to the aluminum plate 163, and therefore a temperature distribution at the aluminum plate 163 is made nearly uniform, so that all of the pre-forming bumps wafer 201 can be heated uniformly. In addition, the supporting member 1602, etc. are prevented from being hot even when continuously driven.

Figure 14:
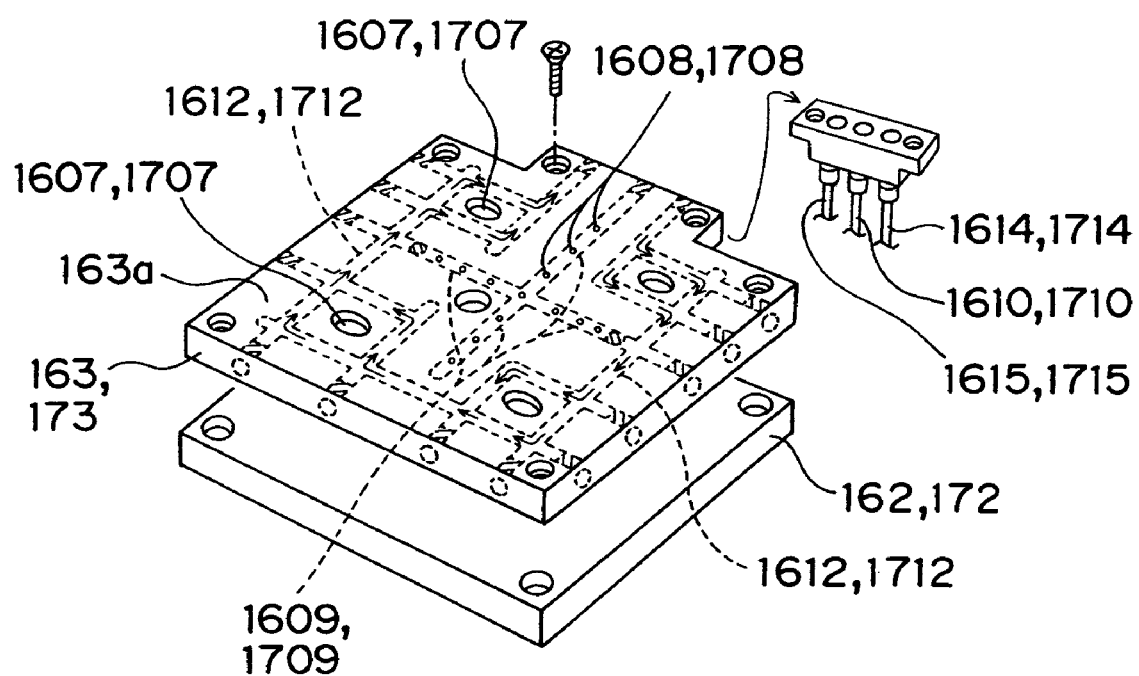
FIG. 14 is a perspective view of an aluminum plate and a heater plate frame of the preheat device and the post-forming bumps heating device of FIG. 11.

On the wafer load face 163a of the aluminum plate 163, there are formed clearance grooves 1607 for letting in the holding hooks 1417 of the wafer holding part 1411 when the pre-forming bumps wafer 201 is to be placed, and air holes 1608. As shown in FIG. 14, the air holes 1608 communicate with a passage 1609 for blow/suction formed in the aluminum plate 163 so as to separate the pre-forming bumps wafer 201 and the wafer load face 163a from each other when the pre-forming bumps wafer 201 is to be transferred, to jet the air when charge of the rear face of the pre-forming bumps wafer 201 is to be removed, or to suck the air when the pre-forming bumps wafer 201 is to be sucked and held on the wafer load face 163a although this is fundamentally not carried out in the embodiment, as will be depicted in the description of the operation later. The passage 1609 for blow/suction is, as shown in FIG. 11, connected via a coupling tube 1610 to a blow/suction device 1611 controlled to operate by the controller 180. Although air is used as the gas to be jetted in the embodiment as mentioned above, another gas may be utilized. The blow/suction device 1611 functions as a gas feeder in the event that an operation of correcting deflection and an operation of removing charge of the pre-forming bumps wafer 201 are to be carried out by feeding the gas.

A passage 1612 for refrigerant for cooling the aluminum plate 163 is formed in the aluminum plate 163. Although the air of ordinary temperatures is used as the refrigerant in the embodiment, the other gas, water or the like may be used. As indicated in FIG. 11, the passage 1612 for refrigerant is connected via a coupling tube 1614 to a cooling air feeder 1613 controlled to operate by the controller 180. The air for cooling after being supplied to the passage 1612 flows in the passage 1612 along illustrated arrows and is discharged outside through a coupling tube 1615.

The above-mentioned pre-formation temperature control for bonding promotion which is carried out by the control of the controller 180 in the preheat device 160 of the constitution will be described.

As discussed as problems inherent in the conventional art, in the case where the electrode part 15 is thinner in film thickness than a normal electrode part, if the bump is very small or particularly when the electrode part 15 is formed of aluminum, the bonding state of the bump 16 becomes unstable and a necessary bonding strength cannot be obtained in some cases. The reason for this is considered to be as follows. The electrode part 15 of the circuit part 20 formed to the semiconductor substrate is formed by providing a metal, for instance, aluminum for forming the electrode part 15 into a desired thickness on the circuit part 20 by, e.g., vapor deposition. While the metal is in a state with aluminum particles piling when forming the electrode part 15, a diameter of the aluminum particles is as large as approximately 0.05-0.3 μm. Therefore, the incomplete state with coarse particles is considered to cause the electrode part 15 to be brittle especially when the film thickness is thinner than the normal one as mentioned hereinabove, for instance, approximately 2000 Å (=0.2 μm). Meanwhile, when the bump 16 is to be formed on the electrode part 15, since the metal ball in a melt state which becomes the bump 16 is pressed to the electrode part 15 while being ultrasonically vibrated, the ultrasonic vibration or the like acts upon the electrode part 15 of the brittle state, collapsing the metal of coarse particles or bringing about the like phenomenon. As a result, the electrode part 15 and the bump 16 cannot be stably bonded. The unstable bonding is noticed particularly when the aluminum is used for the electrode part 15 and the film thickness 22 is small.

In order to cope with this, according to the present embodiment, heating by the aforementioned pre-formation temperature control for bonding promotion is carried out before bumps 16 are formed to the pre-forming bumps wafer 201 having electrode parts 15. Although specifically described in the description of a bump formation operation of the bump forming apparatus 101 later, the pre-formation temperature control for bonding promotion is a control of heating the pre-forming bumps wafer 201 to a pre-formation temperature for bonding promotion which is, not lower than the temperature for bump bonding and not higher than a damage preventive temperature of the pre-forming bumps wafer 201. In the embodiment, the temperature control is furthermore a control of maintaining the pre-forming bumps wafer 201 at the pre-formation temperature for bonding promotion for a pre-formation time period for bonding promotion, and defining the pre-forming bumps wafer 201 to the bump bonding temperature after the pre-formation time period for bonding promotion has passed.

Figure 15:
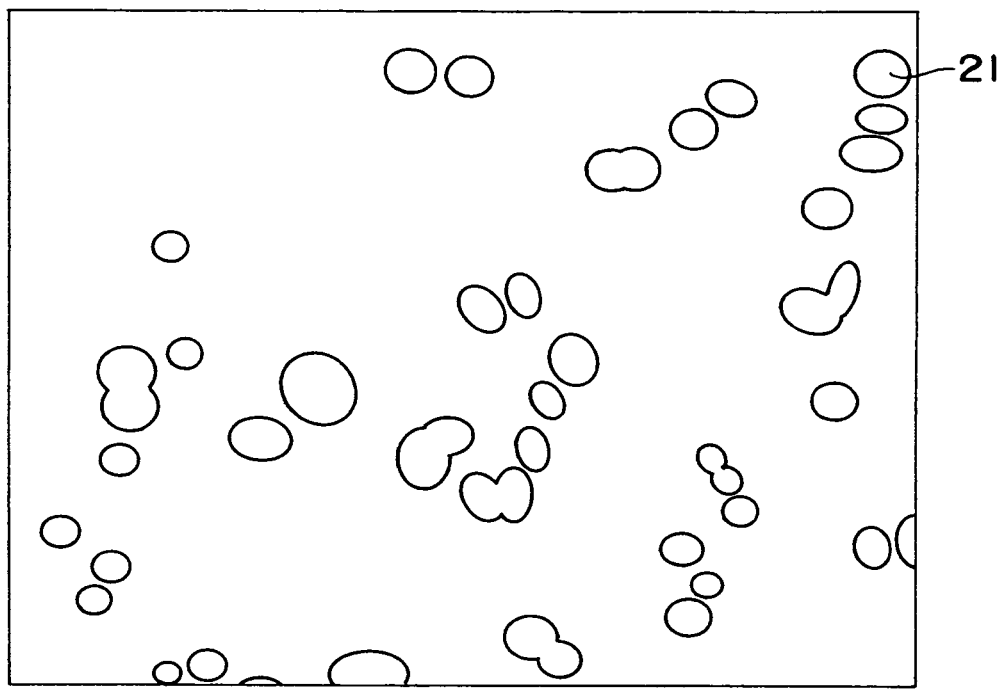
FIG. 15 is a diagram of metal particles in a state before the execution of a pre-formation temperature control for bonding promotion at a surface of a part near a bump formation part.
Figure 16:
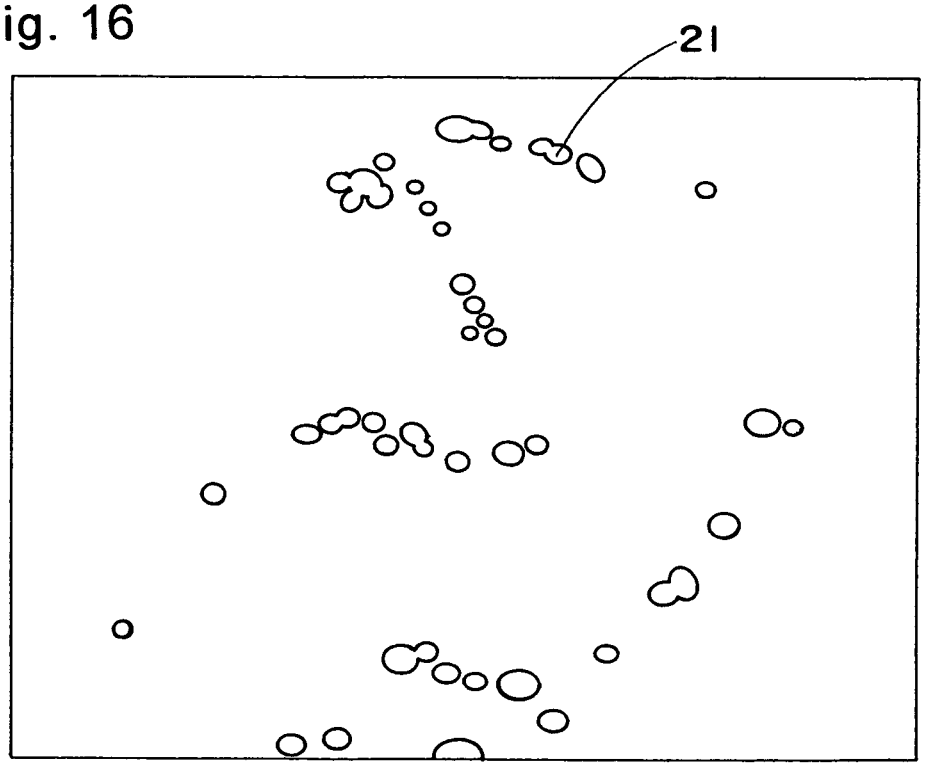
FIG. 16 is a diagram of metal particles in a state after the execution of the pre-formation temperature control for bonding promoting at the surface of the part near the bump formation part.

By carrying out the above temperature control, phenomenally, the bonding state between electrode parts 15 and bumps 16 can be improved as compared with the conventional art. In other words, it is considered that metal particles of the large particle size as mentioned earlier are changed to a fine state of, e.g., approximately ⅔ to ⅓ the particle size, thereby improving the strength of the electrode parts 15. FIG. 15 is a diagram based on an electron microscope photograph imaging a state of the substrate surface in the vicinity of where the bump is formed before the temperature control is executed. FIG. 16 is a diagram based on an electron microscope photograph of the vicinity in a state after the temperature control is executed. A magnification of the original electron microscope photographs is 100,000 times in both cases. A reference numeral 21 indicates the aluminum particle forming the electrode part 15. The particle 21 in FIG. 16 is smaller than the particle 21 in FIG. 15, which represents that the execution of the temperature control promotes changing the aluminum particles to a finer size.

The post-forming bumps heating device 170 will be described next, which is a device for carrying out one of the characteristic operations in the bump forming apparatus 101 of the embodiment. Specifically, the post-forming bumps heating device 170 executes upon the wafer with formed bumps 202 a post-formation temperature control for promoting bonding between electrode parts 15 and bumps 16 after the bumps 16 are formed onto the electrode parts 15 of the pre-forming bumps wafer 201, which roughly comprises a late heating part for heating the wafer with formed bumps 202 and a control part for carrying out the post-formation temperature control for bonding promotion to the late heating part. The control part corresponds to the controller 180 according to the embodiment.

The late heating part is constituted as described below.

In structure, the late heating part has an equal structure to that of the above-described preheat device 160, in which a panel heater frame and an aluminum plate are separated from each other in the embodiment. That is, corresponding to each of the constituent parts of the preheat device 160 described hereinabove, the post-forming bumps heating device 170 alike includes a panel heater 171, a panel heater frame 172, an aluminum plate 173, a temperature sensor 176, an air cylinder 1701, a supporting member 1702, supporting bars 1703, a cylinder driver 1704, springs 1705, stoppers 1706, clearance grooves 1707, air holes 1708, a passage 1709 for blow/suction, a coupling tube 1710, a blow/suction device 1711, a passage 1712 for refrigerant, a cooling air feeder 1713, and coupling tubes 1714 and 1715. FIGS. 11-14 indicate reference numerals in both the preheat device 160 and the post-forming bumps heating device 170. The panel heater 171 is controlled in operation by the controller 180 so as to control a temperature of the wafer with formed bumps 202. A wafer load face 173*a* of the aluminum plate 173 is metal plated as shown in FIG. 4, i.e., silver plated at 261 in the embodiment, similar to the aluminum plate 163. The silver plating improves a thermal conductivity between the aluminum plate 173 and the wafer with formed bumps 202 and enhances an effect of removing charge of the wafer with formed bumps 202.

The post-formation temperature control for bonding promotion executed by the control of the controller 180 in the thus-constituted post-forming bumps heating device 170 will be discussed.

As will be specifically depicted in the description of the bump formation operation of the bump forming apparatus 101 later, the post-formation temperature control for bonding promotion is a control of heating the wafer with formed bumps 202 to a post-formation temperature for bonding promotion which is not lower than the temperature for bump bonding and not higher than a damage preventive temperature of the wafer with formed bumps 202. Moreover, the temperature control in the embodiment is a control of maintaining the wafer with formed bumps 202 at the post-formation temperature for bonding promotion for a post-formation period of time for bonding promotion, and decreasing the wafer with formed bumps 202 to nearly a room temperature after the lapse of the post-formation time period for bonding promotion.

This post-formation temperature control for bonding promotion is not intended to optimize metal particles of the electrode part 15 as in the pre-formation temperature control for bonding promotion executed by the preheat device 160, but is intended to promote diffusing both materials of the bump 16 and the electrode part 15 at a bonding interface. When the post-formation temperature control for bonding promotion is practiced, the bonding state between the bump 16 formed on the electrode part 15 and the electrode part 15 is improved by the diffusion of the metals. The electrode part 15 and the bump 16 can be more firmly bonded accordingly.

In the embodiment, programs for carrying out the above pre-formation temperature control for bonding promotion and the post-formation temperature control for bonding promotion are stored in a storage 181 of the controller 180. However, the arrangement is not limited to this and the programs may be supplied to the controller 180 via a read device 183 from a recording medium 182 with the programs recorded therein, e.g., a CD-ROM, a floppy disk or the like, and furthermore can be supplied via a communication line.

The temperature controls can be carried out separately from each other, and moreover can be controlled while related to each other by the controller 180, for instance, by shortening the post-formation time period for bonding promotion when the pre-formation time period for bonding promotion is increased, or the like manner.

The lift 150 includes a first lift 151 for loading the first storage container 205 and a second lift 152 for loading the second storage container 206. The first lift 151 moves the first storage container 205 up and down so that the pre-forming bumps wafer 201 is disposed to a position where the wafer can be taken out by the carry-in device 131. The second lift 152 moves the second storage container 206 up and down so that the wafer with formed bumps 202 held by the carry-out device 132 can be stored to a predetermined position in the second storage container 206.

The operation in the bump forming apparatus 101 of the embodiment constituted as described above, i.e., the bump formation method will be discussed below. A sequence of operations of forming bumps to the pre-forming bumps wafer 201 and storing the wafer with formed bumps 202 into the second storage container 206 is carried out by controlling each of the above constituent parts by the controller 180 to operate. As depicted hereinabove, the controller 180 carries out the pre-formation temperature control for bonding promotion to the pre-forming bumps wafer 201 by the preheat device 160 and can still further control blow operations for removing charge and for correcting deflection to the pre-forming bumps wafer 201 which are executable by the preheat device 160. Moreover, the controller 180 carries out the post-formation temperature control for bonding promotion to the wafer with formed bumps 202 by the post-forming bumps heating device 170 and can also control blow operations for removing charge and for correcting deflection to the wafer with formed bumps 202 which are executable by the post-forming bumps heating device 170.

Figure 17:
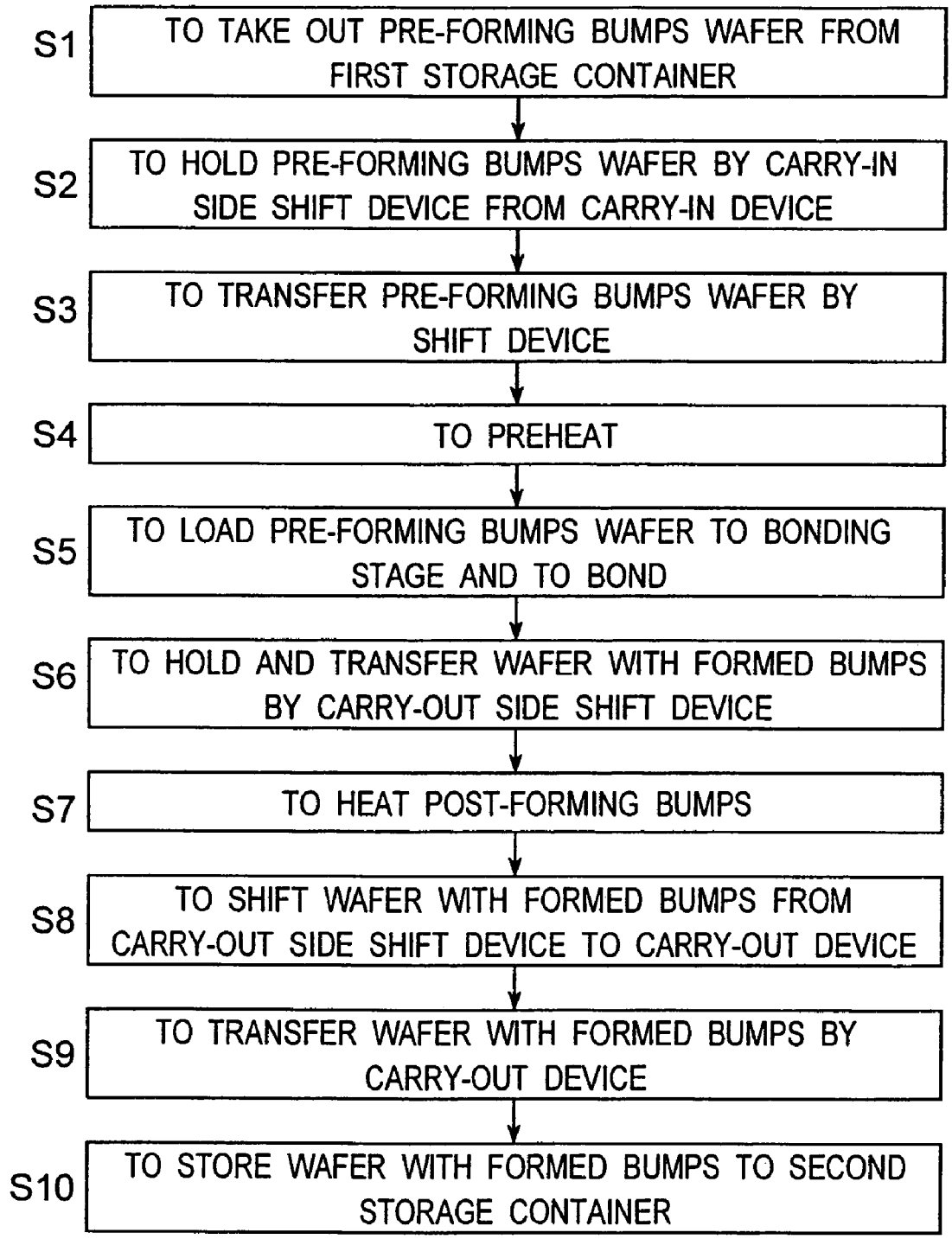
FIG. 17 is a flow chart of the operation of the bump forming apparatus shown in FIG. 1.

In the bump forming apparatus 101 of the present embodiment, bumps are formed to the pre-forming bumps wafer 201, and the wafer with formed bumps 202 is stored at the second storage container 206 in steps from a step (denoted by "S" in FIG. 17) 1 to a step 10 in the drawing.

Specifically, in the step 1, the first storage container 205 is raised by the first lift 151 so that the pre-forming bumps wafer 201 is arranged at the position where the wafer can be taken out of the first storage container 205 by the carry-in device 131. Then the pre-forming bumps wafer 201 is taken out of the first storage container 205 by the carry-in device 131. In addition, the pre-forming bumps wafer 201 held by the carry-in device 131 has its orientation flat orientated by the orientation flat registering device 133.

After the orientation flat is matched, in the step 2, the pre-forming bumps wafer 201 held to the holding bed 1311 of the carry-in device 131 is caught by the carry-in side shift device 141. This operation will be detailed with reference to FIGS. 18-21.

Figure 18:
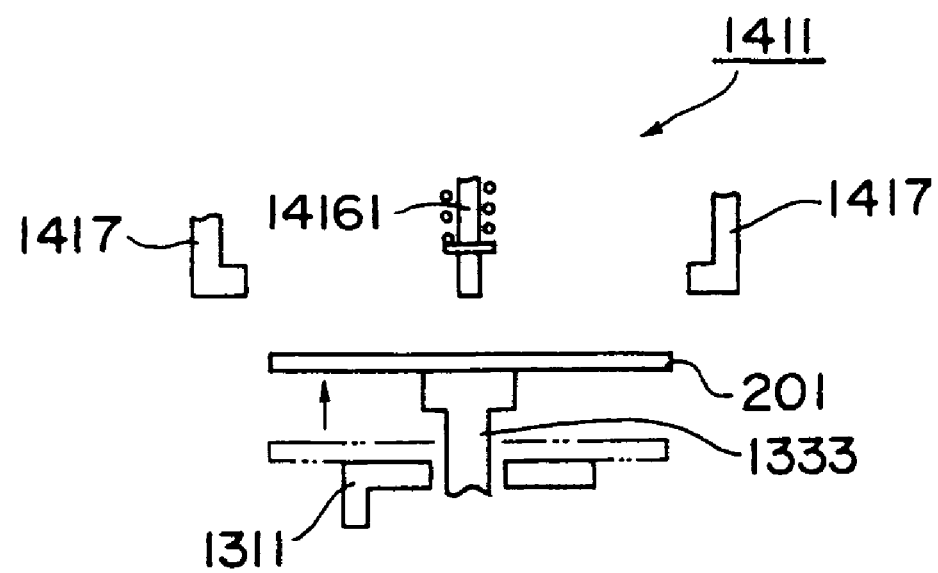
FIG. 18 is a diagram for explaining the operation in a step 2 of FIG. 17, indicating a state in which the wafer is raised by the carry-in device.
Figure 19:
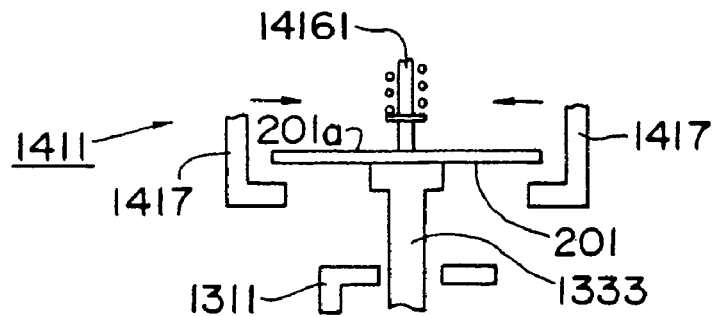
FIG. 19 is a diagram for explaining the operation in the step 2 of FIG. 17, indicating a state immediately before the wafer is held by the carry-in side shift device.

As shown in FIG. 18, after the orientating, the holding part 1333 of the orientation flat registering device 133 moves up to suck and hold the pre-forming bumps wafer 201 from the holding bed 1311, and then moves upward. In the meantime, the wafer holding part 1411 is arranged above the pre-forming bumps wafer 201 and the first holding member 1414 and the second holding member 1415 are moved by the driving part 1412 in a direction to open along the X-direction. Thereafter as shown in FIG. 19, the holding part 1333 moves up, whereby leading ends of the charge removal contact members 1416 of the wafer holding part 1411 come in contact with the front face 201a of the pre-forming bumps wafer 201. Even if the front face 201a is charged immediately before the contact by the contact members 14161, the charge is removed through the contact of the contact members 14161.

Figure 20:
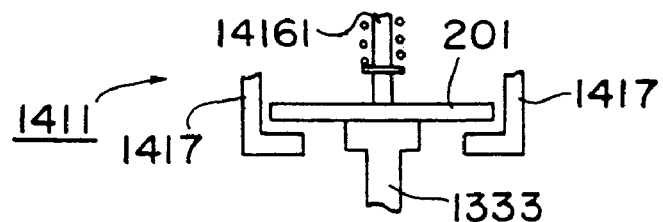
FIG. 20 is a diagram for explaining the operation in the step 2 of FIG. 17, indicating a state immediately after the wafer is held by the carry-in side shift device.

Subsequently as shown in FIG. 20, the first holding member 1414 and the second holding member 1415 are moved by the driving part 1412 in a direction to close along the X-direction.

Figure 21:
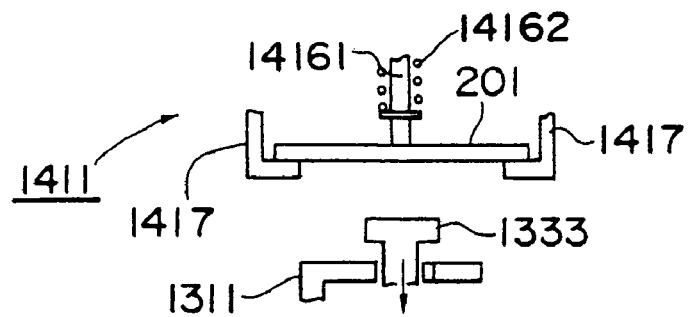
FIG. 21 is a diagram for explaining the operation in the step 2 of FIG. 17, indicating a state in which the wafer is held by the carry-in side shift device.

Then in FIG. 21, the holding bed 1311 moves down, whereby the pre-forming bumps wafer 201 is held by the holding hooks 1417 of the wafer holding member 1411. At this time, the pre-forming bumps wafer 201 is pressed to the holding hooks 1417 by the urging force of the springs 14162 attached to the part of the charge removal contact members 14161. The pressing force is of a level whereby the pre-forming bumps wafer 201 is prevented from dropping or similar trouble when transferred by the wafer holding part 1411, and is not a level that the pre-forming bumps wafer 201 is deformed.

Part of the charge at the rear face 201b is grounded when the rear face 201b of the pre-forming bumps wafer 201 and the holding hooks 1471 come into contact with each other.

In the next step 3, as shown in FIG. 2, the wafer holding part 1411 in a state while holding the pre-forming bumps wafer 201 is transferred by the moving device 1413 and positioned to above the preheat device 160. In the following step 4, preheating by the pre-formation temperature control for bonding promotion is carried out by the preheat device 160 to the pre-forming bumps wafer 201.

Figure 22:
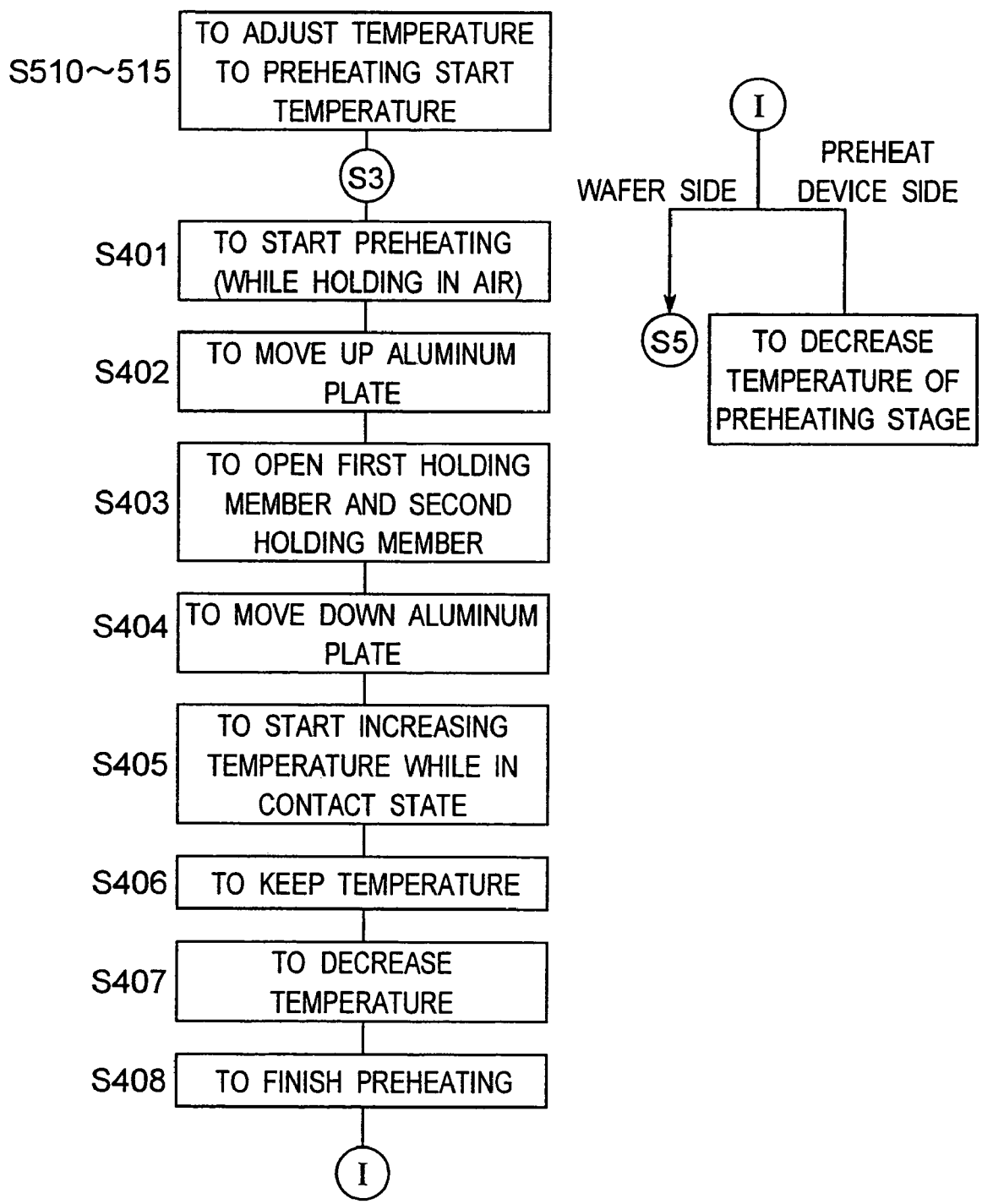
FIG. 22 is a flow chart of a preheating operation at the preheat device included in the bump forming apparatus of FIG. 1.

According to the present embodiment as indicated in FIG. 11, the panel heater frame 162 and the aluminum plate 163 of the preheat device 160 are constructed to be separable. When the aluminum plate 163 is not lower than the normal temperatures, steps 510-515 shown in FIG. 22 are carried out before the pre-forming bumps wafer 201 is transferred to above the preheat device 160, that is, before the step 3 is carried out, whereby the aluminum plate 163 is cooled. These steps 510-515 will be discussed with reference to FIG. 23 later.

Figure 24:
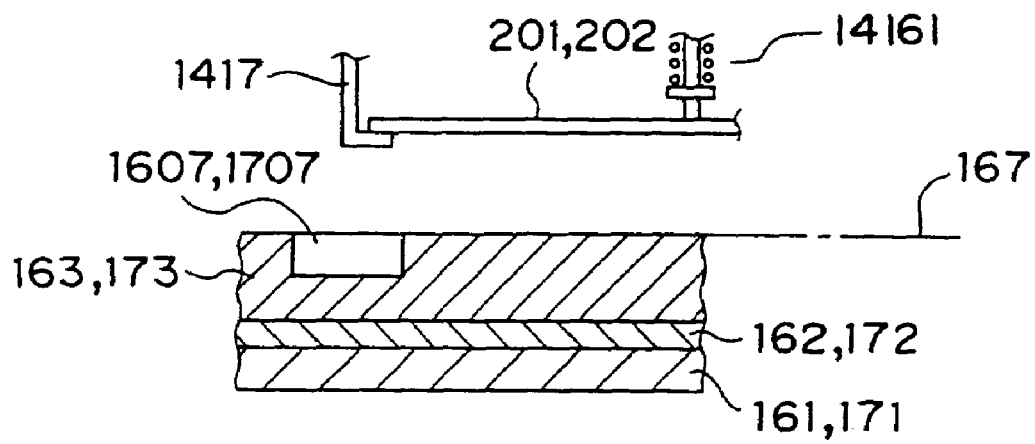
FIG. 24 is a diagram for explaining the operation in a step 3 of FIG. 17, showing a state in which a wafer before having bumps formed is transferred to above the preheat device.

At a time point when the aluminum plate 163 has been cooled to a preheating start temperature, namely, approximately 40° C. in the embodiment, the aluminum plate 163 descends to the down position 167. In the succeeding step 3, as shown in FIG. 24, the wafer holding part 1411 in a state while holding the pre-forming bumps wafer 201 is transferred and arranged above the preheat device 160 by the moving device 1413, and then the step 4 is started. A detailed operation by the pre-formation temperature control for bonding promotion in the step 4 is shown in FIG. 22 by steps 401-408.

Figure 25:
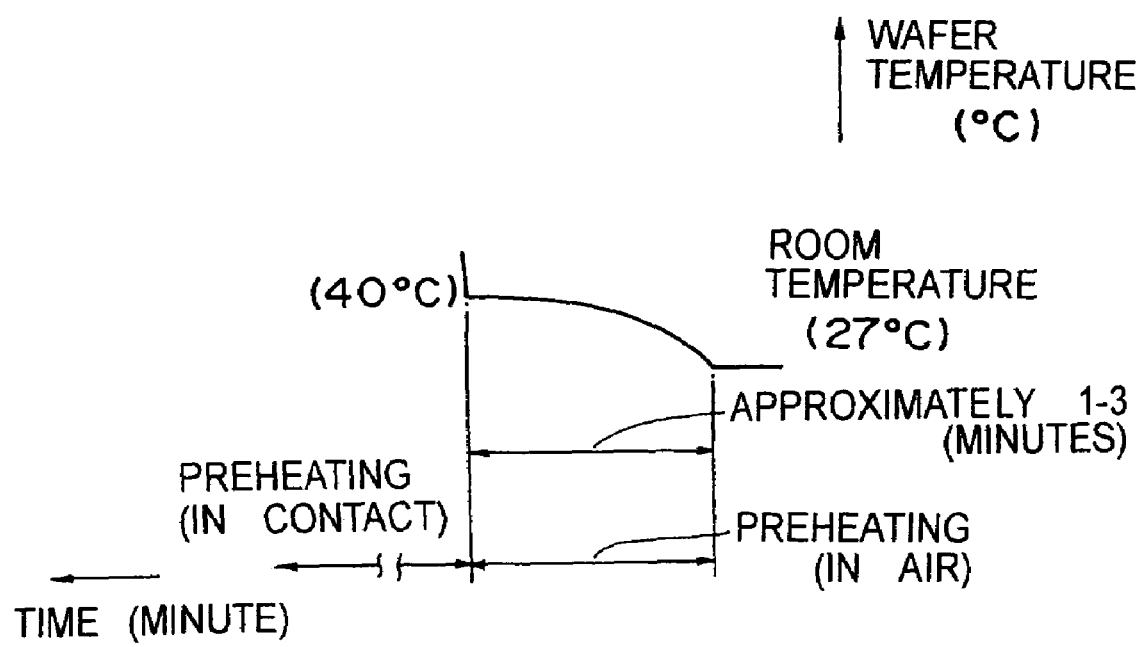
FIG. 25 is an enlarged view of a part III of FIG. 26.

In the step 401 of FIG. 22, the pre-forming bumps wafer 201 is disposed by the moving device 1413 to above the aluminum plate 163 which is approximately 40° C. as the preheating start temperature T0, so that the pre-forming bumps wafer 201 is moderately heated by radiation heat from the aluminum plate 163. Since the pre-forming bumps wafer 201 is once located in the air and then heated without being immediately brought in contact with the aluminum plate 163, a thermal stress is prevented from being applied to the pre-forming bumps wafer 201 which is at the room temperature. The pre-forming bumps wafer 201 can accordingly be prevented from being physically damaged or the formed circuits on the wafer 201 can be prevented from breaking. In the present embodiment, a heating time in the step 401 is approximately 1-3 minutes and the pre-forming bumps wafer 201 of approximately 27° C. as the room temperature is heated to nearly 40° C. in a temperature increase curve as shown in FIG. 25. The heating time, and the raised temperature of the pre-forming bumps wafer 201 are not limited to the above examples and are changed in accordance with, for example, the type, the material, the size, etc. of the pre-forming bumps wafer 201, the material and the size of each of electrode parts 15 and bumps 16, particularly, the film thickness of the electrode parts 15, the diameter of the base part 16a of the bump 16, etc. FIG. 25 is an enlarged diagram of a part III shown in FIG. 26.

Figure 27:
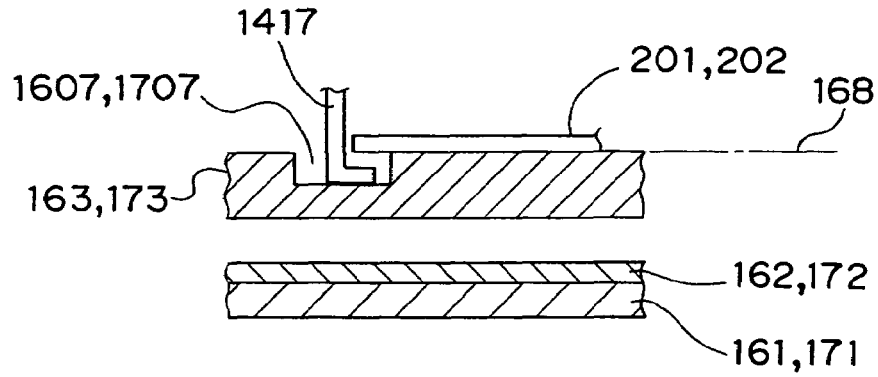
FIG. 27 is a diagram for explaining the operation in the step 3 of FIG. 17, showing a state in which the wafer before having bumps formed is placed on the aluminum plate.

In the next step 402, the aluminum plate 163 is moved up again to the up position 168. At this time, the holding hooks 1417 of the wafer holding part 1411 enter the clearance grooves 1607 formed in the aluminum plate 163 as indicated in FIG. 27. The pre-forming bumps wafer 201 held by the wafer holding part 1411 is thus laid on the aluminum plate 163. Since the carry-in side shift device 141 and the carry-out side shift device 142 are not equipped with lift mechanisms in the embodiment as described before, it is necessary to move the aluminum plate 163 up and down so as to carry the pre-forming bumps wafer 201 to the preheat device 160 and to load the pre-forming bumps wafer 201 onto the aluminum plate 163.

Figure 28:
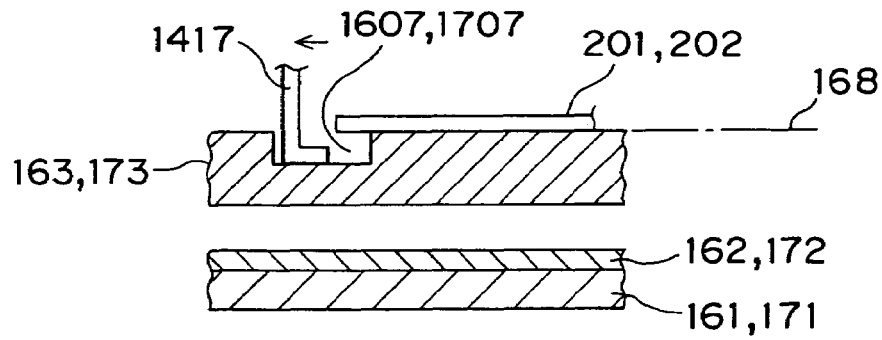
FIG. 28 is a diagram for explaining the operation in the step 3 of FIG. 17, showing a state in which the holding of the wafer before having bumps formed by the wafer holding part is freed.
Figure 29:
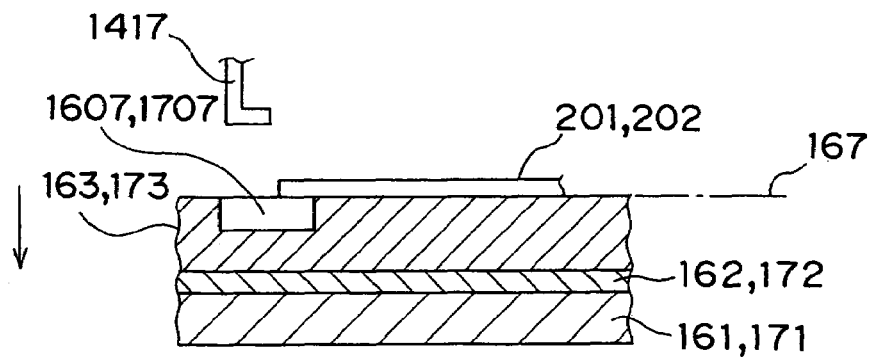
FIG. 29 is a diagram for explaining the operation in the step 3 of FIG. 17, showing a state in which the aluminum plate with the wafer before having bumps formed is moved down.

In the next step 403, as shown in FIG. 28, the first holding member 1414 and the second holding member 1415 of the carry-in side shift device 141 are opened. The aluminum plate 163 is lowered to the down position 167 in the next step 404 as shown in FIG. 29.

Figure 26:
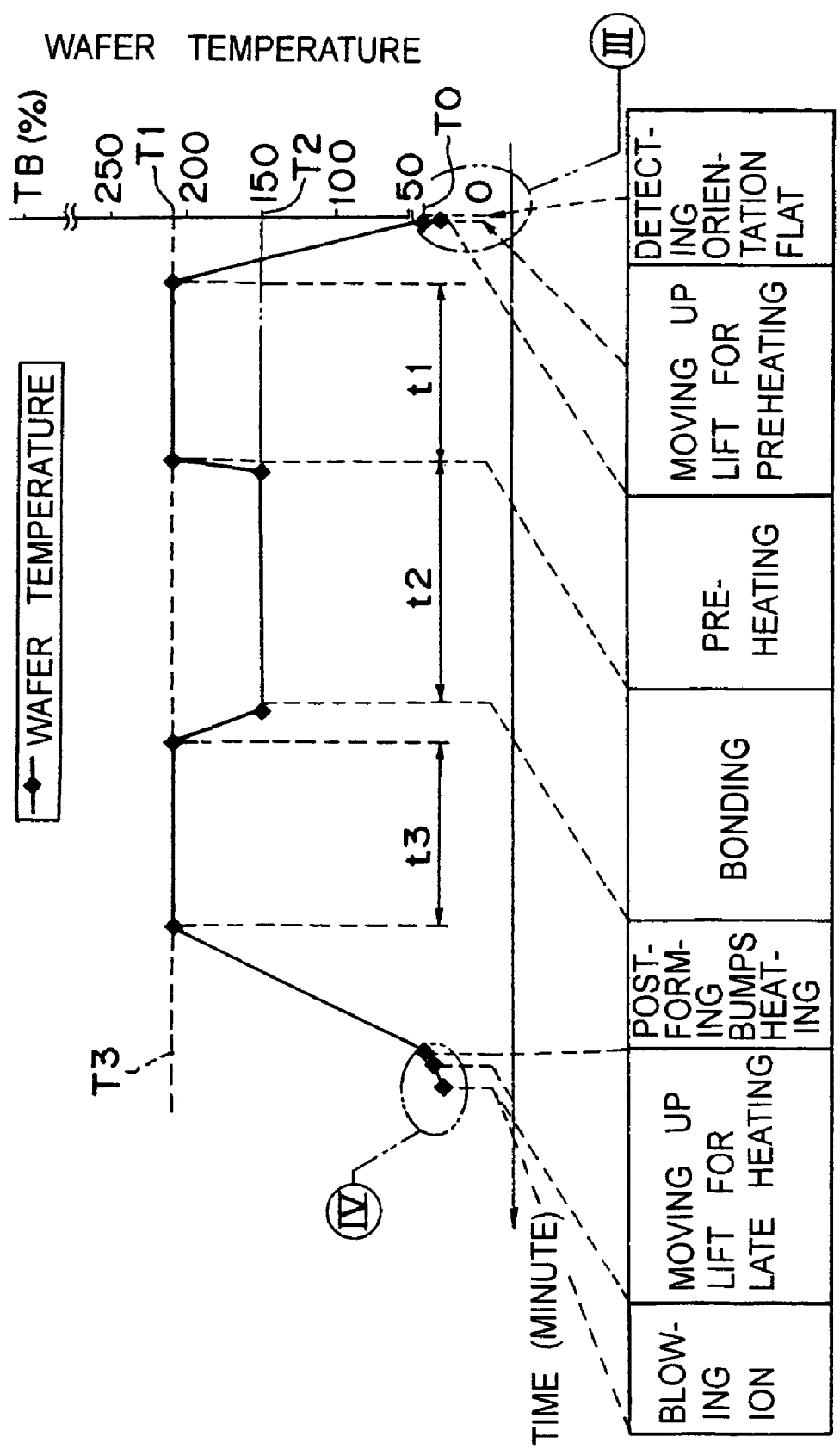
FIG. 26 is a graph of a temperature change of a semiconductor substrate at the pre-formation temperature control for bonding promotion and a post-formation temperature control for bonding promotion which are carried out in the bump forming apparatus of FIG. 1.

In the next step 405, the aluminum plate 163 is raised in temperature by applying power to the panel heater 161 as shown in FIG. 26. In a state while the aluminum plate 163 and the pre-forming bumps wafer 201 are in contact with each other, the pre-forming bumps wafer 201 is heated from a temperature near the preheating start temperature T0 to a pre-formation temperature T1 for bonding promotion. The pre-formation temperature T1 for bonding promotion is a temperature not lower than the temperature T2 for bump bonding and not higher than the damage preventive temperature TB of the pre-forming bumps wafer 201 which is an example of semiconductor substrates. The damage preventive temperature TB is a temperature at which the pre-forming bumps wafer 201 is physically damaged or the circuit is broken to damage the pre-forming bumps wafer 201. Concretely, the damage preventive temperature TB is a temperature of approximately (the temperature T2 for bump bonding)+(approximately 150° C.). The reason why the temperature T1 is not lower than the temperature T2 is that front faces of the electrode parts 15 just proceed to oxidize and metal particles of the electrode parts 15 cannot be made proper such as turned fine or the like as described earlier even when the pre-forming bumps wafer is heated at a temperature lower than the temperature T2. Consequently, the bonding state of the bumps 16 cannot be improved.

In the embodiment, the above temperature T2 for bump bonding is 150° C. and the damage preventive temperature TB is approximately 300° C. Therefore, the pre-formation temperature T1 for bonding promotion is set to about 210° C. A temperature increase gradient up to the temperature T1 is set to be 30° C./minute in the embodiment. Needless to say, the temperature T2 for bump bonding, the pre-formation temperature T1 for bonding promotion and the temperature increase gradient are not limited to the aforementioned values, and are changed based on, for example, the kind, the material, the size, etc. of the pre-forming bumps wafer 201, and the material and the size of each of the electrode parts 15 and the bumps 16, particularly, the film thickness of the electrode part 15, the diameter of the base part 16a of the bump 16, etc.

In the next step 406, when the pre-forming bumps wafer 201 nearly reaches the pre-formation temperature T1 for bonding promotion of approximately 210° C., the temperature T1 of approximately 210° C. is maintained for the pre-formation time t1 for bonding promotion. Providing this hold time promotes making the metal particles of the electrode parts 15 proper, such as turning the metal particles into a fine size. The pre-formation time t1 for bonding promotion in the embodiment is set to be about 10 minutes. The time t1 is naturally not restricted to this value and is changed on the basis of, e.g., the type, the material, the size, etc. of the pre-forming bumps wafer 201, and the material and the size of each of the electrode parts 15 and the bumps 16, especially, the film thickness of the electrode parts 15 and the diameter of the base part 16a of the bump 16, and the like.

While measuring of the temperature of the preheat device 160 is done by the temperature sensor 166 attached to the aluminum plate 163 as described above, since the aluminum plate 163 and the pre-forming bumps wafer 201 are kept in contact with each other and the pre-forming bumps wafer 201 is thin, the temperature of the aluminum plate 163 can be regarded as equal to the temperature of the pre-forming bumps wafer 201.

In the next step 407, the pre-forming bumps wafer 201 is started to be lowered in temperature at a time point when the pre-formation time t1 for bonding promotion has passed. That is, the aluminum plate 163 is cooled by controlling the applying power to the panel heater 161, thereby reducing the temperature of the pre-forming bumps wafer 201 from the pre-formation temperature T1 for bonding promotion of approximately 210° C. to the temperature T2 for bump bonding. The reason why a temperature decrease target temperature is made the temperature T2 for bump bonding is that the bumps 16 are formed at the temperature T2 for bump bonding after this. In the present embodiment, a temperature decrease gradient is set to be 30° C./minute which is equal to the temperature increase gradient. Needless to say, the temperature decrease gradient is not limited to the above value, and is changed in accordance with, e.g., the type, the material, the size, etc. of the pre-forming bumps wafer 201 and the material and the size of each of the electrode parts 15 and the bumps 16, particularly, the film thickness of the electrode parts 15, the diameter of the base part 16a of the bump 16, etc. The temperature increase gradient may be made different from the temperature decrease gradient. However, when the pre-forming bumps wafer 201 is a wafer that generates charges in accordance with temperature change, the pre-forming bumps wafer 201 is highly possibly damaged if the temperature decrease gradient is large. Therefore, the temperature decrease gradient is preferably made smaller than the temperature increase gradient in this case.

In the next step 408, the preheating operation is terminated. At this time, the contact state between the pre-forming bumps wafer 201 and the aluminum plate 163 is maintained for, e.g., 0-1 minute so as to reduce a temperature difference between the temperature of the aluminum plate 163 and the pre-forming bumps wafer 201 according to the embodiment. This arrangement enables, for instance, even the pre-forming bumps wafer 201 sensitive to the temperature change to be moved without trouble to the bonding stage 110 of the temperature T2 which is approximately 150° C.

After the preheating operation by the pre-formation temperature control for bonding promotion to the pre-forming bumps wafer 201 is conducted in the above manner, the operation in the step 5 is carried out to the pre-forming bumps wafer 201. On the other hand, the preheat device 160 is subjected to a temperature decrease operation to the preheating start temperature T0.

Figure 30:
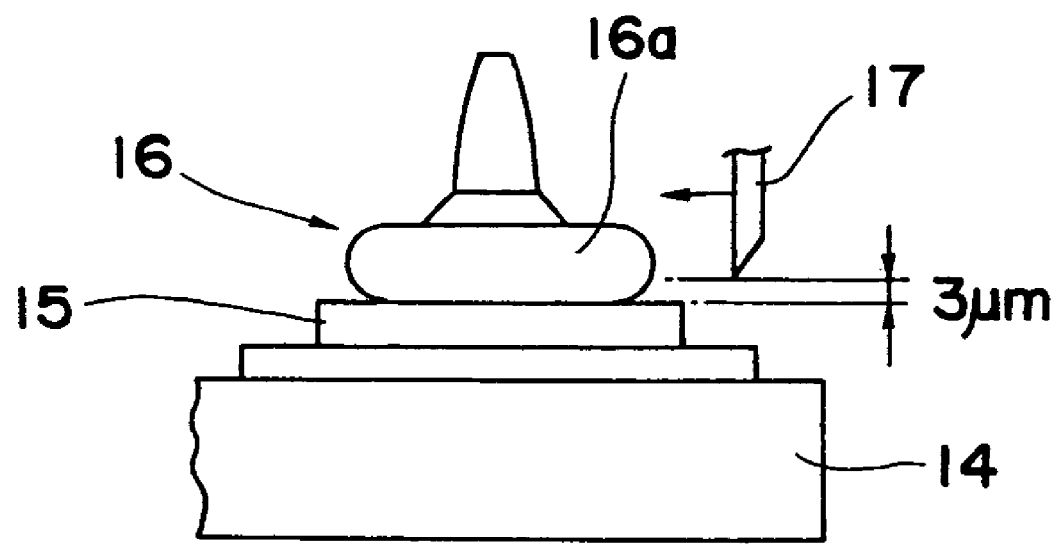
FIG. 30 is a diagram for explaining a method for measuring a shearing force of the bump formed to the electrode part.

The strength of the electrode parts 15 is improved because the coarse metal particles of the large particle size of the electrode parts 15 are changed to a state of fine particles through the preheating by the pre-formation temperature control for bonding promotion as described above. Therefore, the bonding strength between the electrode parts 15 and the bumps 16 is improved when the bumps 16 are formed. Concretely, after the gold bump 16 with a diameter of approximately 90 μm at the base part 16a is formed on each electrode part 15 of the wafer passed through the preheating, then as shown in FIG. 30, a shearing state is measured by butting a member 17 for shearing measurement against a position of the base part 16a 3 μm away from the front face of the electrode part 15. The result is that all of the gold bumps 16 formed to about 40 electrode parts 15 rupture with a rupture surface generated at the base part 16a. That is, what is called a rupture in the gold occurs. In other words, it is found that the electrode parts 15 and the bumps 16 are bonded more firmly as compared with the conventional art without rupturing at the bonding interfaces. A variation of a shearing force is about 200 mN or smaller.

In the conventional art in which the above-discussed preheating of the embodiment is not carried out, the bump formation itself is hardly achieved. The shearing force is, e.g., approximately 240-500 mN even if the bumps are formed. The shearing force is thus small and varies greatly, and therefore the wafers cannot stand practical use.

Since the pre-formation temperature T1 for bonding promotion is not lower than the temperature T2 for bump bonding, and the temperature T2 is set to 150° C. in the embodiment, the temperature T1 is set to be approximately 210° C. by adding approximately 60° C. to the temperature T2. The pre-formation temperature T1 for bonding promotion is related to the temperature T2 for bump bonding. Therefore, approximately 30-40° C. is preferably added to the temperature T2 for bump bonding, thereby setting the pre-formation temperature T1 for bonding promotion to approximately 240-250° C. when the temperature T2 is about 210° C., for example. The pre-formation temperature T1 for bonding promotion is hence preferably a value obtained by adding 30-60° C. to the temperature T2 for bump bonding. Moreover, since it is necessary to slow a temperature decrease speed in comparison with a temperature increase speed so as not to damage the pre-forming bumps wafer 201, it takes a long time to cool to the temperature T2 for bump bonding if the pre-formation temperature T1 for bonding promotion is set extraordinarily high. With the cycle time taken into account, therefore, an optimum value of the pre-formation temperature T1 for bonding promotion is obtained by adding approximately 60° C. to the temperature T2 for bump bonding.

Figure 31:
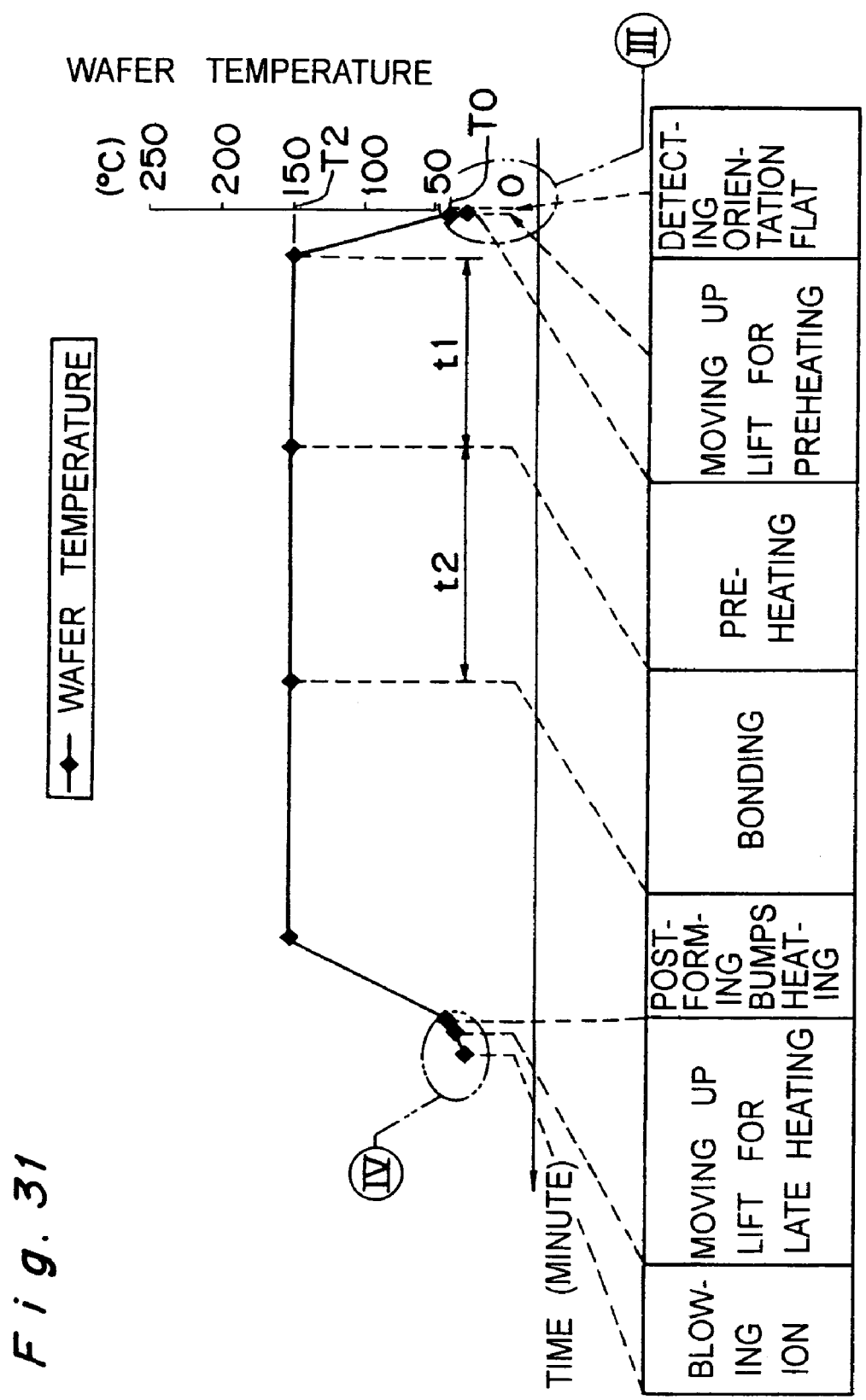
FIG. 31 is a graph of a modified example of FIG. 26 showing the temperature change of the semiconductor substrate at the pre-formation temperature control for bonding promotion and the post-formation temperature control for bonding promotion which are carried out in the bump forming apparatus of FIG. 1.

In the above embodiment, the pre-formation temperature T1 for bonding promotion is set to be the temperature exceeding the temperature T2 for bump bonding. However, if the cycle time is negligible, the pre-formation temperature T1 for bonding promotion may be made equal to the temperature T2 for bump bonding as shown in FIG. 31.

While the pre-formation time t1 for bonding promotion is set to 10 minutes in the embodiment, the time is necessary to change in accordance with the pre-formation temperature T1 for bonding promotion. So, when the temperature T1 is in a range with the above 30-60° C. added to the temperature T2 for bump bonding, the time t1 is preferably made approximately 10-30 minutes. When the pre-formation temperature T1 for bonding promotion is set to the temperature obtained by adding a temperature exceeding 60° C. to the temperature T2 for bump bonding within not higher than the damage preventive temperature TB, the pre-formation time t1 for bonding promotion is set to be about one second to about 10 minutes. For instance, when the pre-formation temperature T1 for bonding promotion is set to be nearly the damage preventive temperature, the pre-formation time t1 for bonding promotion is set to be approximately one second, because metal crystals of the electrode parts 15 react excessively if the time is set to exceed about one second, with hindering countermeasures in the event of troubles.

Depending on the type of the pre-forming bumps wafer 201, charges may be generated to the pre-forming bumps wafer 201 through the temperature change of the pre-forming bumps wafer 201 by the preheating. However, the charges can be grounded and removed via the aluminum plate 163 because the pre-forming bumps wafer 201 is placed on the aluminum plate 163.

The step 5 is executed next to the above preheating operation. In the step 5, the pre-forming bumps wafer 201 is moved from the preheat device 160 to the bonding stage 110 as indicated in FIG. 23.

Figure 23:
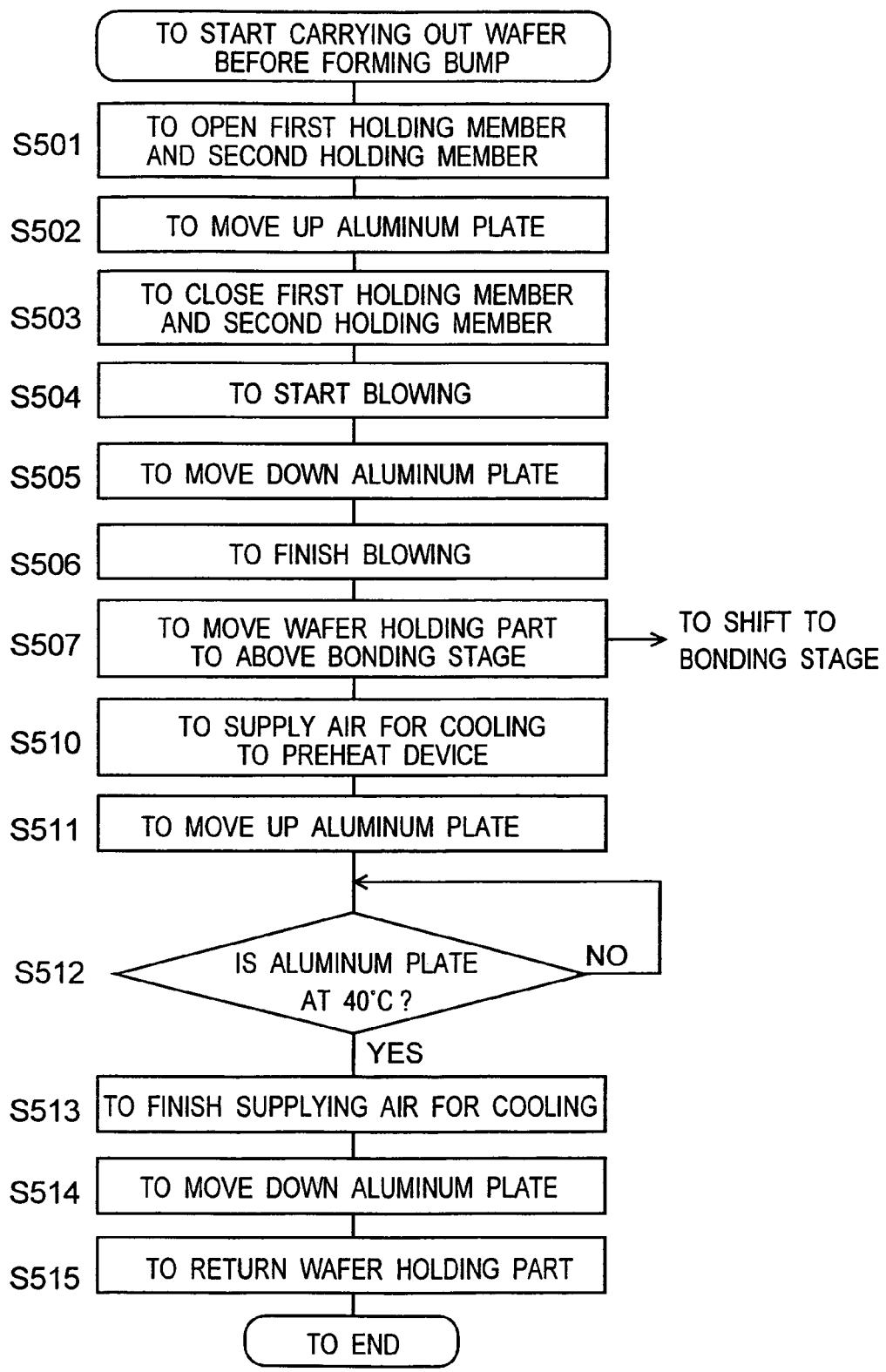
FIG. 23 is a flow chart for explaining a shifting operation from the preheat device to the bump bonding apparatus in a step 5 of FIG. 17, showing the operation when the panel heater frame and the aluminum plate are separated.

In a step 501 in FIG. 23, the first holding member 1414 and the second holding member 1415 are moved in the open direction by the operation of the driving part 1412 of the carry-in side shift device 141. In a next step 502, the aluminum plate 163 of the preheat device 160 is moved from the down position 167 to the up position 168. At this time, each of the holding hooks 1417 attached to the first holding member 1414 and the second holding member 1415 enters each clearance groove 1607 of the aluminum plate 163. The first holding member 1414 and the second holding member 1415 are closed in a next step 503. The blow/suction device 1611 is activated in a next step 504 to jet the air from the air holes 1608 of the aluminum plate 163, thereby separating the aluminum plate 163 and the pre-forming bumps wafer 201 from each other. A temperature of the air to be jetted is such that can prevent a temperature decrease of the preheated pre-forming bumps wafer 201 as much as possible, for example, approximately 160° C. During the blow operation, the aluminum plate 163 is lowered in a step 505 to let the pre-forming bumps wafer 201 be held by the wafer holding part 1411 having the first holding member 1414 and the second holding member 1415. In a next step 506, the blow/suction device 1611 is stopped to drive to finish the blowing. The wafer holding part 1411 holding the temperature-raised pre-forming bumps wafer 201 is moved to above the bonding stage 110 in a next step 507. Thereafter, the step moves to an operation of shifting the pre-forming bumps wafer to the bonding stage 110 to be described later.

On the other hand, it is necessary to decrease the temperature of the aluminum plate 163 of the preheat device 160 raised to approximately 150° C. to the preheating start temperature T0 before a next pre-forming bumps wafer 201 is placed thereon. In a step 510 in FIG. 23, the cooling air feeder 1613 is activated to supply the air for cooling to the passage 1612 for refrigerant in the aluminum plate 163. In steps 511 and 512, further, the air cylinder 1601 of the preheat device 160 is driven to move up the aluminum plate 163 from the down position 167 to the up position 168, so that the panel heater frame 162 and the aluminum plate 163 are separated from each other thereby cooling the aluminum plate 163 to approximately 40° C. The cooling temperature of the aluminum plate 163 is not limited to the above approximately 40° C. although it is so set in the embodiment.

The aluminum plate 163 can be efficiently cooled by separating the panel heater frame 162 and the aluminum plate 163 from each other. After the aluminum plate 163 is cooled to the temperature of approximately 40° C., the cooling air feeder 1613 is stopped to operate in a step 513 to finish supplying the air for cooling. The aluminum plate 163 is lowered in a step 514 and the wafer holding part 1411 of the carry-in side shift device 141 is returned to above the transfer device 130 in a step 515.

A shifting operation for the pre-forming bumps wafer 201 from the preheat device 160 to the bonding stage 110 will be discussed now. Since a deflection may be generated depending on the material of the pre-forming bumps wafer 201 due to a difference of temperatures between the pre-forming bumps wafer 201 and the bonding stage 110, hot air is blown in some cases to the pre-forming bumps wafer 201 placed on the bonding stage 110 as an operation to correct the deflection. The following description will be based on the case where the operation of blowing the hot air is executed.

Figure 32:
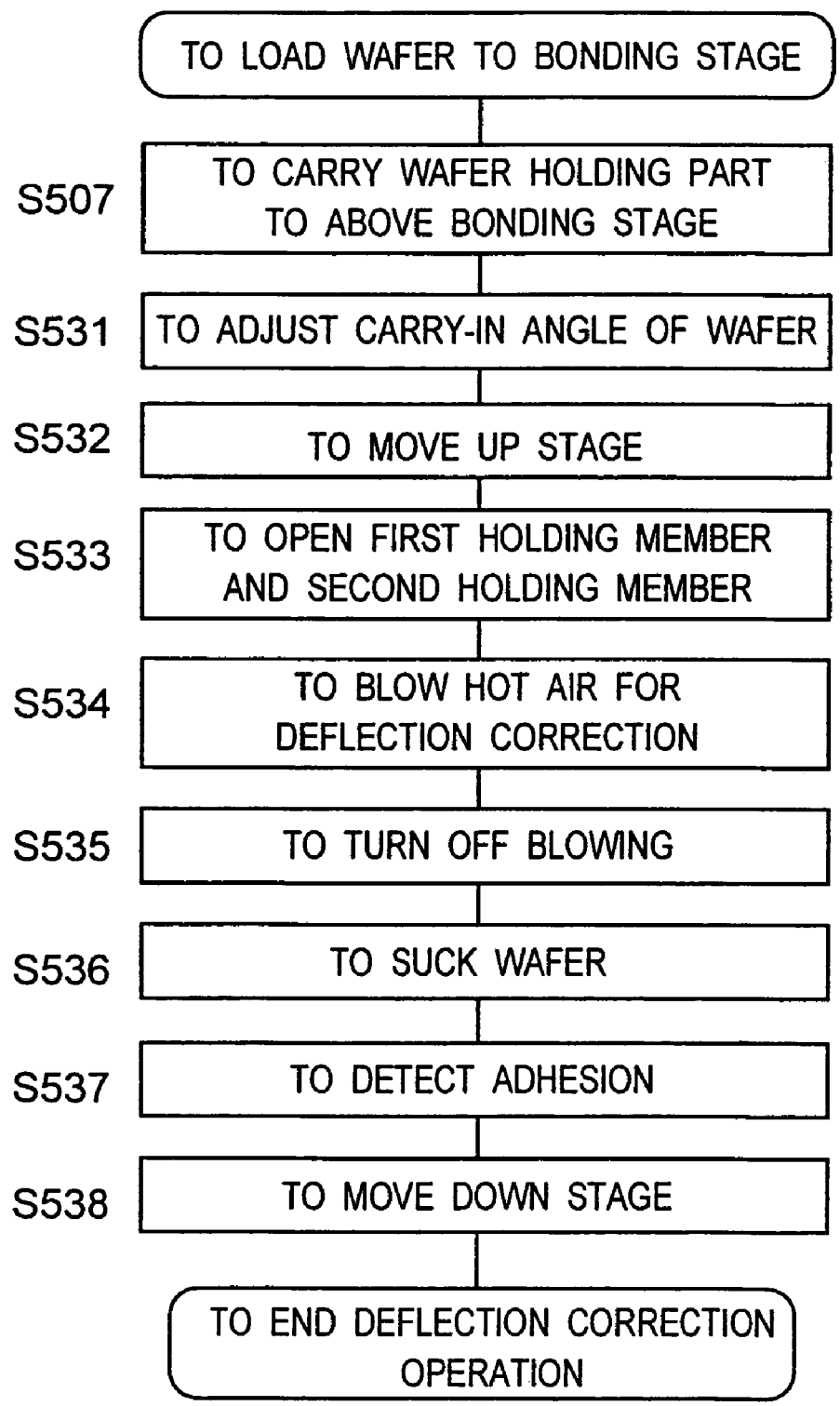
FIG. 32 is a flow chart for explaining the shifting operation for the wafer before having bumps formed to the bump bonding stage in a step 5 of FIG. 17.
Figure 33:
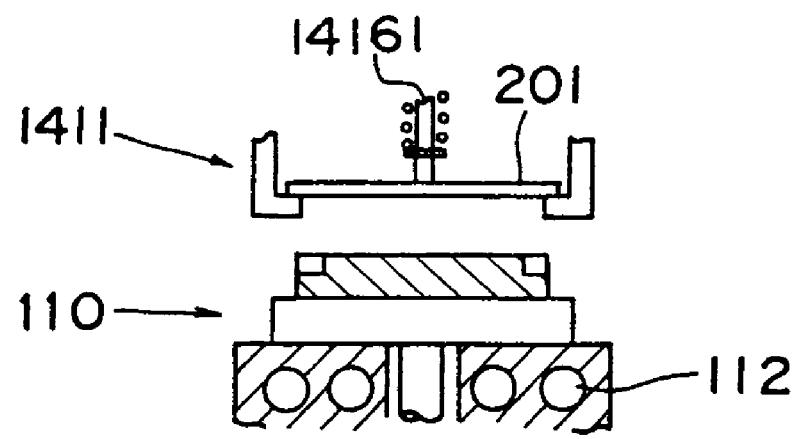
FIG. 33 is a diagram for explaining the operation in the step 5 of FIG. 17, showing a state in which the wafer before having bumps formed is placed above the bonding stage.
Figure 34:
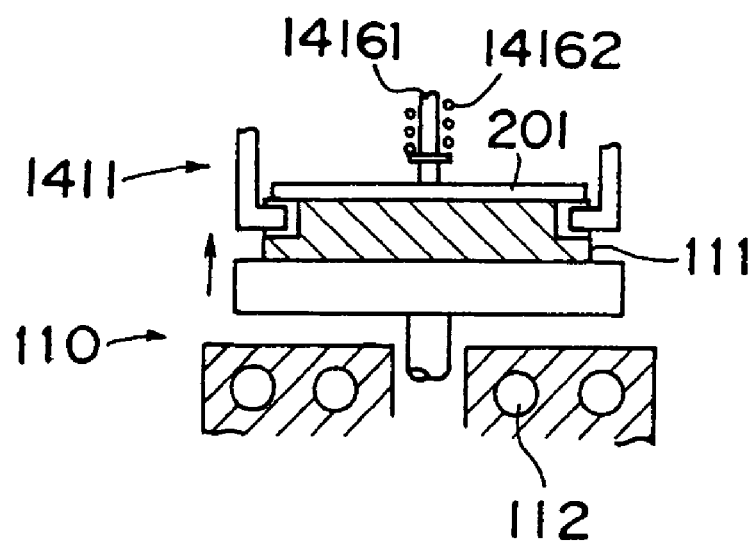
FIG. 34 is a diagram for explaining the operation in the step 5 of FIG. 17, showing a state immediately before the wafer is held by the bonding stage.

In a step 507 indicated in FIG. 32, as shown in FIG. 33, the pre-forming bumps wafer 201 held by the wafer holding part 1411 of the carry-in side shift device 141 is carried to above the bonding stage 110. In a next step 531, the bonding stage 110 is rotated to adjust a carry-in angle of the pre-forming bumps wafer 201 whereby the pre-forming bumps wafer is to be carried to the bonding stage 110. In a next step 532, the wafer platform 111 moves up in the thickness direction of the pre-forming bumps wafer 201 to come in contact with the rear face 201b of the pre-forming bumps wafer 201 and presses the wafer 201 up slightly. When the wafer platform 111 moves up, each holding hook 1417 of the wafer holding part 1411 enters the clearance groove 116 formed in the wafer platform 111.

At the above pressing, the contact members 14162 for charge removal which are in contact with the front face 201a of the pre-forming bumps wafer 201 are pressed up against the urging force of the springs 14162 while maintaining the contact state to the front face 201a.

Figure 35:
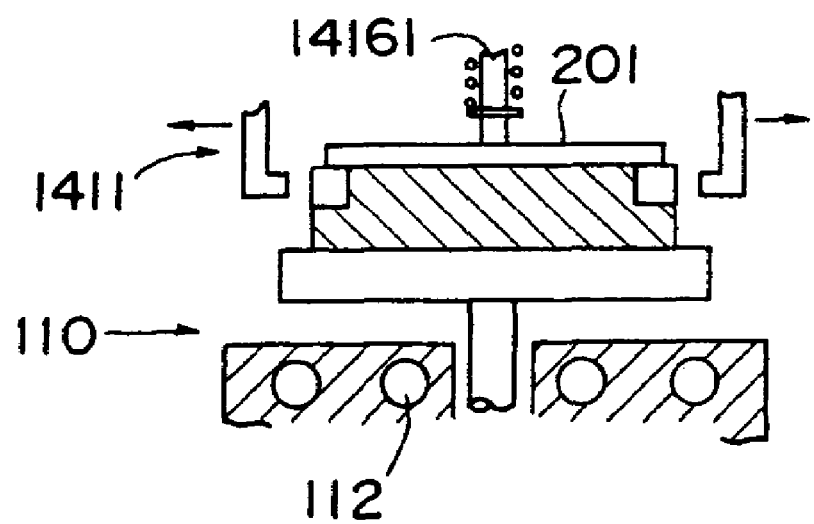
FIG. 35 is a diagram for explaining the operation in the step 5 of FIG. 17, showing a state in which the wafer is held by the bonding stage while the holding the wafer by the carry-in side shift device is freed.

As shown in FIG. 35, in a next step 533, the first holding member 1414 and the second holding member 1415 are moved in the open direction by the operation of the driving part 1412 of the carry-in side shift device 141, whereby the holding to the pre-forming bumps wafer 201 by the wafer holding part 1411 is freed.

In this state, in a next step 534, the blower 115 is activated to blow the hot air for deflection correction of approximately 160° C. to the pre-forming bumps wafer 201 through air holes 113 opened in the wafer platform 111. By the blowing, the pre-forming bumps wafer 201 is floated by approximately 0.5 mm from the wafer platform 111. However, the floated pre-forming bumps wafer 201 is prevented from dropping from on the wafer platform 111 because the holding hooks 1417 of the first holding member 1414 and the second holding member 1415 are present at the periphery of the pre-forming bumps wafer 201.

Figure 36:
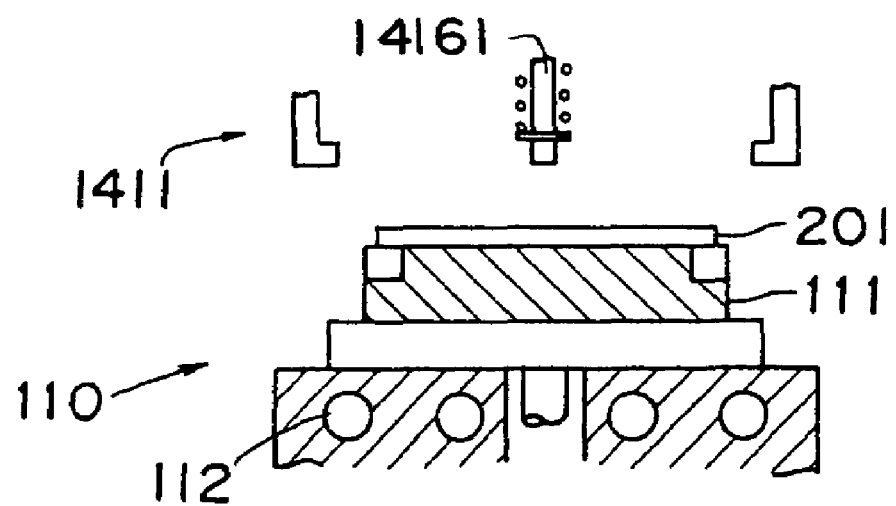
FIG. 36 is a diagram for explaining the operation in the step 5 of FIG. 17, showing a state in which the wafer is held by the bonding stage.

After a hot air blow time has passed, in a step 535, the operation of the blower 115 is stopped to terminate the blowing of the hot air for deflection correction. In a step 536, the suction device 114 is activated to start sucking through air holes 113, thereby adhering the pre-forming bumps wafer 201 to the wafer platform 111. The adhesion is detected in a step 537 and, the wafer platform 111 still in the state with holding the pre-forming bumps wafer 201 is lowered to an original position as shown in FIG. 36 in a step 538.

The deflection correction operation is completed by the above operation. Thereafter, the wafer holding part 1411 of the carry-in side shift device 141 moves to above the transfer device 130.

After the above-described operation for deflection correction, bumps 16 are formed by the bump forming head 120 to electrode parts 15 of the circuits on the pre-forming bumps wafer 201 placed on the bonding stage 110. It is set in the embodiment so that the temperature of the pre-forming bumps wafer 201 during the bump formation becomes 150° C. as mentioned before.

Figure 37:
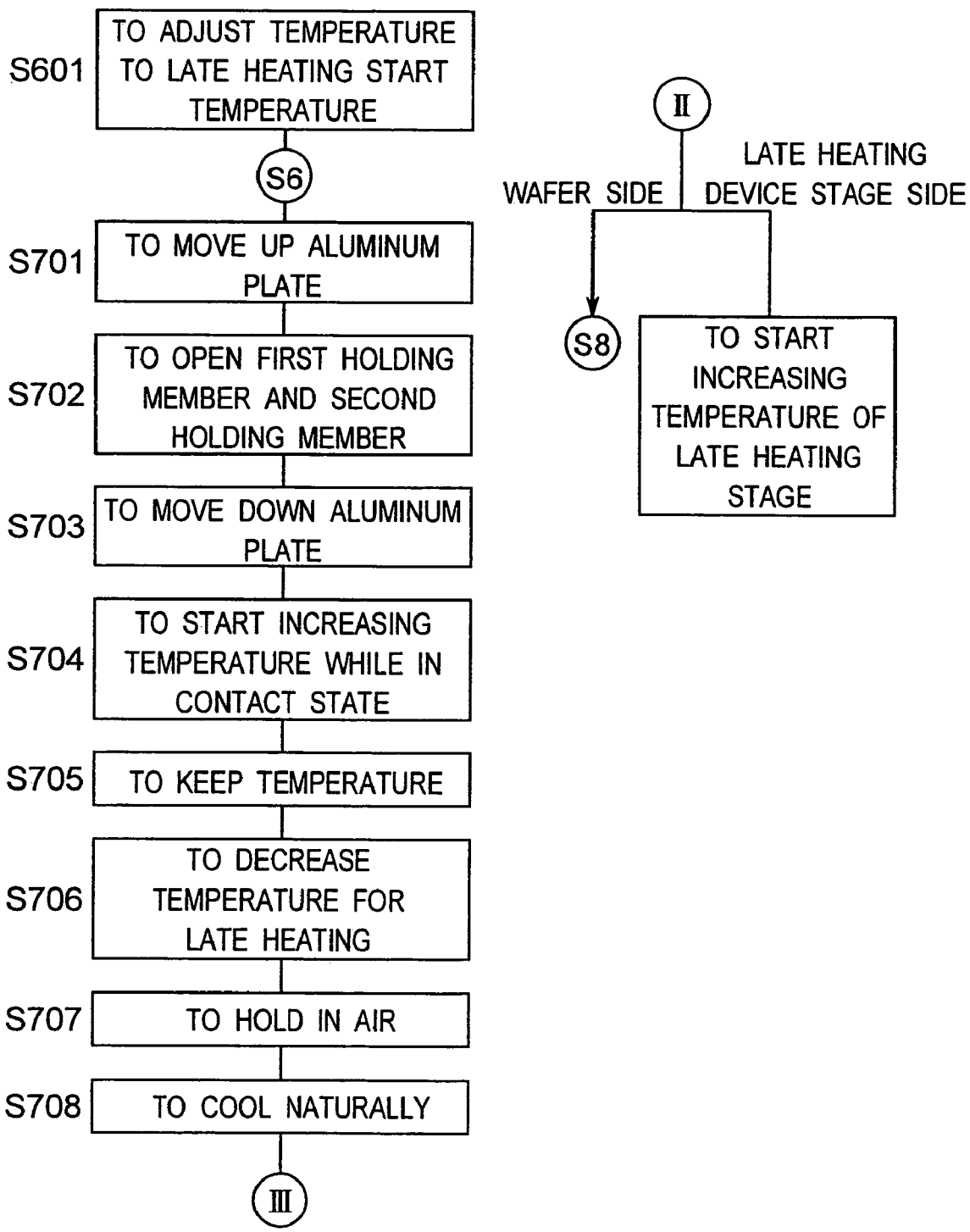
FIG. 37 is a flow chart of a post-forming bumps heating operation at the post-forming bumps heating device included in the bump forming apparatus of FIG. 1.

After the bumps are formed, in the step 6, the wafer with formed bumps 202 is held by the first holding member 1424 and the second holding member 1425 of the wafer holding part 1421 of the carry-out side shift device 142, and the wafer holding part 1421 is moved in the X-direction by driving the moving device 1423 of the carry-out side shift device 142. The wafer with formed bumps 202 is placed above the post-forming bumps heating device 170 as shown in FIG. 2 and then is laid on the post-forming bumps heating device 170 in the step 7. Later heating including the earlier-described post-formation temperature control for bonding promotion is carried out. These operations will be described below more in detail with reference to FIG. 37.

In a step 601, the aluminum plate 173 of the post-forming bumps heating device 170 is heated to above 150° C. as the temperature T2 for bump bonding. The process then moves to the step 6, where the wafer with formed bumps 202 held by the wafer holding part 1421 is carried to above the post-forming bumps heating device 170.

In a step 701 constituting the step 7, the heated aluminum plate 173 is raised from the down position 167 to the up position 168. By the upward movement, the wafer with formed bumps 202 is brought and disposed in contact with the aluminum plate 173. The holding hooks 1417 of the first holding member 1424 and the second holding member 1425 of the wafer holding part 1421 of the carry-out side shift device 142 enter the clearance grooves 1707 formed in the aluminum plate 173. In a next step 702, the first holding member 1424 and the second holding member 1425 of the wafer holding part 1421 of the carry-out side shift device 142 are opened thereby releasing the holding of the wafer with formed bumps 202. The aluminum plate 173 where the wafer with formed bumps 202 is placed is lowered from the up position 168 to the down position 167 in a next step 703.

In a next step 704, as shown in FIG. 26, the aluminum plate 173 is raised in temperature by applying power to the panel heater 161, so that the wafer with formed bumps 202 is heated from the temperature T2 for bump forming to the post-formation temperature T3 for bonding promotion in a state in which the post water 202 is kept in contact with the aluminum plate 173. The post-formation temperature T3 for bonding promotion is not lower than the temperature T2 for bump forming and not higher than the damage preventive temperature TB of the wafer with formed bumps 202 which is an example of a semiconductor wafer. The damage preventive temperature TB is, as described before, the temperature whereat the wafer with formed bumps 202 is physically damaged or the circuit is broken to cause trouble with the wafer with formed bumps 202 (more specifically, the temperature T2 for bump bonding)+(approximately 150° C.).

In the embodiment, the post-formation temperature T3 for bonding promotion is set to be approximately 210° C. equal to the above-described pre-formation temperature T1 for bonding promotion. Needless to say, the temperature T3 may be made different. A temperature increase gradient from the temperature T2 for bump bonding to the post-formation temperature T3 for bonding promotion is set to be 30° C./minute in the embodiment similarly to the case of the preheating operation. The temperature increase gradient is naturally not limited to the above value and is changed in accordance with, for instance, the type, the material, the size and the like of the wafer with formed bumps 202, the material and the size of each of the electrode parts 15 and the bumps 16, and particularly, the film thickness of the electrode parts 15, the diameter of the base part 16a of the bump 16, etc.

In a next step 705, when the wafer with formed bumps 202 nearly reaches the post-formation temperature T3 for bonding promotion of approximately 210° C., this temperature T3 of approximately 210° C. is maintained for the post-formation time t3 for bonding promotion. The diffusion between metals of bumps 16 formed on electrode parts 15 and the electrode parts 15 is more efficiently carried out by providing this hold time, enabling the bonding state of the bumps 16 and the electrode parts 15 to be improved more. The post-formation time t3 for bonding promotion is made approximately 10 minutes in the embodiment.

Figure 38:
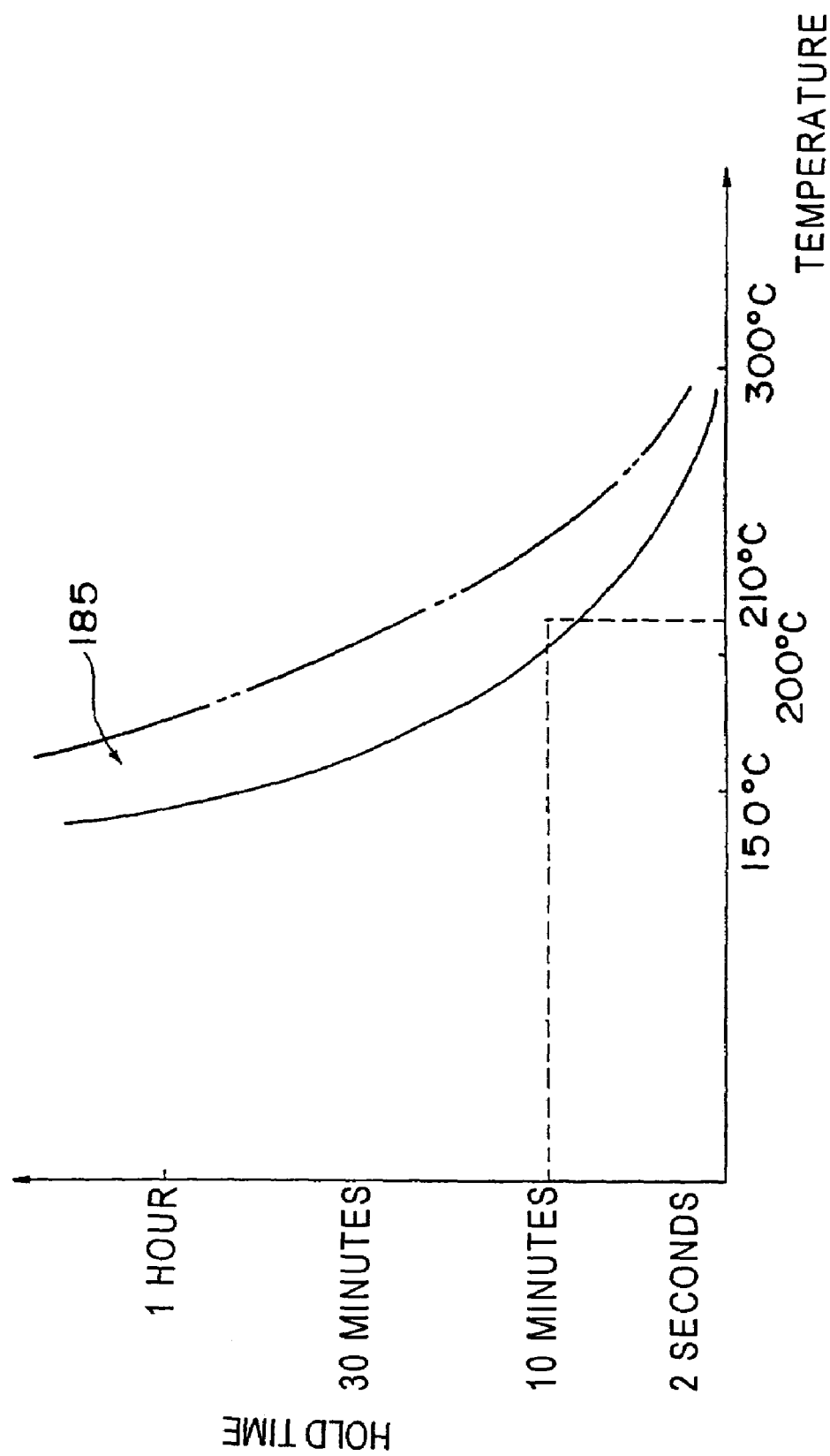
FIG. 38 is a diagram explanatory of a correlation between the post-formation temperature for bonding promotion and a time of holding the temperature in the post-forming bumps heating operation.

While the post-formation temperature T3 for bonding promotion is maintained for 10 minutes as described above according to the embodiment, the temperature T3 and the hold time of the temperature T3 has a correlation as shown in FIG. 38, with a region 185 where the bonding strength between the bumps 16 and the electrode parts 15 can be improved. In other words, since the late heating operation is done to promote the metal diffusion between the bumps 16 and the electrode parts 15, and in the case where the post-formation temperature T3 for bonding promotion is set to be slightly higher than the temperature T2 for bump bonding, the hold time is required to be relatively long. On the contrary, in the case where the post-formation temperature T3 for bonding promotion is set to be considerably higher than the temperature T2 for bump bonding, the hold time can be relatively short. If the post-formation temperature T3 for bonding promotion is set extraordinarily high, the reaction between the bumps 16 and the electrode parts 15 proceeds excessively, conversely weakening the bonding strength between the bumps 16 and the electrode parts 15. Eventually, there is present the region 185 where the bonding strength between the bumps 16 and the electrode parts 15 can be improved.

FIG. 38 is a diagram indicative of the concept of the above correlation and the region 185.

Needless to say, the above post-formation time t3 for bonding promotion is not limited to the aforementioned value and is changed on the basis of, e.g., the type, the material, the size, etc. of the wafer with formed bumps 202, and the material, the size, etc. of each of the electrode parts 15 and the bumps 16. In particular, the thickness 15a of the electrode part 15 and the size of the base part 16a of the bump 16 are essential factors for setting the post-formation temperature T3 for bonding promotion and the post-formation time t3 for bonding promotion.

In the case of the semiconductor substrate having the Si base where, for example, minute bumps are to be formed, the temperature T2 for bump bonding is set to be approximately 270° C. and the post-formation temperature T3 for bonding promotion is set to be approximately 300° C. in one example.

In a next step 706, the temperature of the wafer with formed bumps 202 is started to be decreased after the post-formation time t3 for bonding promotion has passed. That is, the aluminum plate 173 is cooled by controlling the applying power to the panel heater 171 to lower the temperature of the wafer with formed bumps 202 from the post-formation temperature T3 for bonding promotion of the above-described approximately 210° C. to approximately 40° C. A temperature decrease gradient is set to be 30° C./minute, which is the same as the above temperature increase gradient in the present embodiment. The temperature decrease gradient is naturally not limited to this value and is changed depending on the type, the material, the size, etc. of the wafer with formed bumps 202, and the material, the size, etc. of each of the electrode parts 15 and the bumps 16, and particularly, the film thickness of the electrode part 15, the diameter of the base part 16a of the bump 16, etc. The temperature increase gradient and the temperature decrease gradient may be made different from each other.

In a next step 707, the wafer holding part 1421 of the carry-out side shift device 142 is positioned above the post-forming bumps heating device 170, and then the aluminum plate 173 of the post-forming bumps heating device 170 is moved from the down position 167 to the up position 168 to hold the wafer with formed bumps 202 by the first holding member 1424 and the second holding member 1425 of the wafer holding part 1421. During the holding operation, the blow/suction device 1711 is operated to jet the air for blowing from the air holes 1708 of the aluminum plate 173, thereby floating the wafer with formed bumps 202 from the aluminum plate 173.

Figure 39:
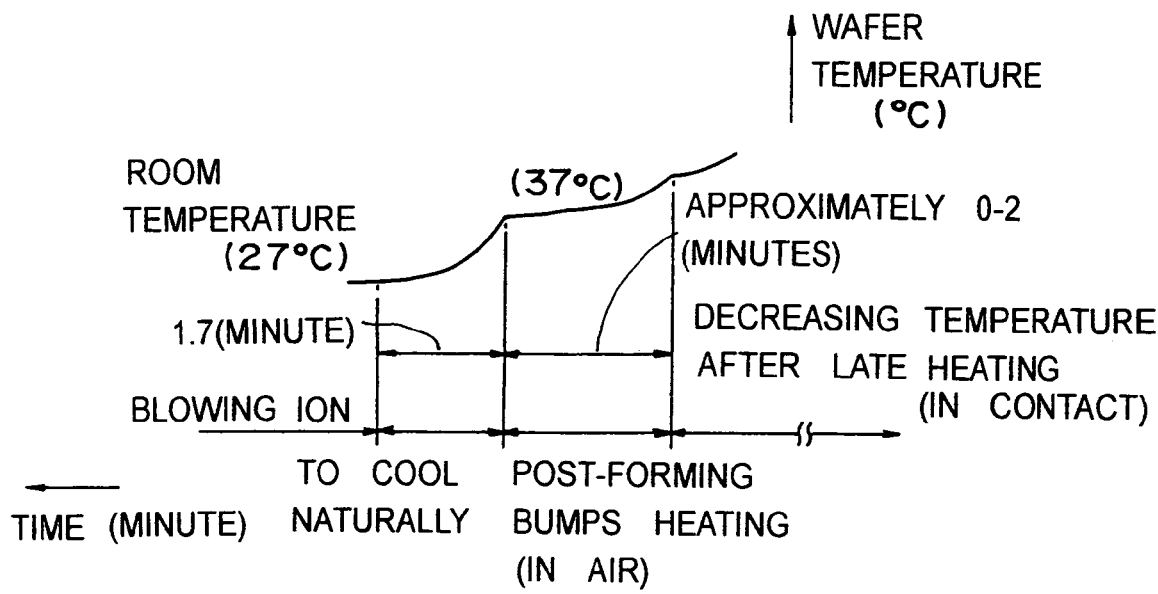
FIG. 39 is an enlarged view of a part IV of FIG. 26.

The aluminum plate 173 is lowered from the up position 168 to the down position 167 after the holding. In the meantime, the wafer holding part 1421 of the carry-out side shift device 142 which is holding the wafer with formed bumps 202 is kept above the post-forming bumps heating device 170 as it is. In consequence, the wafer with formed bumps 202 is gradually cooled above the post-forming bumps heating device 170, namely, in the air as indicated in FIG. 39. FIG. 39 is an enlarged view of a part designated by IV in the graph of FIG. 26. The reason why the wafer with formed bumps 202 is cooled above the post-forming bumps heating device 170 is to prevent damage which could be done to the wafer with formed bumps 202 if the wafer with formed bumps was immediately lowered from the above approximately 40° C. to approximately 27° C. as the room temperature. A cooling time in the air in the embodiment is set to be approximately 2 minutes. The wafer with formed bumps 202 is cooled to approximately 37° C. by cooling in the air. The cooling time is changeable based on the type, the material, etc. of the wafer with formed bumps 202.

In the next step 708, when the cooling time in the air has passed, the wafer holding part 1421 of the carry-out side shift device 142 is moved in the X-direction while holding the wafer with formed bumps 202, and left from above the post-forming bumps heating device 170 to naturally cool the wafer with formed bumps 202 to the above room temperature.

After the step 708 is finished, the wafer with formed bumps 202 is subjected to the operation of the step 8. On the other hand, the panel heater 171 of the post-forming bumps heating device 170 is started to prepare for receiving the next wafer with formed bumps 202 by power being applied and increasing the temperature of the aluminum plate 173 to the temperature T2 for bump bonding.

Although the post-formation temperature T3 for bonding promotion is set to exceed the temperature T2 for bump bonding in the above embodiment, the temperature T3 can be made equal to the temperature T2 as shown in FIG. 31.

The late heating operation enables improving the bonding strength of the bumps 16 and the electrode parts 15 as described above. Furthermore, a synergic effect of both operations is obtained when the preheating operation and the late heating operation are carried out. For example, when the gold bumps 16 having the base diameter of approximately 90 μm are formed to the aluminum electrode parts 15 of the thickness of approximately 2000 Å, the shearing strength per one bump when only the preheating operation is carried out is approximately 680 mN on the average and varies by approximately 200 mN. In contrast, when the late heating operation is further carried out as well, the shearing strength per one bump is improved to approximately 800 mN on the average and the variation can be reduced to approximately 140 mN.

Particularly in the case where the bumps 16 are to be formed to each of the electrode parts 15 on the wafer, the number of bumps to be formed becomes large. As a result, since bumps 16 bonded in an early stage are maintained at the temperature T2 for bump bonding until the remaining bumps 16 are finished being bonded, an action similar to the late heating is exerted upon the bumps 16 bonded in the early stage. Under the circumstances, the post-formation temperature T3 for bonding promotion and the post-formation time t3 for bonding promotion may be determined specially on the basis of the number of circuit parts formed on the wafer, virtually, on the number of bumps to be formed in the post-formation control for bonding promotion in the late heating operation.

When both the preheating and the late heating are to be carried out, the pre-formation control for bonding promotion in the preheating and the post-formation control for bonding promotion in the late heating may be controlled by linking both controls to each other. The linked control can be carried out by the controller 180. As an example of the linked control, if the pre-formation time t1 for bonding promotion in the pre-formation control for bonding promotion is set long, the post-formation time t3 for bonding promotion in the post-formation control for bonding promotion is made shorter than the time t1. In contrast, if the time t1 is set short, the time t3 is set longer than the time t1. The pre-formation control for bonding promotion and the post-formation control for bonding promotion can thus be controlled to mutually compensate for each other to improve the bonding state of the electrode parts 15 and the bumps 16.

After the above-described late heating finishes, the step moves to the step 8, where the following operation is carried out. The wafer holding part 1421 of the carry-out side shift device 142 which is holding the wafer with formed bumps 202 is moved by activating the moving device 1423 in the X-direction to above the carry-out device 132. A state after the movement is shown in FIG. 6.

Figure 40:
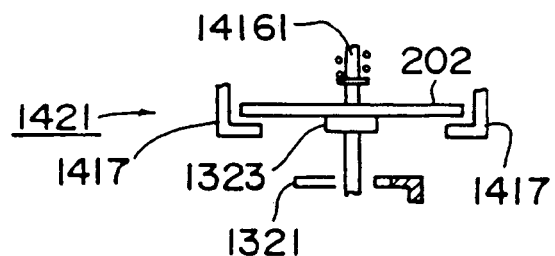
FIG. 40 is a diagram for explaining the operation in a step 8 of FIG. 17, showing a state in which a holding part of the carry-out device is kept in contact with the wafer having bumps formed.

The driving part 1324 of the carry-out device 132 operates after the above movement, and the holding part 1323 comes in contact with the rear face 202b of the wafer with formed bumps 202 and also moves up by approximately 1 mm to raise the wafer with formed bumps 202 from the holding hooks 1417 of the wafer holding part 1421 as shown in FIG. 40. After the upward movement, the holding part 1323 holds the wafer with formed bumps 202 by suction.

Figure 41:
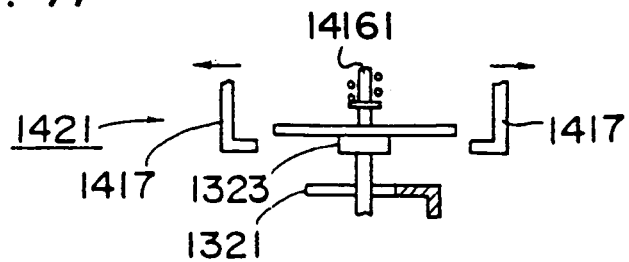
FIG. 41 is a diagram for explaining the operation in the step 8 of FIG. 17, showing a state immediately after the holding of the wafer by the carry-out side shift device is freed.

As shown in FIG. 41, the first holding member 1424 and the second holding member 1425 of the wafer holding part 1421 are opened by the driving part 1422 after the holding part 1323 holds the wafer with formed bumps 202, thereby releasing the holding of the wafer with formed bumps 202.

Figure 42:
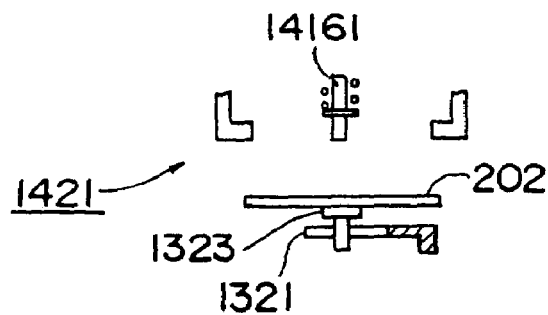
FIG. 42 is a diagram for explaining the operation in the step 8 of FIG. 17, showing a state immediately before the bump-formed wafer after having bumps formed and held to the holding part of the carry-out device is placed to a holding stage.
Figure 43:
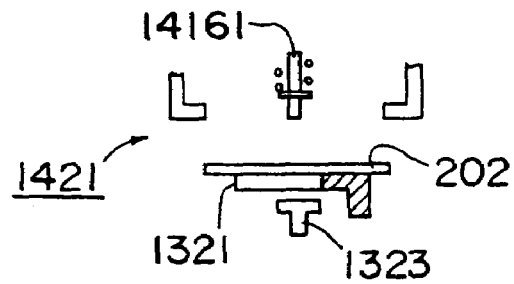
FIG. 43 is a diagram for explaining the operation in the step 8 of FIG. 17, showing a state in which the bump-formed wafer is placed to the holding stage.

After the holding is released, as shown in FIGS. 42 and 43, the holding part 1323 descends to place the wafer with formed bumps 202 onto the holding bed 1321. After the placement, the holding bed 1321 holds the wafer with formed bumps 202 by suction according to the embodiment.

In the next step 9, the holding bed 1321 holding the wafer with formed bumps 202 moves in the X-direction by the operation of the moving device 1322 of the carry-out device to transfer the wafer with formed bumps 202 towards the second storage container 206.

Figure 44:
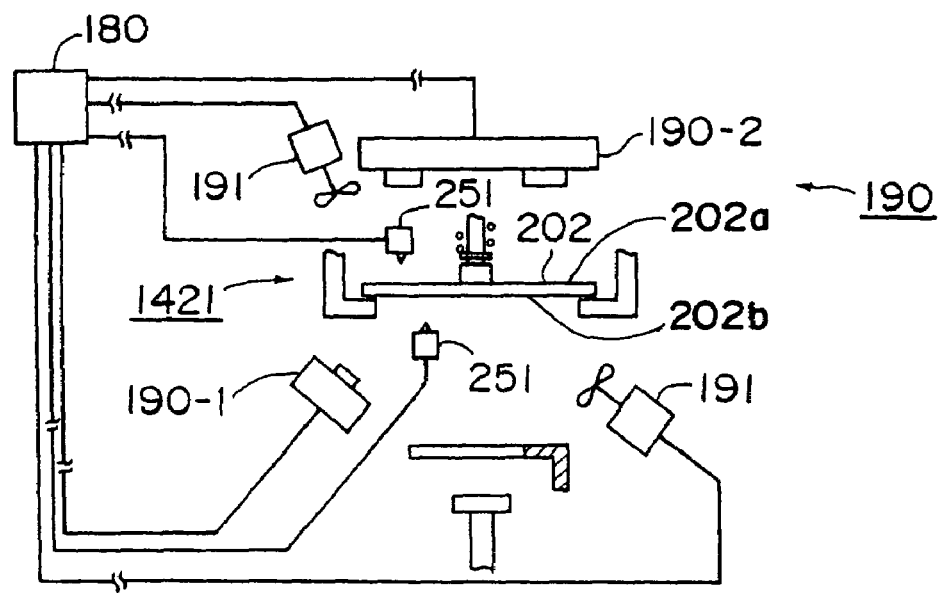
FIG. 44 is a diagram of a state in which ions are applied by an ion generator to the bump-formed wafer when the wafer is shifted from the carry-out side shift device to the carry-out device shown in FIG. 1.
Figure 45:
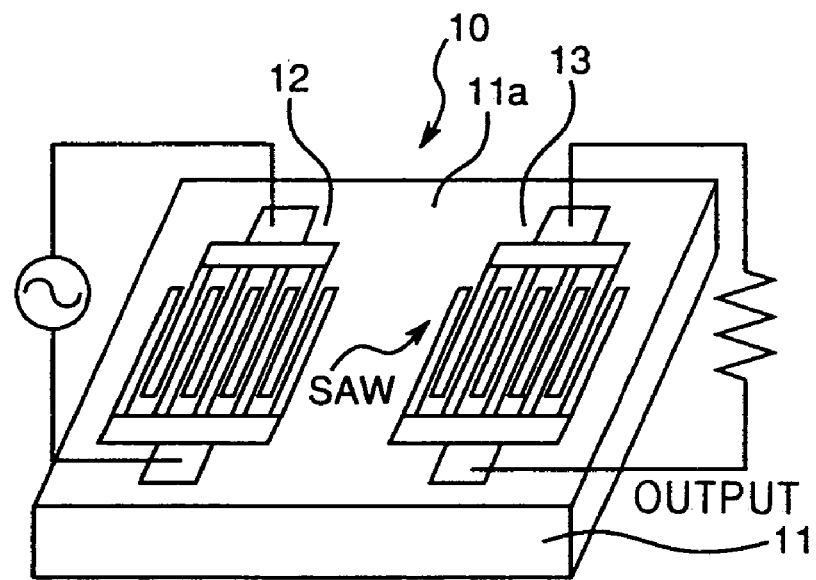
FIG. 45 is a perspective view showing the structure of a SAW filter.

Depending on the kinds of semiconductor substrates such as the piezoelectric substrate wafer which is the object to be processed in the embodiment, charges may sometimes be generated in association with the temperature change of the substrate, causing a pyroelectric breakdown or the like in some cases. For solving this, an amount of the charges of the wafer with formed bumps 202 should be reduced before the wafer with formed bumps is stored in the second storage container 206. Therefore an ion generator 190 is preferably located at least at a side of the rear face 202b, more preferably at both sides including a side of the front face 202a of the wafer with formed bumps 202 while the wafer with formed bumps 202 is delivered from the holding part 1421 of the carry-out side shift device 142 to the carry-out device 132. At the above delivery time, since the rear face 202b of the wafer with formed bumps 202 is negatively charged and the front face 202a is positively charged, the ion generator 190-1 arranged at the side of the rear face 202b generates positive ions and the ion generator 190-2 arranged at the side of the front face 202a generates negative ions to neutralize respective charges. Each of the ion generators 190-1 and 190-2 is connected to and controlled to operate by the controller 180. FIG. 44 represents a state in which the ion generators 190-1 and 190-2 apply ions to the wafer with formed bumps 202 when the wafer holding part 1421 holding the wafer with formed bumps 202 is disposed above the carry-out device 132. The ions are applied to the wafer with formed bumps 202 during the time of the delivery as described above (that is, during each operation from FIG. 40 to FIG. 43).

When the ion generator 190 is installed as above in comparison with the case without the ion generator, the amount of charges can be reduced more as follows. Values of the amount of charges below are just examples. In the case where the above-described temperature increase control or the temperature decrease control of the embodiment is not executed, an amount of charge of the front face 202a of the wafer with formed bumps 202 is approximately +18V and the amount of charge of the rear, face 202b is approximately −1000V as mentioned above when the wafer holding part 1421 is disposed above the carry-out device 132. The amount of charge of the front face 202a can be turned to approximately +22V and the amount of charge of the rear face 202b can be rendered approximately +22V by applying ions by the ion generators 190 for four minutes to both the front and the rear faces of the wafer with formed bumps 202. Therefore, if the ion generator 190 is let to apply the ions to at least the rear face 202b in addition to the temperature increase control and the temperature decrease control of the embodiment, the amount of charge of the rear face 202b can be reduced much more.

In order to more efficiently apply the ions generated from the ion generators 190-1 and 190-2 to at least the rear face 202b, a fan device 191 may be installed at least at the side of the rear face 202b as indicated in FIG. 44 for more efficiently moving the generated ions to the rear face 202b. The fan device 191 is controlled to operate by the controller 180.

Also as shown in FIG. 44, there may be attached an electrostatic sensor 251. While the amount of charge of at least the rear face 202b, and preferably the amounts of charges of both faces including the front face 202a, are measured by the electrostatic sensors 251, an amount of ions to be generated by the ion generator 190 or a volume of the air of the fan device 191 may be controlled by the controller 180 on the basis of the measured amounts of charges.

Moreover, ions by the ion generator(s) 190 may be adapted to more efficiently remove charge in the late heating operation before the wafer with formed bumps 202 is delivered to the carry-out device 132 from the wafer holding part 1421.

The ions by the ion generator(s) 190 may also be applied in the preheating operation.

In the next step 10, the holding bed 1321 stores the wafer with formed bumps 202 into the second storage container 206. Bumps 16 are sequentially formed to each of the pre-forming bumps wafers 201, and the wafers are sequentially stored into the second storage container 206 in the steps discussed above.

In the above-described present embodiment, the pre-formation temperature control for bonding promotion and the post-formation temperature control for bonding promotion are both executed in the preheating operation and in the late heating operation, respectively. However, a minimum requirement is the pre-formation temperature control for bonding promotion, because the pre-formation temperature control for bonding promotion enables metal crystals at surfaces of the electrode parts 15 to be turned proper (that is, enables metal particles to be made fine and proper), thereby perfecting the bonding state even for the bumps 16 and the electrode parts 15 which could not help but be bonded imperfectly in the conventional art.

In the bump-formed semiconductor substrates manufactured by the bump forming apparatus 101 of the embodiment, at least the above pre-formation temperature control for bonding promotion is executed by the preheat device 160. Since the state of metal crystals at the electrode parts 15 is improved as compared with the conventional art as mentioned above, it becomes possible to form bumps even to semiconductor substrates where bumps could not be formed in the conventional art or a desired bonding strength could not be obtained even if bumps 16 could be formed. Moreover, the bonding strength can be improved to a degree whereat the bumps 16 are shorn at the base parts 16*a*. When a semiconductor chip having the above bonding strength between the bumps 16 and the electrode parts 15 is mounted by flip chip mounting, the conventional trouble that the bump 16 separates from the electrode part 15 at the bonding interface is eliminated. A reliability on the flip chip mounting is improved in comparison with the conventional art.

Second Embodiment

A second embodiment of the present invention will be described in detail below with reference to the drawings.

A bump strength improving device, a method carried out by the bump strength improving device, and a bump forming apparatus with the bump strength improving device as the second embodiment of the present invention will be described herein with reference to the drawings. Like parts are designated by like reference numerals throughout the drawings.

Figure 47:
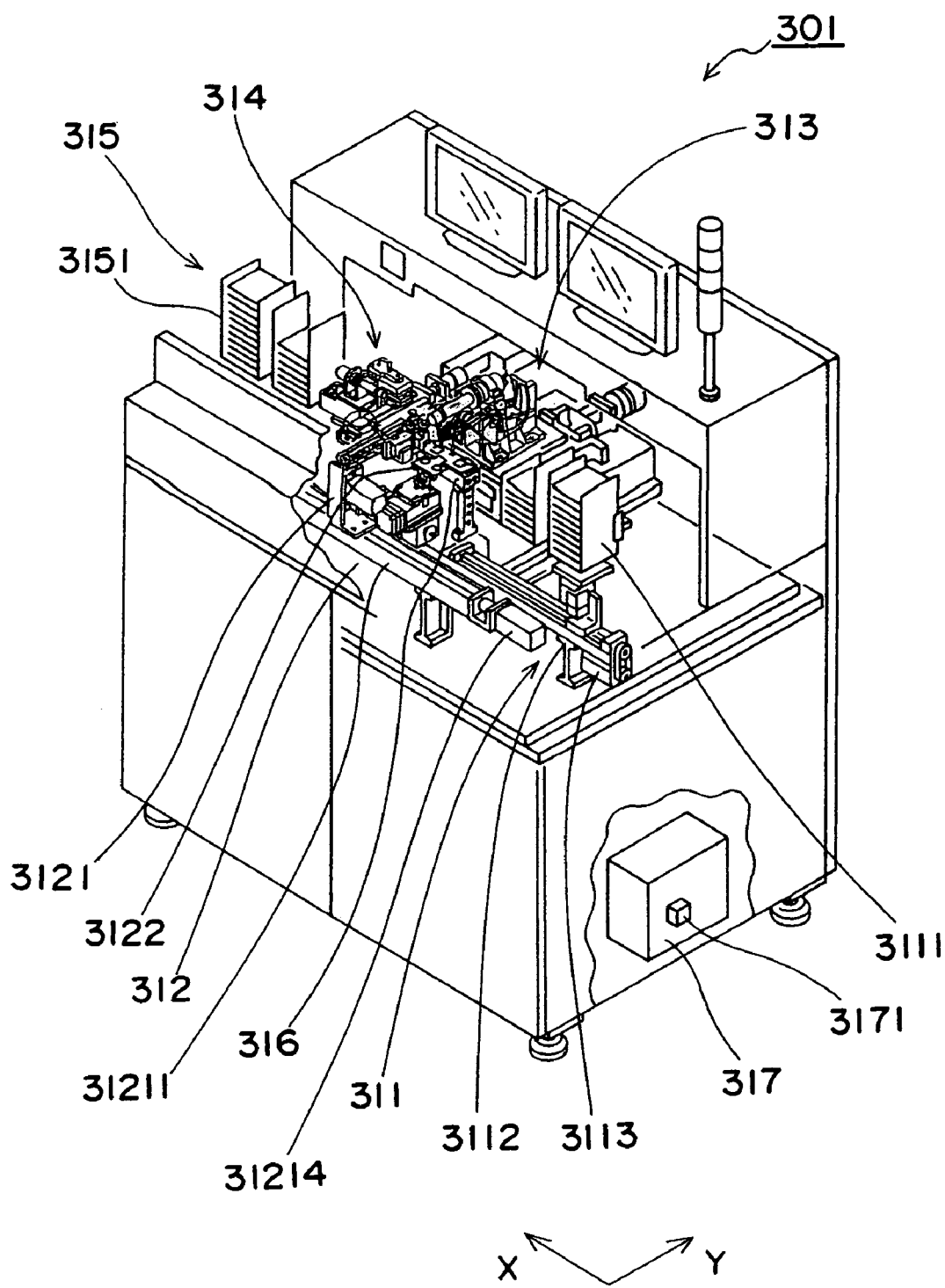
FIG. 47 is a perspective view of a bump forming apparatus according to a second embodiment of the present invention.
Figure 48:
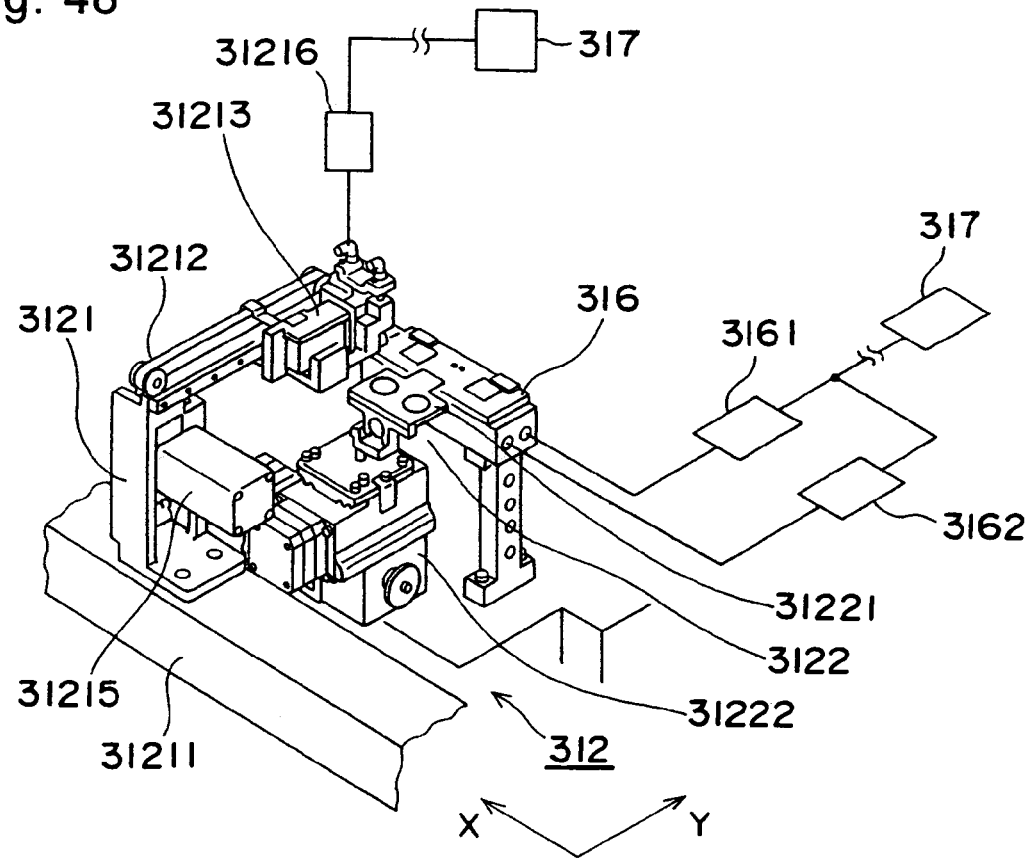
FIG. 48 is an enlarged perspective view of a semiconductor chip transfer device shown in FIG. 47.

FIG. 47 shows the bump forming apparatus 301 with the bump strength improving device as an example of the second embodiment. Semiconductor components to be processed in the bump forming apparatus 301 are semiconductor chips obtained by cutting each of the electronic circuits formed on a semiconductor wafer. Bumps 52 are formed on electrodes 51 of the semiconductor chip. However, the semiconductor component is not limited to the semiconductor chip and can be the above semiconductor wafer. In such case, a bump forming apparatus for forming bumps 52 on electrodes 51 of the semiconductor wafer is constituted.

The bump forming apparatus 301 comprises a semiconductor chip feeder 311, a semiconductor chip transfer device 312, a bump forming part 313, a leveling device 314, a finished product storage device 315, a bonding stage 316 and a controller 317.

The semiconductor chip feeder 311 is a device for feeding the semiconductor chip to the semiconductor chip transfer device 312, having a storage tray part 3111 and a tray conveyor 3112. Trays each accommodating the semiconductor chips can be stored in layers in the storage tray part 3111 as illustrated. The tray conveyor 3112 is a device for transferring the storage tray part 3111 between a load position and an unload position along the indicated X-direction. The tray conveyor has a feed mechanism for carrying out a moving operation by driving a ball screw by a driving motor 3113 according to the second embodiment. The load position is a position where the storage tray part 3111 can be loaded to the tray conveyor 3112, while the unload position is a position where the stored semiconductor chips can be taken out by the semiconductor chip transfer device 312 from the storage tray part 3111. The tray conveyor 3112 is connected to and controlled to operate by the controller 317.

The semiconductor chip transfer device 312 is a device for taking out the semiconductor chip from the semiconductor chip feeder 311, then placing the semiconductor chip onto the bonding stage 316 and further transferring a bump-formed semiconductor chip 61 to be described later from on the bonding stage 316 to the finished product storage device 315 via the leveling device 314 to be discussed later. The semiconductor chip transfer device includes a chip transfer mechanism 3121 and a chip regulation mechanism 3122.

The chip transfer mechanism 3121 has an X-directional moving mechanism 31211 for the transfer in the X-direction, a Y-directional moving mechanism 31212 for the transfer in a Y-direction orthogonal to the X-direction, and a chip holding part 31213.

The X-directional moving mechanism 31211 has a feed mechanism for executing a moving operation by driving a ball screw by a driving motor 31214 in the present second embodiment, and the Y-directional moving mechanism 31212 is installed in the feed mechanism. The Y-directional moving mechanism 31212 has a feed mechanism driven by a driving motor 31215 and, the chip holding part 31213 is included in the feed mechanism. The chip holding part 31213 holds the semiconductor chip by sucking by a suction device 31216 in the second embodiment. The above driving motor 31214, the Y-directional moving mechanism 31212, the driving motor 31215, and the suction device 31216 are controlled to operate by the controller 317. The chip transfer mechanism 3121 operates in a manner as will be described below.

Specifically, the X-directional moving mechanism 31211 and the Y-directional moving mechanism 31212 are driven to move the chip holding part 31213 to the unload position. The semiconductor chip is taken out and held by the chip holding part 31213 from the semiconductor chip feeder 311. After the holding, the X-directional moving mechanism 31211 and the Y-directional moving mechanism 31212 are driven again to move the chip holding part 31213 holding the semiconductor chip to the bonding stage 316 to place the semiconductor chip onto the bonding stage 316. After bumps 52 are formed on the electrodes 51 of the semiconductor chip, the bump-formed semiconductor chip 61 is held again by the chip holding part 31213. The X-directional moving mechanism 31211 and the Y-directional moving mechanism 31212 are driven again after the bump-formed semiconductor chip is held, whereby the bump-formed semiconductor chip 61 is placed onto a leveling stage 3141 of the leveling device 314 from on the bonding stage 316. Furthermore, after a height of the bumps is leveled by the leveling device 314, the bump-formed semiconductor chip 61 is held by the chip holding part 31213, and then the X-directional moving mechanism 31211 and the Y-directional moving mechanism 31212 are driven again to transfer the bump-formed semiconductor chip from on the leveling stage 3141 to the finished product storage device 315.

The chip regulation mechanism 3122 is a device for regulating a position of the semiconductor chip placed on the bonding stage 316, including a member 31221 for position regulation and a member moving mechanism 31222 for moving the member 31221 in X and Y-directions.

The bonding stage 316 is a stage for holding by suction according to the second embodiment the above loaded semiconductor chip regulated in position, and for heating the semiconductor chip to a temperature for bump formation. The bonding stage 316 is connected to a suction device 3161 for the above suction and a heating device 3162 for the above heating. The suction device 3161 and the heating device 3162 for the heating are each connected to and controlled in operation by the controller 317.

Figure 49:
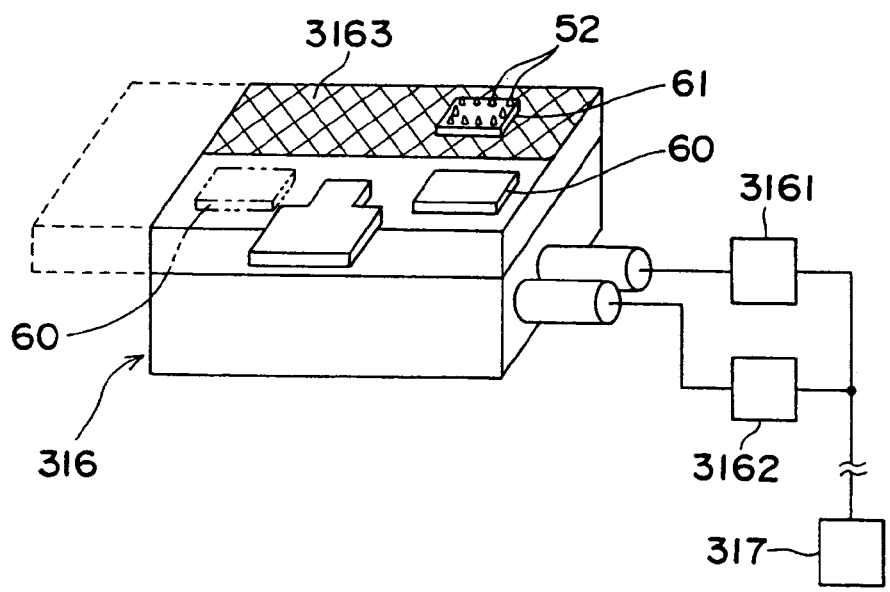
FIG. 49 is an enlarged perspective view of a bonding stage of FIG. 47.

According to the second embodiment, the bonding stage 316 has a space capable of loading two semiconductor chips 60 as shown in FIG. 49. A cycle time can be improved by alternately loading semiconductor chips 60 to two areas of the space. The bonding stage 316 is not restricted to such size that enables two semiconductor chips 60 to be loaded, and may be a size whereby three or more semiconductor chips can be loaded. Otherwise, the bonding stage may be a size capable of loading one semiconductor chip 60 if without improving the cycle time taken into consideration.

Also in the second embodiment, heating under a bonding strength improvement condition intended to improve a bonding strength between the electrode 51 and the bump 52 is carried out upon the bump-formed semiconductor chip 61 which corresponds to a component with bumps formed, and has the bumps 52 formed on the electrodes 51 of the semiconductor chip 60. The heating under the bonding strength improvement condition will be discussed in detail later. In the second embodiment, a space 3163 for bonding strength improvement which corresponds to a heating process part where the heating under the bonding strength improvement condition is carried out at the bonding stage 316 is a place designated by mesh patterns. The space is not limited to this position and can be formed to, e.g., a position indicated by a dotted line in FIG. 49 or a constituent part other than the bonding stage 316, as will be described later. The space 3163 for bonding strength improvement has a size capable of loading two bump-formed semiconductor chips 61 in the second embodiment. However, the size is not limited to this and may be such that three or more, or one bump-formed semiconductor chip 61, can be loaded.

Figure 50:
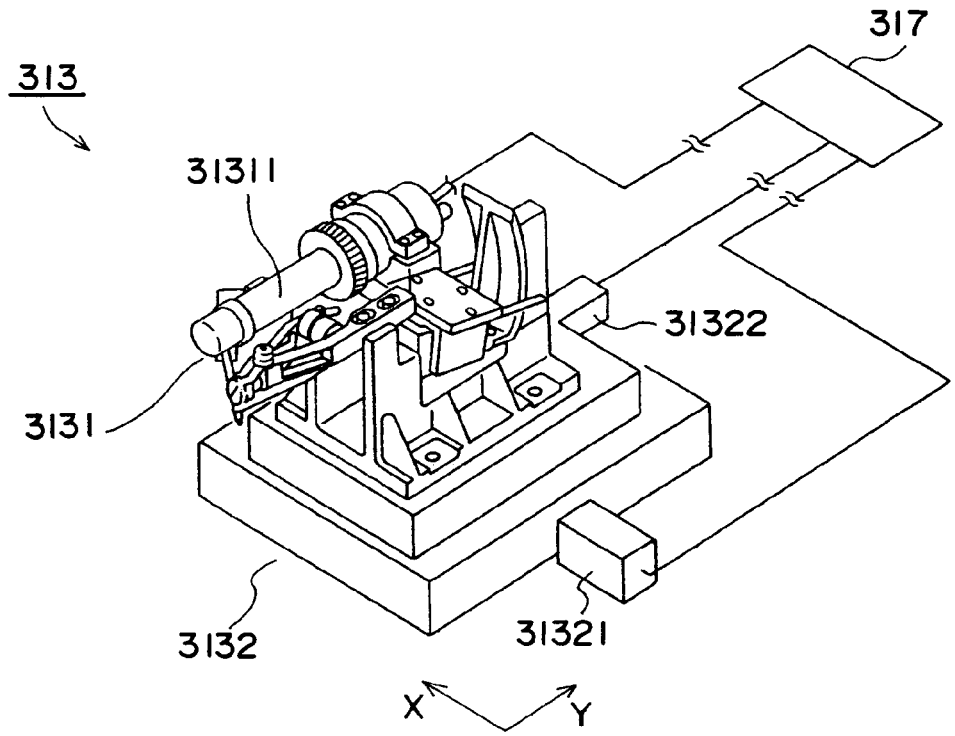
FIG. 50 is an enlarged perspective view of a bump forming part of FIG. 47.

The bump forming part 313 is a device for forming bumps 52 to electrodes 51 of the semiconductor chip 60 held on the bonding stage 316 and has a head 3131 for bump formation and an XY-table 3132. Bumps are formed by one bump forming part 313 in the second embodiment. As indicated in FIG. 50, the head 3131 for bump formation has a gold wire feed part for supplying a gold wire to be the bump 52 and for forming a molten ball called an initial ball to be the bump 52 by melting a leading end part of the gold wire. The head also has a pressing/vibrating part 31311 for pressing the molten ball onto the electrode 51 and applying ultrasonic vibrations when the bump is formed onto the electrode 51. The head is installed on the XY-table 3132. The XY-table 3132 has a first driving source 31321 constituted of, e.g., a motor for moving the bump formation head 3131 in the X-direction and a second driving source 31322 of, e.g., a motor for moving the bump formation head 3131 in the Y-direction. The XY-table moves the bump formation head 3131 in the X, Y-directions by driving of the first driving source 31321 and the second driving source 31322, thereby arranging the molten ball onto desired electrode 51 of the semiconductor chip 60.

The first driving source 31321, the second driving source 31322 and the pressing/vibrating part 31311 are connected to the controller 317 and controlled to operate by the controller 317 to arrange the molten ball on the desired electrode 51 of the semiconductor chip 60 as mentioned above, and moreover to form bump 52 onto the electrode 51.

Figure 51:
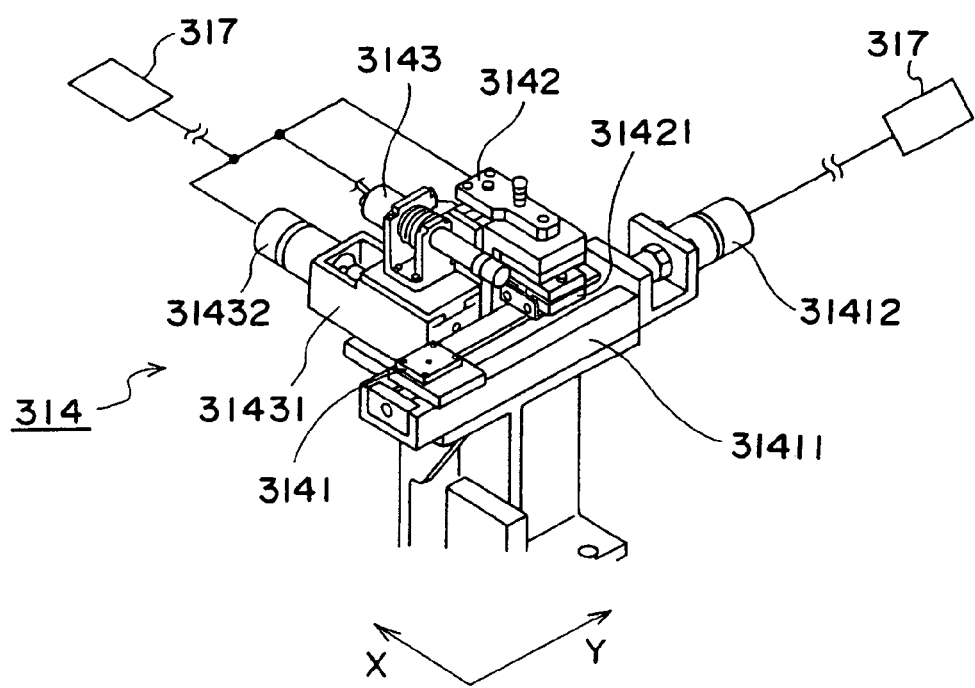
FIG. 51 is an enlarged perspective view of a leveling device in FIG. 47.

The leveling device 314 is a device for making the height of bumps 52 formed on the electrodes 51 of the semiconductor chip 60 uniform by the bump forming part 313. As shown in FIG. 51, the leveling device has the leveling stage 3141, a press 3142 and a bump height inspection device 3143. The leveling stage 3141 places the bump-formed semiconductor chip 61 thereon and holds the bump-formed semiconductor chip by suction, and can be moved in the Y-direction by a moving mechanism 31411 with a driving source 31412 of, e.g., a motor. The press 3142 has a pressing plate 31421 which comes into contact with all bumps 52 formed on the bump-formed semiconductor chip 61. The press presses each bump 52 by moving the pressing plate 31421 in a thickness direction of the bump-formed semiconductor chip 61 held on the stage 314 to make uniform the height of the bumps 52 from, for instance, a bump formation face of the bump-formed semiconductor chip 61. The bump height inspection device 3143 which is a device for inspecting the height of bumps 52 processed by the press 3142 is attached to a moving mechanism 31431 having a driving source 31432 of, e.g., a motor and is movable in the X-direction. Each of the above driving sources 31412 and 31432, the press 3142 and the bump height inspection device 3143 is connected to and controlled to operate by the controller 317.

The finished product storage device 315 is a device for storing the bump-formed semiconductor chips 61. Similar to the above-described semiconductor chip feeder 311, the finished product storage device 315 includes a storage tray 3151 for storing the bump-formed semiconductor chips 61, and a tray conveyor for transferring the storage tray 3151. The finished product storage device 315 is controlled in operation by the controller 317.

The bump forming apparatus 301 described hereinabove is further provided with the bump strength improving device including the above controller 317 as one of the characteristic constituent parts. The bump strength improving device will be depicted below in detail.

Figure 52:
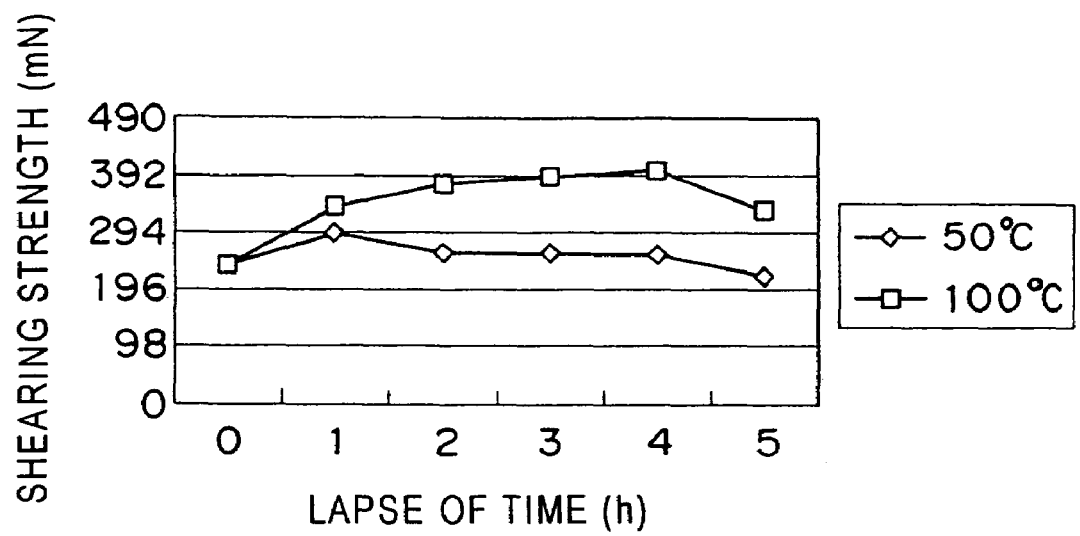
FIG. 52 is a graph showing a relation of a bonding strength between the bump and the electrode with respect to a heating time for every heating temperature.

In a bump-formed semiconductor chip with bumps 52 formed of gold on the aluminum electrodes 51 on a semiconductor chip of an Si semiconductor substrate or a semiconductor wafer of Si, FIG. 52 shows a relation between a shearing force at a bonding interface between the electrode 51 and the bump 52 and a passed time after the bump is formed in cases in which the bump-formed semiconductor chip is heated at 50° C. and in which the bump-formed semiconductor chip is heated at 100° C. As is apparent from the FIG. 52, when the bump-formed semiconductor chip or the bump-formed semiconductor wafer is kept at an appropriate temperature for an appropriate time after the bumps are formed, the shearing force, namely, the bonding strength between the electrode 51 and the bump 52 can be increased. This phenomenon is considered to result from the fact that a material diffusion between the aluminum of the electrode 51 and the gold of the bump 52 proceeds at the bonding interface part when the bump-formed semiconductor chip or the bump-formed semiconductor wafer is kept at the appropriate temperature, thereby increasing the bonding strength.

For example, in forming bumps 52 on electrodes 51 of the semiconductor chip, although the semiconductor chip is heated in the conventional art as well, it is clear from the result of FIG. 52 that the bonding strength can be improved by heating the bump-formed semiconductor chip at a temperature exceeding a temperature for bump formation after forming the bumps, even if a heating temperature for the semiconductor chip under the bump formation is a relatively low temperature for bump formation.

As is also understood from FIG. 52, the bonding strength is conversely deteriorated if the bump-formed semiconductor chip or the bump-formed semiconductor wafer is heated more than required, which is considered to be caused by a thermal deterioration of the aluminum of the electrodes 51.

Figure 53:
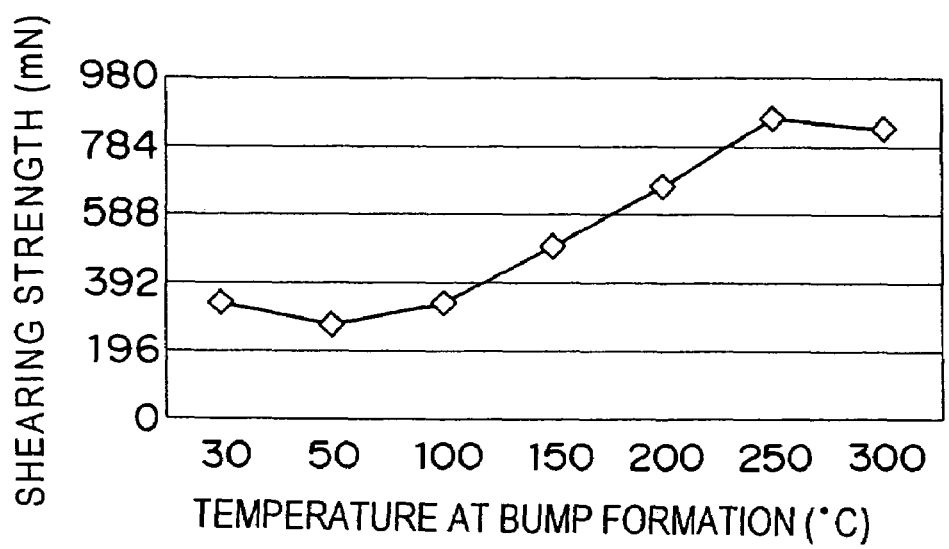
FIG. 53 is a graph of a relation between a temperature for bump formation and the bonding strength of the bump.

In FIG. 53, a relation between the temperature for bump formation of the semiconductor chip or the semiconductor wafer when bumps are formed, and the shearing force is shown. As is understood from this FIG. 53, forming bumps at a relatively high temperature is preferred so as to improve the shearing force (that is, forming bumps at approximately 100-250° C. is preferred as is judged from FIG. 53). Since deterioration of the shearing force is brought about by more heating than required as described with reference to FIG. 52, there is actually a relation between the heating temperature and the heating time, for instance, as shown in FIG. 54.

Therefore, the bonding strength improvement condition for improving the bonding strength to increase the bonding strength after the bumps 52 are formed is one that has the temperature and the time as variables at which and for which the bump-formed semiconductor chip or the bump-formed semiconductor wafer is heated.

Figure 54:
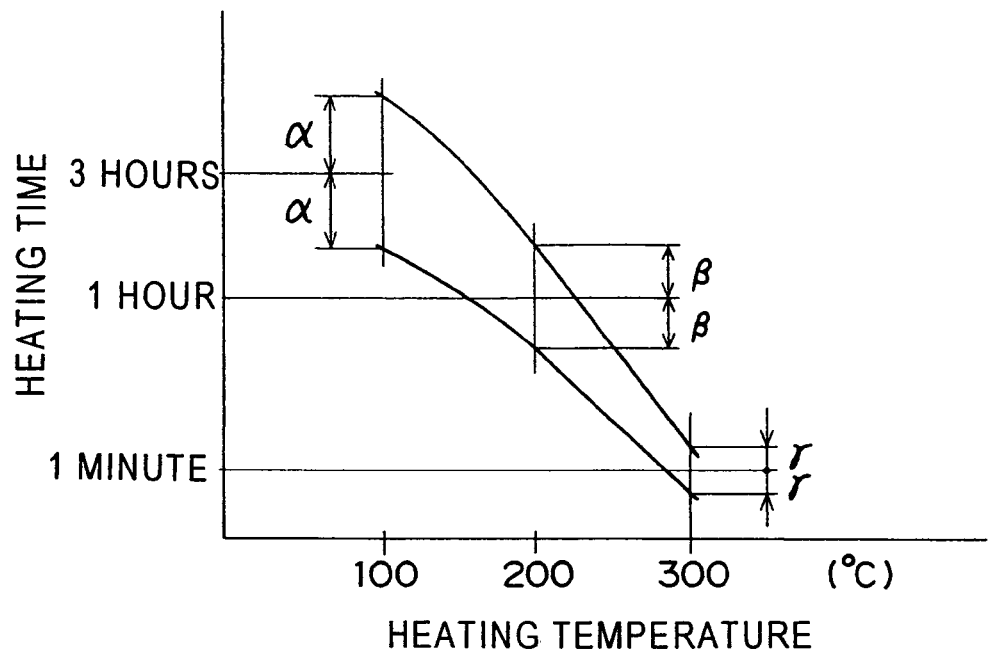
FIG. 54 is a graph showing a relation between the heating time and the heating temperature for the bonding strength.

For example, for the bump-formed semiconductor chip, in FIG. 54, the heating time is preferably, e.g., approximately three±α hours when the heating temperature is 100° C., approximately one hour±β minutes when the heating temperature is 200° C., and approximately one minute±γ seconds when the heating temperature is 300° C. The above a hours is, e.g., approximately one hour, the above β minutes is, e.g., approximately 15 minutes and the above γ seconds is, e.g., approximately 20 seconds.

As above, the increase of the bonding strength is considered to be generated from the promotion of the diffusion of materials of the electrode 51 and the bump 52. The bonding strength improvement condition is accordingly determined by at least one of the material of the electrode 51, a size of the electrode 51, the material of the bump 52, a size of the bump 52, a material of the semiconductor substrate constituting the above semiconductor chip or the semiconductor wafer and a size of the semiconductor substrate, and is preferably determined by at least one group of the material and the size of the electrode 51, the material and the size of the bump 52, and the material and the size of the semiconductor substrate constituting the semiconductor chip or the semiconductor wafer, or by a combination of the groups.

Figure 63:
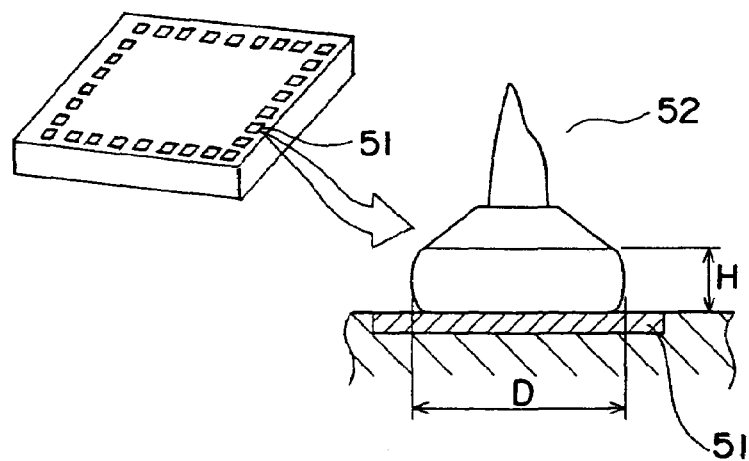
FIG. 63 is a diagram showing a shape of the bump formed on the electrode.

As an example of the bonding strength improvement condition, the semiconductor chip is a 6 mm square of an Si semiconductor substrate, the electrode 51 is formed of aluminum in a 100 μm square having a thickness 1 μm, and the bump 52 is formed of gold having a D size in FIG. 63 of φ 80 μm and an H size as a base height of 20 μm. This semiconductor chip is heated at 200° C. for one hour after bumps are formed. In consequence, the shearing force is improved to 800 mN after the heating although the shearing force is 500 mN when the bumps are formed.

The above semiconductor chip has, for example, more or less 100 electrodes 51, and bumps 52 are sequentially formed to these electrodes. Therefore, a time passes after the bump 52 is first formed before the bumps 52 are formed to all electrodes 51. Since the semiconductor chip or the semiconductor wafer is heated when the bumps are formed and the bonding strength is improved by the heating after the bumps are formed as described above, a difference is generated, for instance, between the bonding strength of the bump 52 formed first and the bonding strength of the bump 52 formed last. In other words, there is a problem that the bonding strengths of bumps 52 in one chip become nonuniform. The problem is much larger when bumps 52 are to be formed to all electrodes 51 on the semiconductor wafer.

Meanwhile, the temperature when the bumps are formed and the heating temperature afterwards can be managed relatively roughly in the case of the Si semiconductor substrate. However, compound semiconductor substrates such as GaAs, LiTaO$_3$, LiNbO$_3$ and the like substrates and quartz substrates are highly possibly damaged by deflection or the like if bumps are formed at the temperature for the Si substrate. Therefore, when bumps are formed, the compound semiconductor chips or semiconductor wafers should be heated at a non-damage temperature whereat the above damage is prevented. Specifically, the wafers should be heated at a lower temperature than the temperature for the Si substrates, and moreover, the heating temperature after the bumps are formed should be relatively low. On the other hand, the Si semiconductor substrates after the bumps are formed can be heated at a temperature exceeding the temperature for bump formation, and therefore can be heated after the bump formation at a temperature exceeding the above non-damage temperature.

There is installed in the second embodiment the bonding strength improving device for improving unevenness of the bonding strengths and improving a quality of semiconductor components as compared with the conventional art with the utilization of the fact that the bonding strength can be increased by the heating temperature and the heating time after the bump formation as is discussed with reference to FIGS. 52-54.

The bonding strength improving device in the bump forming apparatus 301 of the second embodiment is constituted of the controller 317 and the heating device 3162 equipped with the bonding stage 316 having the space 3163 for bonding strength improvement. The controller 317 carries out heating control by the bonding strength improvement condition to the heating device. By including the heating device 3162 and the space 3163 for bonding strength improvement to the bonding stage 316 as in the present second embodiment, the heating device 3162 can be advantageously used both for heating when bumps are formed and for heating after bumps are formed. The heating device 3162 in the second embodiment is comprised of a heater and a power supply part for the heater.

Figure 55:
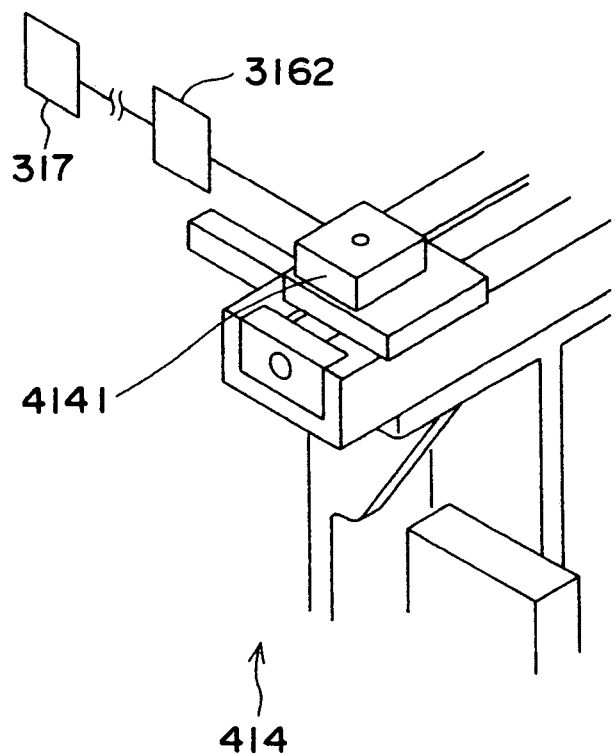
FIG. 55 is a perspective view at a modified example of the leveling device of FIG. 47.

Since it is enough in order to improve the bonding strength to heat the bump-formed semiconductor component after having bumps formed, the heating device 3162 and the improvement space 3163 which is a part controlled to be heated by the heating device 3162 are not limited to the above form in which the heating device and the improvement space are included in the bonding stage 316. For example, as shown in FIG. 55, a stage 4141 of a leveling device 414 corresponding to the leveling stage 3141 of the leveling device 314 may be the space 3163 for bonding strength improvement, and the heating device 3162 may be installed to the stage 4141, whereby the heating control by the bonding strength improvement condition is executed to one or a plurality of bump-formed semiconductor components placed on the stage 4141 to make bumps 52 level in height. This arrangement enables the heating control by the bonding strength improvement condition concurrently with the operation of making the height of bumps 52 uniform, so that the cycle time can be improved.

Figure 56:
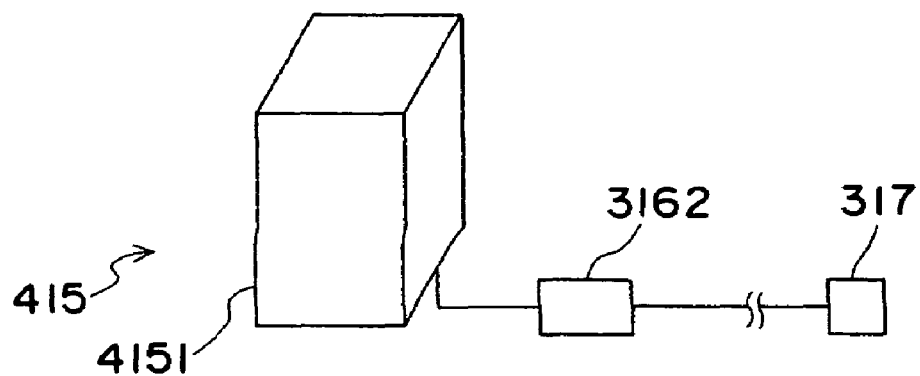
FIG. 56 is a perspective view of a modified example of a finished product storage device in FIG. 47.

As shown in FIG. 56, the heating device 3162 may be installed in a storage tray 4151 of a finished product storage device 415 which corresponds to the storage tray 3151 of the finished component storage device 315, thereby controlling the heating by the bonding strength improvement condition to one or a plurality of bump-formed semiconductor components. More specifically, for instance, a heating device such as the above heating device 3162 may be installed to a side face of a casing constituting the storage tray 4151, or may be installed to the tray conveyor which moves the storage tray 3151. Heating of the heating device is controlled thereby carrying out the heating control by the bonding strength improvement condition to the bump-formed semiconductor components stored in the storage tray 4151 or in the storage tray 3151. In this case, the interior of the storage tray 4151 or the interior of the storage tray 3151 corresponds to the space 3163 for bonding strength improvement. Since the bonding strength is improved while the bump-formed semiconductor components are stored in the storage tray 4151, this is advantageous also from a viewpoint of the cycle time.

Figure 57:
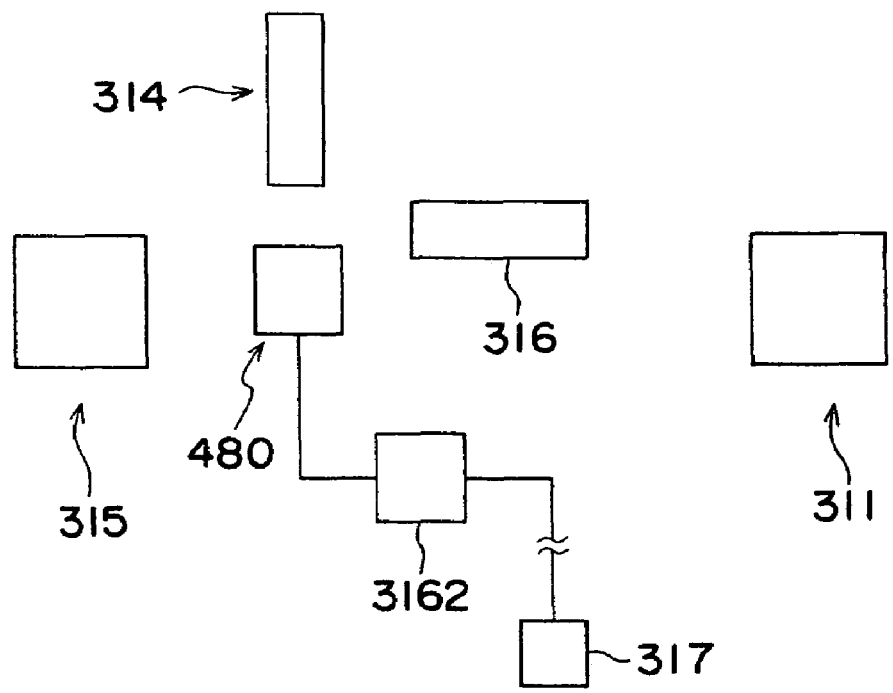
FIG. 57 is a diagram of an arrangement with a heating stage installed in a modified example of the bump forming apparatus of FIG. 47.

Alternatively as shown in FIG. 57, a new heating stage 480 may be arranged to the bump forming apparatus. One or a plurality of bump-formed semiconductor components are placed on the heating stage 480, to which the heating control by the bonding strength improvement condition is executed.

The heating control by the bonding strength improvement condition which is carried out by the controller 317 to the heating device 3162 will be described.

As discussed above with reference to FIGS. 52-54, the bonding strength improvement condition is determined by each of the material and the size of electrodes 51, the material and the size of bumps 52 and, the material and the size of the semiconductor substrate constituting the semiconductor chip or the semiconductor wafer, or by the combination of these, and the heating temperature and the heating time for the bump-formed semiconductor chip or the bump-formed semiconductor wafer can vary corresponding to the bump-formed semiconductor component. An improvement program for bonding strength to control the above heating temperature and time by the bonding strength improvement condition described with reference to FIGS. 52-54 is stored beforehand to a memory part 3171 of the controller 317 according to the second embodiment. The program may not be stored beforehand to the memory part 3171 and can be read out to be stored from a recording medium such as a CD-ROM or the like in which the improvement program for bonding strength is stored, or may be stored via a communication line.

As one example of the improvement program for bonding strength, in the case of, e.g., a semiconductor chip or semiconductor wafer formed of the Si semiconductor substrate, the heating temperature for the semiconductor chip or semiconductor wafer when bumps 52 are formed on the bonding stage 316 is set to be approximately 200° C., the improvement temperature for bonding strength of the bump-formed semiconductor chip or bump-formed semiconductor wafer placed on the improvement space 3163 after having bumps formed is set to be approximately 250° C., and the heating time is made 30 minutes. When the semiconductor substrate is formed of Si, as described above, the temperature when bumps are formed and the improvement temperature for bonding strength can be controlled relatively roughly, and the improvement temperature for bonding strength may be higher than, lower than or equal to the temperature during the bump formation.

On the other hand, in the case of a semiconductor chip or semiconductor wafer formed of the compound semiconductor substrate mentioned earlier or in the case of a semiconductor chip or semiconductor wafer that is easy to physically damage, the chip or wafer is possibly damaged by, e.g., cracking or the like if the temperature at the bump formation is set to be not lower than approximately 250° C. Therefore, both the temperature at the bump formation and the improvement temperature for bonding strength are made lower than those for the semiconductor chip or semiconductor wafer formed of the Si semiconductor substrate (i.e., are set to the non-damage temperature). The heating time at the improvement temperature for bonding strength becomes consequently longer than that in the case of the Si semiconductor substrate. As a concrete example, the temperature for bump bonding when bumps are formed is 150° C., the improvement temperature for bonding strength after bumps are formed is 200° C., and the heating time at the improvement temperature for bonding strength is one hour.

The controller 317 is further capable of executing the following operation control.

Figure 58:
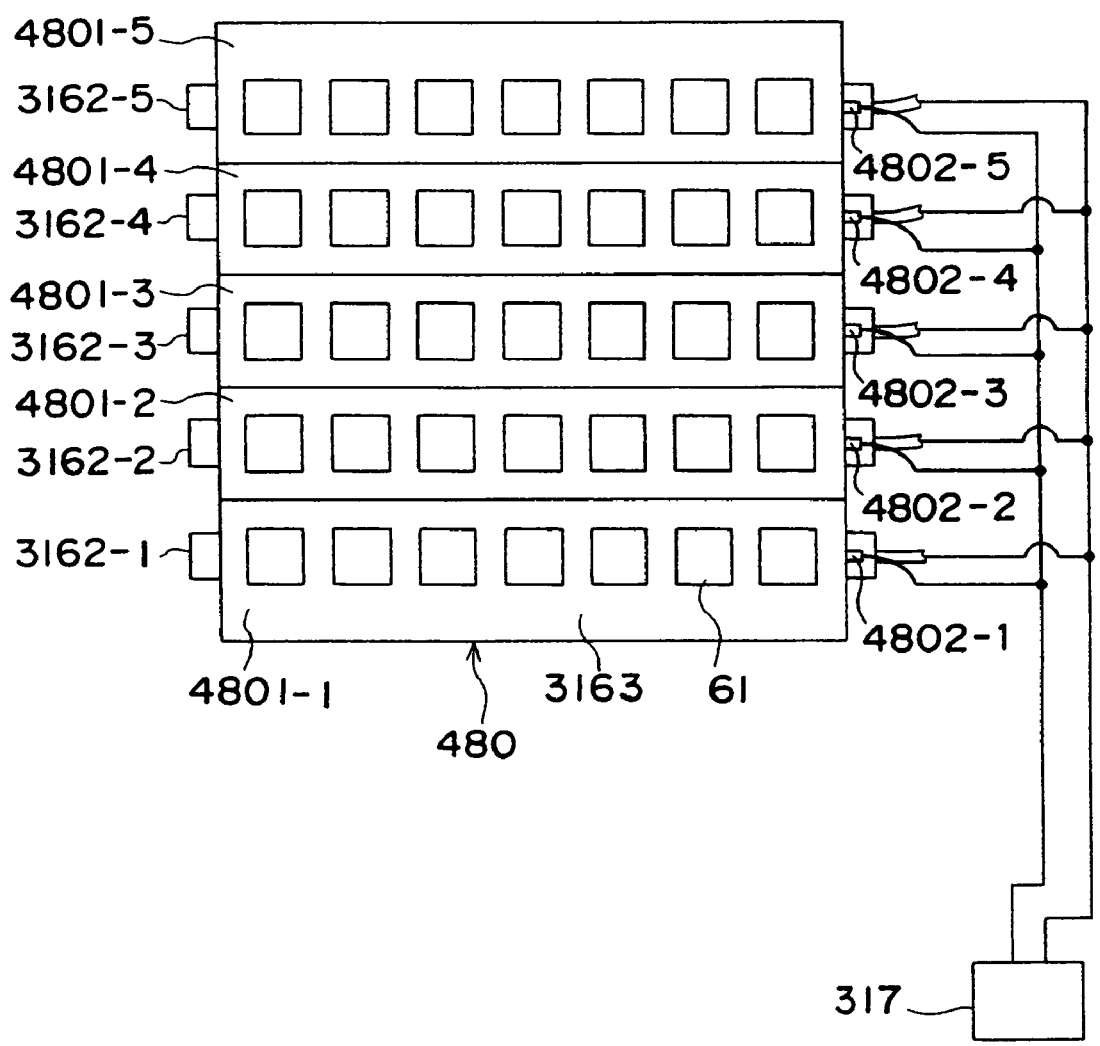
FIG. 58 is a diagram of the heating stage when the heating stage is divided into a plurality of sections thereby enabling the temperature control for each section as a modified example of the bump forming apparatus of FIG. 47.

A plurality of the bump-formed semiconductor chips or the bump-formed semiconductor wafers are placed on the improvement space 3163 for bonding strength as described earlier, and the bonding strength is improved through the lapse of the heating time after bumps are formed as described before. As will be described with reference to FIG. 58 by taking the above heating stage 480 by way of example, the improvement space 3163 for bonding strength at the heating stage 480 is divided into a plurality of sections, and a heating device 3162 is attached to each of the sections. In the example shown in FIG. 58, the space 3163 is divided into five sections 4801-1 to 4801-5, with the heaters 3162-1 to 3162-5 being arranged for the sections 4801-1 to 4801-5 respectively so that the sections 4801-1 to 4801-5 can be separately controlled as heating process parts. At the same time, temperature measuring sensors 4802-1 to 4802-5 (e.g., thermocouples) are attached for measuring temperatures of the sections 4801-1 to 4801-5, respectively. The heaters 3162-1 to 3162-5 and the temperature measuring sensors 4802-1 to 4802-5 are connected to the controller 317.

In the above constitution, for each of the sections 4801-1 to 4801-5, the controller 317 controls the passed time and the heating temperature after the bump-formed semiconductor chips or the bump-formed semiconductor wafer are placed by the bonding strength improvement condition so that the bonding strength of the bump-formed semiconductor chip or the bump-formed semiconductor wafer placed on each sections 4801-1 to 4801-5 becomes an appropriate value or more.

Figure 59:
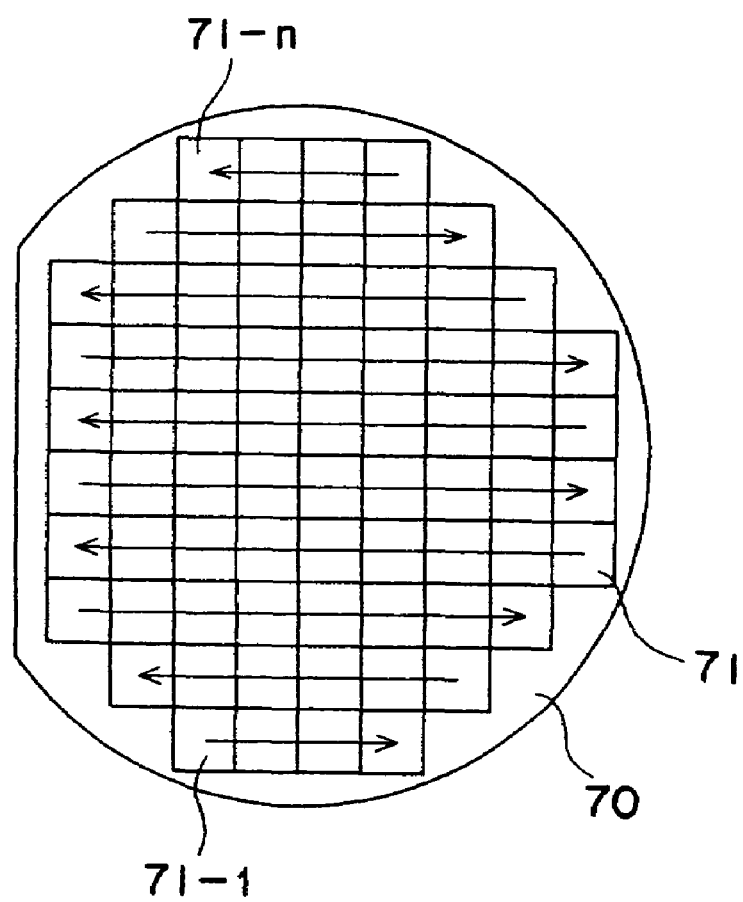
FIG. 59 is a diagram showing a bump formation order when an object to be processed is a semiconductor wafer.

Moreover, for a semiconductor wafer 70 before being separated into individual semiconductor chips 60, when bumps 52 are to be formed by one bump forming part 313 to the electrodes 51 of all circuit parts 71 in an order designated by arrows as shown in FIG. 59 from a first circuit part 71-1 to a last circuit part 71-n of the circuit parts which become individual semiconductor chips 60, the controller 317 preferably carries out an operation control as follows.

Figure 60:
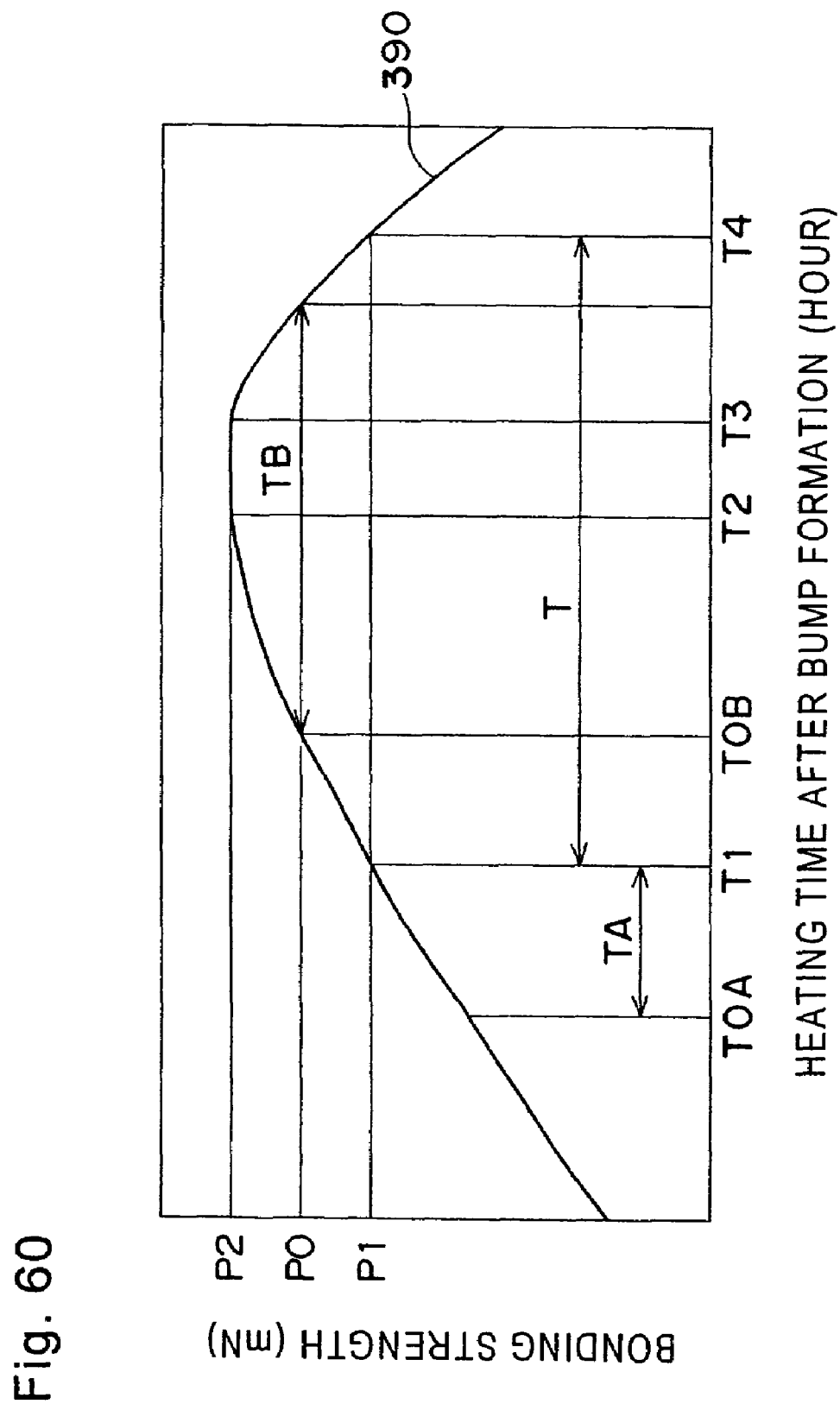
FIG. 60 is a graph for explaining an example of how to obtain a bonding strength improvement condition when the object to be processed is the semiconductor wafer, showing a relation between the bonding strength and the heating time after bump formation.

Especially in the case of the semiconductor wafer 70, since it takes a relatively long time after the bumps 52 are formed to the circuit part 71-1 until the bumps 52 are finished to be formed to the circuit part 71-n, the heating time after the bump formation differs for each circuit part 71. When the bump-formed semiconductor chip or the bump-formed semiconductor wafer obtained after bumps 52 are formed to the semiconductor wafer 70 is heated, the bonding strength increases as depicted in the foregoing description (specifically, as shown, e.g., in FIG. 52 and conceptually as expressed by a bonding strength curve 390 in FIG. 60) in accordance with the lapse of the heating time to a certain time point after the bump formation, and decreases after passing a peak value. In other words, the bonding strength is deteriorated if the heating after the bump formation is conducted more than required. Therefore, heating after the bump formation to the circuit parts 71 where the bumps are formed at an early stage is carried out for a short time or eliminated, whereas heating for a long time as compared with at the early stage is allowed for the circuit parts 71 where the bumps are formed at a later stage. Since the bonding strengths of the bumps 52 are different for each circuit part 71, the heating control to be described below by the controller 317 becomes necessary in order to improve the bonding strengths of bumps 52 at all circuit parts 71 of the semiconductor wafer 70 and to make uniform the bonding strengths as much as possible.

Figure 61:
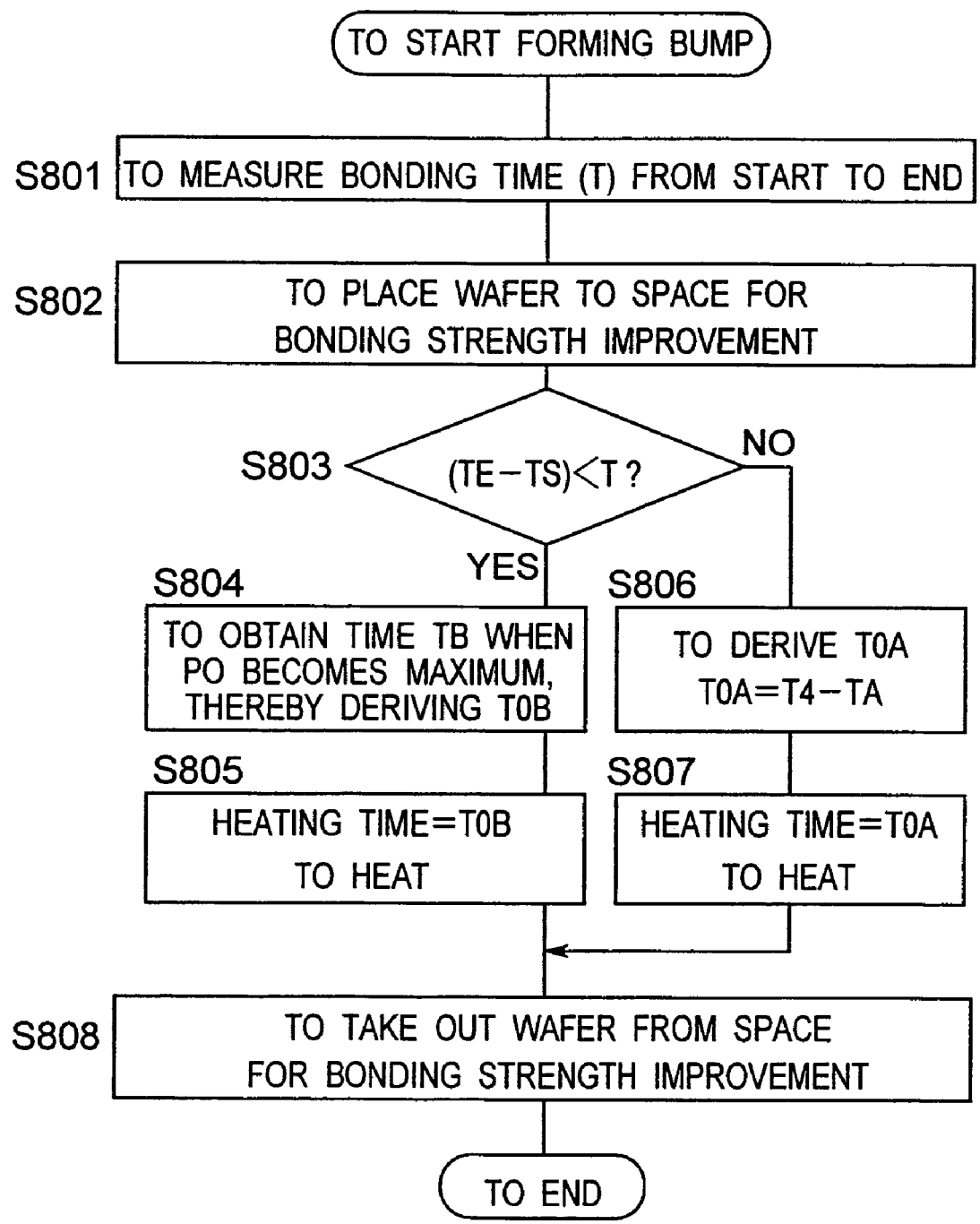
FIG. 61 is a flow chart showing a manner of obtaining the bonding strength improvement condition with reference to FIG. 60.

More concretely, as shown in FIG. 61, the controller 317 measures and stores in a step (denoted by "S" in the drawing) 801 a start time point TS when the bump 52 is first started to be formed on the semiconductor wafer 70 and an end time point TE when bumps 52 are finished to be formed to all electrodes 51. In a next step 802, the semiconductor wafer 70 with bumps formed is placed on the improvement space 3163 for bonding strength at, e.g., the heating stage 480 from the bonding stage 316 by a transfer device for a wafer which corresponds to the semiconductor chip transfer device 312.

Then, in a step 803, the controller 317 obtains the above bonding strength improvement condition based on a total bump formation time (TE-TS) which is obtained by subtracting the start time point TS from the end time point TE, and executes the heating control for the heating device 3162 according to the obtained bonding strength improvement condition. When a change of the bonding strength is already known as indicated by the bonding strength curve 390, a maximum bonding strength value P2 to be obtained by the heating after the bump formation is known, and a minimum bonding strength value P1 as a lowest bonding strength value desired to be obtained by the heating after the bump formation is set. In a step 803, the controller 317 first obtains a heating appropriate time T obtained by a time point T4 when the bonding strength curve 390 passes the minimum bonding strength value P1 and the time point T1. That is, a heating appropriate time T is a time during which the bonding strength improvement can be obtained by the heating after the bump formation. Thereafter, the controller 317 determines whether or not the heating appropriate time T exceeds the total bump formation time (TE-TS) which is a time actually spent for forming all bumps.

When the heating appropriate time T exceeds the total bump formation time (TE-TS), namely, when the bonding strength improvement is ensured without starting to deteriorate the bonding strength even if the heating is continued for the circuit part 71-1 where the bumps are first formed and where the heating is carried out longest after the bump formation, steps 804 and 805 are executed. In the step 804, the controller 317 obtains the bonding strength improvement condition in which a target value P0 of the bonding strength can be obtained. Concretely, a time TB during which the bonding strength not lower than the target value P0 can be obtained is obtained on the basis of the bonding strength curve 390, and a first heating time T0B corresponding to the time TB is obtained. In the step 805, the controller 317 executes heating control for the heating device 3162 by the bonding strength improvement condition (more specifically, by the above first heating time T0B) to conduct the heating after the bump formation to the bump-formed semiconductor wafer 70. A heating temperature at this time is, as described before, determined on the basis of the material of the semiconductor substrate, the material and the size of electrodes 51, the material and the size of bumps 52, etc. by the controller 317.

Meanwhile, when the heating appropriate time T is not longer than the total bump formation time (TE-TS) in the step 803, that is, when the bonding strength becomes smaller than the minimum bonding strength value P1 if the heating is continued more to the circuit part 71-1 where the bumps are first formed and the heating after the bump formation is carried out longest, steps 806 and 807 are carried out. In the step 806, the controller 317 obtains a time TA corresponding to the bonding strength improvement condition by subtracting the heating appropriate time T from the total bump formation time (TE-TS) and obtains a second heating time T0A corresponding to the time TA. In the step 807, the controller 317 controls the heating device 3162 by the bonding strength improvement condition (specifically, by the second heating time T0A) to carry out the heating after the bump formation to the bump-formed semiconductor wafer 72. A heating temperature at this time alike is determined by the controller 317 based on the material of the semiconductor substrate, the material and the size of electrodes 51, the material and the size of bumps 52, etc.

In a step 808, the bump-formed semiconductor wafer 72 is transferred by the transfer device for wafer from the improvement space 3163 for bonding strength improvement at the heating stage 480 to the stage of the leveling device 314 of the succeeding process.

In the above description, the bonding strength improvement condition is obtained on the basis of the total bump formation time (TE-TS). The bonding strength improvement condition may be obtained on the basis of a formation time of almost all bumps 52 without being based on the formation time of all bumps 52. The "almost all bumps 52" here corresponds to approximately 80% or more of all bumps 52.

While the semiconductor wafer is exemplified in the foregoing description as the semiconductor component to be processed, the above control method of obtaining the bonding strength improvement condition based on the total bump formation time (TE-TS) is applicable also to the semiconductor chip.

The controlling operation in the above-discussed steps 801-808 is carried out when the whole of the bump-formed semiconductor wafer 72 is to be uniformly heated. However, the bump-formed semiconductor wafer 72 may be heated according to the heating control method described with reference to FIG. 58.

Figure 62:
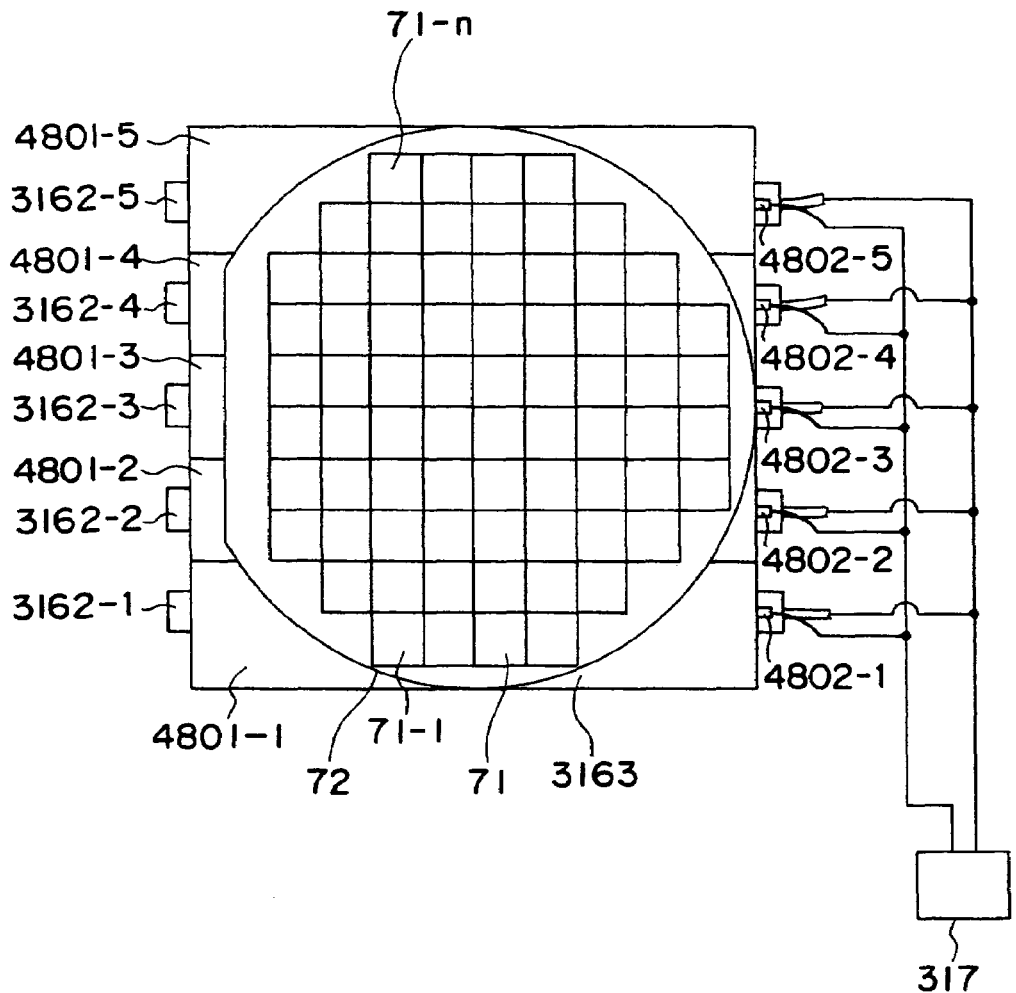
FIG. 62 is a diagram of the heating stage when the object to be processed is the semiconductor wafer and the heating stage is divided into a plurality of sections thereby enabling the temperature control for each section as a modified example of the bump forming apparatus of FIG. 47.

For example, as shown in FIG. 62, the first group circuit part 71 including the circuit part 71-1 where the bumps 52 are formed first is arranged at the section 4801-1, the second group circuit part 71 having the bumps 52 formed at a later time than the above first group is arranged at the next section 4801-2, the third group circuit part 71 having the bumps 52 formed at a later time than the second group is disposed at the next section 4801-3, the fourth group circuit part 71 having the bumps 52 formed at a later time than the third group is arranged at the next section 4801-4, and the fifth group circuit part 71 including the circuit part 71-n having the bumps 52 formed last is arranged at the next section 4801-5.

Accordingly, by control of the controller 317, the heating device 3162-1 installed at the section 4801-1 where the first group circuit part 71 of a relatively long heating time after the bump formation due to the heating to the other circuit parts 71 for forming bumps in the bump-formed semiconductor wafer 72 is arranged does not heat, heats for a relatively short time, or heats at a lower heating temperature than the heating devices at the other sections 4801. The controller 317 can manage temperatures in accordance with the passed time after the bump formation to the heating devices 3162-2 to 3162-5 of the sections 4801-2 to 4802-5. More specifically, the heating temperature can be set sequentially higher, or the heating time can be set sequentially longer, or the heating temperature can be set higher and the heating time can be set longer for the heaters 3162-2 to 3162-5 of the sections 4801-2 to 4802-5.

As mentioned above, the bonding strength of the bumps 52 can be improved and made uniform at all circuit parts 71 of the bump-formed semiconductor wafer 72 also by independently controlling each of the sections divided in accordance with the passed time after the bump formation.

In the above-constituted bump forming apparatus 301, operation after the semiconductor components are carried in the apparatus until the bump-formed components are stored in the finished product storage device 315 will be described. The operation is controlled by the controller 317. The semiconductor chip is given as an example of the above semiconductor component.

The semiconductor chip 60 is held by the chip holding part 31213 included in the semiconductor chip transfer device 312 from the storage tray 311 of the semiconductor chip feeder 311. The chip holding part 31213 is moved by the X-directional moving mechanism 31211 and the Y-directional moving mechanism 31212 of the semiconductor chip transfer device 312, whereby the semiconductor chip 60 is loaded on the bonding stage 316.

Bumps 52 are formed to each of the electrodes 51 of the semiconductor chip 60 placed on the bonding stage 316 while heated to the temperature for bump formation by the bump forming part 313.

The semiconductor chip 61 after having the bumps 52 formed is disposed on the space 3163 for bonding strength improvement of the bonding stage 316 by the chip holding part 31213, and is subjected to the heating after bump formation under the bonding strength improvement condition by the controller 317 as described above.

After the heating after bump formation finishes, the bump-formed semiconductor chip 61 is again held by the chip holding part 31213 to be placed on the leveling stage 3141 of the leveling device 314. The heights of the bumps are made uniform for the placed bump-formed semiconductor chip 61 by the leveling device 314.

The bump-formed semiconductor chip 61 made uniform in bump height is held again by the chip holding part 31213, and is transferred to and stored in the storage tray 3151 of the finished product storage device 315.

In the second embodiment as described hereinabove, since a plurality of bump-formed semiconductor chips 61 can be loaded to the bonding stage 316 and the improvement space 3163 for bonding strength, it is possible to transfer the bump-formed semiconductor chip 61 to the improvement space 3163 for bonding strength during the bump formation at the bonding stage 316, or to transfer the bump-formed semiconductor chip 61 already heated by the bonding strength improvement condition to the leveling device 314 before or nearly simultaneously with starting the heating by the bonding strength improvement condition. This operation can improve the cycle time.

In the above second embodiment, a case in which the bump forming apparatus 301 has the bump strength improving device is exemplified. However, the embodiment is not limited to this example, and a separate bump strength improving device including the controller 317 and, e.g., the bonding stage 316 with the heating device 3162 may be constituted independently. In such constitution, semiconductor chips 61 having the bumps 52 already formed or semiconductor wafers 72 with bumps 52 are carried into the independent bump strength improving device.

The entire disclosure of Japanese Patent Application Nos. 2000-202700 filed on Jul. 4, 2000 and 2000-151287 filed on May 23, 2000 including the specifications, claims, drawings and summaries is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A bump formation method for forming bumps to electrode parts on a semiconductor substrate which is at a bump bonding temperature at which bumps are formed to electrode parts, the method comprising:

before the bumps are formed to the electrode parts, executing a pre-formation temperature control for bonding promotion to the semiconductor substrate to improve bonding between the electrode parts and the bumps during a bump formation, the pre-formation temperature control being performed in manner so as to change a particle size of metal particles of the electrode parts of the semiconductor substrate from larger original-size particles to smaller fine-size particles, and being performed while the semiconductor substrate is in contact with a heating part for heating the semiconductor substrate, the pre-formation temperature control comprising:

heating the semiconductor substrate to a pre-formation temperature for bonding promotion which is 30° C. to 60° C. greater than the bump bonding temperature and is not higher than a damage preventive temperature of the semiconductor substrate, maintaining the semiconductor substrate at the pre-formation temperature for bonding promotion for a pre-formation length of time for bonding promotion, and setting the semiconductor substrate to the bump bonding temperature after lapse of the pre-formation length of time for bonding promotion; and after the pre-formation temperature control, forming the bumps to the electrode parts on the semiconductor substrate.

2. The bump formation method according to claim 1, further comprising executing, to the semiconductor substrate after the bumps are formed to the electrode parts, a post-formation temperature control for bonding promotion to promote bonding between the electrode parts after having bumps formed and the bumps, the post-formation temperature control being performed in a manner so as to promote diffusion of a material of the bumps and a material of the electrode parts at bonding interfaces between the bumps and the electrode parts.

3. The bump formation method according to claim 2, wherein the post-formation temperature control for bonding promotion comprises:

heating the semiconductor substrate to a post-formation temperature for bonding promotion which is not lower than the bump bonding temperature and is not higher than a damage preventive temperature of the semiconductor substrate, maintaining the semiconductor substrate at the post-formation temperature for bonding promotion for a post-formation length of time for bonding promotion, and decreasing the temperature of the semiconductor substrate after lapse of the post-formation length of time for bonding promotion.

4. The bump formation method according to claim 2, wherein the pre-formation temperature control for bonding promotion and the post-formation temperature control for bonding promotion are controlled while being related to each other.

5. A bump formation method for forming bumps to electrode parts on a semiconductor substrate which is at a bump bonding temperature at which bumps are formed to electrode parts, the method comprising:

forming the bumps to the electrode parts on the semiconductor substrate; and after the bumps are formed to the electrode parts, executing a post-formation temperature control for bonding promotion to the semiconductor substrate to improve bonding between the electrode parts and the bumps, the post-formation temperature control being performed in a manner so as to promote diffusion of a material of the bumps and a material of the electrode parts at bonding interfaces between the bumps and the electrode parts, and being performed while the semiconductor substrate is in contact with a heating part for heating the semiconductor substrate, the post-formation temperature control comprising:

heating the semiconductor substrate to a post-formation temperature for bonding promotion which is 30° C. to 60° C. greater than the bump bonding temperature and is not higher than a damage preventive temperature of the semiconductor substrate, maintaining the semiconductor substrate at the post-formation temperature for bonding promotion for a post-formation length of time for bonding promotion, and decreasing the temperature of the semiconductor substrate after lapse of the post-formation length of time for bonding promotion.

6. The bump formation method according to claim 5, wherein a pre-formation temperature control for bonding promotion and the post formation temperature control for bonding promotion are controlled while being related to each other.

7. The bump formation method according to claim 1, wherein the pre-formation temperature and the pre-formation length of time are determined based on a material of the electrode parts and gold bumps.

8. The bump formation method according to claim 1, wherein the pre-formation temperature and the pre-formation length of time are determined based on thickness of each of the electrode parts and on a diameter of a base part of each of gold bumps.

9. The bump formation method according to claim 1, wherein the pre-formation length of time is in a range of 10 minutes to 30 minutes.

10. The bump formation method according to claim 1, wherein the bump bonding temperature is 210° C.

11. The bump formation method according to claim 1, wherein each of the electrode parts has a thickness of no greater than 2500 Å.

12. The bump formation method according to claim 5, wherein the bump bonding temperature is 210° C.

13. The bump formation method according to claim 5, wherein each of the electrode parts has a thickness of no greater than 2500 Å.

* * * * *

UNITED STATES PATENT AND TRADEMARK OFFICE
CERTIFICATE OF CORRECTION

PATENT NO. : 7,350,684 B2
APPLICATION NO. : 11/114084
DATED : April 1, 2008
INVENTOR(S) : Shoriki Narita et al.

It is certified that error appears in the above-identified patent and that said Letters Patent is hereby corrected as shown below:

On the Cover Page

In Section (56) References Cited, under the "U.S. PATENT DOCUMENTS" heading, please insert the following references:

| | | |
|---|---|---|
| 2004/0102030 | 05/04 | Narita et al. |
| 2004/0035849 | 02/04 | Narita et al. |
| 2004/0020973 | 02/04 | Narita et al. |
| 2002/0061129 | 05/02 | Narita et al. |
| 2002/0011479 | 01/02 | Narita et al. |
| 2001/0010324 | 08/01 | Maeda et al. |
| 2001/0001216 | 05/01 | LaFontaine et al. |
| 6,742,701 | 06/04 | Furuno et al. |
| 6,427,898 | 08/02 | Maeda et al. |
| 6,392,202 | 05/02 | Narita et al. |
| 6,329,640 | 12/01 | Narita et al. |
| 6,273,328 | 08/01 | Maeda et al. |
| 6,265,244 | 07/01 | Hayashi et al. |
| 6,053,398 | 04/00 | Iizuka et al. |

UNITED STATES PATENT AND TRADEMARK OFFICE
CERTIFICATE OF CORRECTION

PATENT NO. : 7,350,684 B2
APPLICATION NO. : 11/114084
DATED : April 1, 2008
INVENTOR(S) : Shoriki Narita et al.

It is certified that error appears in the above-identified patent and that said Letters Patent is hereby corrected as shown below:

| | | |
|---|---|---|
| 5,984,165 | 11/99 | Inoue et al. |
| 4,571,688 | 02/86 | Kashihara et al. |
| 5,259,545 | 11/93 | Huang et al. |

Signed and Sealed this

Twenty-sixth Day of August, 2008

JON W. DUDAS
*Director of the United States Patent and Trademark Office*